US008912640B2

(12) United States Patent
Takada et al.

(10) Patent No.: US 8,912,640 B2
(45) Date of Patent: Dec. 16, 2014

(54) SEMICONDUCTOR DEVICE AND METHOD OF MANUFACTURING THE SAME

(75) Inventors: Keita Takada, Kanagawa (JP); Tadatoshi Danno, Kanagawa (JP); Hirokazu Kato, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 48 days.

(21) Appl. No.: 13/540,565

(22) Filed: Jul. 2, 2012

(65) Prior Publication Data

US 2013/0009299 A1 Jan. 10, 2013

(30) Foreign Application Priority Data

Jul. 4, 2011 (JP) .................................. 2011-148139

(51) Int. Cl.
H01L 33/44 (2010.01)
H01L 23/00 (2006.01)
H01L 23/495 (2006.01)
H01L 23/31 (2006.01)

(52) U.S. Cl.
CPC ..... *H01L 23/562* (2013.01); H01L 2224/40247 (2013.01); *H01L 23/49503* (2013.01); *H01L 23/49575* (2013.01); *H01L 23/49548* (2013.01); H01L 2924/13091 (2013.01); *H01L 23/49541* (2013.01); *H01L 23/49562* (2013.01); H01L 2224/73221 (2013.01); *H01L 24/34* (2013.01); H01L 2224/73265 (2013.01); *H01L 23/49582* (2013.01); H01L 2224/49171 (2013.01); *H01L 23/49524* (2013.01); H01L 23/3107 (2013.01); H01L 2224/48247 (2013.01); H01L 2924/3011 (2013.01); H01L 2224/32245 (2013.01)
USPC ........... 257/687; 257/701; 257/787; 257/795; 257/796

(58) Field of Classification Search
USPC ......................... 257/687, 701, 787, 795, 796
See application file for complete search history.

(56) References Cited

U.S. PATENT DOCUMENTS

| 6,495,909 | B2 * | 12/2002 | Jung et al. ..................... 257/684 |
| 7,554,181 | B2 | 6/2009 | Satou et al. |
| 7,728,414 | B2 | 6/2010 | Omori et al. |
| 7,939,933 | B2 * | 5/2011 | Itou et al. ...................... 257/696 |
| 8,334,584 | B2 * | 12/2012 | Camacho et al. .............. 257/676 |
| 8,525,305 | B1 * | 9/2013 | Rogren ......................... 257/666 |
| 2005/0253286 | A1 * | 11/2005 | Yoshikawa et al. ........... 257/787 |
| 2013/0001761 | A1 * | 1/2013 | Rogren ......................... 257/676 |

FOREIGN PATENT DOCUMENTS

| JP | 2002-100722 A | 4/2002 |
| JP | 2004-235217 A | 8/2004 |
| JP | 2005-294464 A | 10/2005 |
| JP | 2006-318996 A | 11/2006 |

* cited by examiner

*Primary Examiner* — Michael Shingleton
(74) *Attorney, Agent, or Firm* — Miles & Stockbridge P.C.

(57) ABSTRACT

A semiconductor device is inhibited from being degraded in reliability. The semiconductor device has a tab including a top surface, a bottom surface, and a plurality of side surfaces. Each of the side surfaces of the tab has a first portion continued to the bottom surface of the tab, a second portion located outwardly of the first portion and continued to the top surface of the tab, and a third portion located outwardly of the second portion and continued to the top surface of the tab to face the same direction as each of the first and second portions. In planar view, the outer edge of the semiconductor chip is located between the third portion and the second portion of the tab, and the outer edge of an adhesive material fixing the semiconductor chip to the tab is located between the semiconductor chip and the second portion.

9 Claims, 39 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2011-148139 filed on Jul. 4, 2011 including the specification, drawings and abstract is incorporated herein by reference in its entirety.

BACKGROUND

The present invention relates to a semiconductor device and a manufacturing technology therefor, and particularly to technology which is effective when applied to a semiconductor device having a structure in which the bottom surface of a chip mounting portion having a semiconductor chip mounted thereover is exposed from a sealing body.

In Japanese Unexamined Patent Publication No. 2004-235217 (Patent Document 1), a semiconductor device is described in which the bottom surface of a tab (chip mounting portion) having a semiconductor chip mounted thereover is exposed from a sealing portion, and interlocking projecting portions which are bent toward the inside of the sealing portion to project are provided in a comb-like shape along the edge of the tab to inhibit the tab from coming off.

In Japanese Unexamined Patent Publication No. 2006-318996 (Patent Document 2), a semiconductor device is described in which a thinned portion is projected from around the outer periphery of a die pad (chip mounting portion), and an engagement portion such as a through hole is provided in the thinned portion to improve the adhesion between a sealing resin and the die pad.

In Japanese Unexamined Patent Publication No. 2002-100722 (Patent Document 3), a semiconductor device is described in which the peripheral portion of a tab is provided with a stepped portion, and a peripherally continuous indented portion is provided in the stepped portion to stop the advancement of peeling of a resin sealing body from the tab.

In Japanese Unexamined Patent Publication No. 2005-294464 (Patent Document 4), a semiconductor device (non-insulated-type DC-DC converter) is described in which plurality of semiconductor chips mounted over respective die pads are collectively sealed in a sealing body.

RELATED ART DOCUMENTS

Patent Documents

[Patent Document 1]
  Japanese Unexamined Patent Publication No. 2004-235217
[Patent Document 2]
  Japanese Unexamined Patent Publication No. 2006-318996
[Patent Document 3]
  Japanese Unexamined Patent Publication No. 2002-100722
[Patent Document 4]
  Japanese Unexamined Patent Publication No. 2005-294464

SUMMARY

If semiconductor devices are classified according to the package forms thereof, there is a so-called tab-exposed-type semiconductor device in which the bottom surface of tab (chip mounting portion) having a semiconductor chip mounted thereover is exposed from a sealing body. In the tab-exposed-type semiconductor device, the tab exposed from the sealing body can be utilized as a heat release path. This is advantageous in terms of improving the heat release property of the semiconductor device. Preferably, the tab-exposed-type semiconductor device has a structure in which the peripheral edge portion of the tab is provided with a thinner region (stepped portion), and the bottom surface side of the thinner region is sealed in a sealing body to prevent or inhibit the tab from falling out of the sealing body.

The present inventors have studied the package structure of the tab-exposed-type semiconductor device, and found a new problem to be solved. That is, it has been found that, due to a temperature cycle under an environment in which the semiconductor device is used, a minute defect (crack) occurs in the sealing body particularly in the vicinity of the thinner region of the tab. As a result of the study, the present inventors have found that, when a part of the semiconductor chip is located at a position overlapping the thinner region of the tab and an adhesive is disposed between the semiconductor chip and the thinner region, the crack occurs. When the crack has occurred in the sealing body, it serves as a path through which moisture or the like enters the sealing body. If the semiconductor device is used continuously in the state where the crack has occurred, the crack develops to be larger in size to consequently cause the degradation of the reliability of the semiconductor device.

The present invention has been achieved in view of the foregoing problem, and an object thereof is to provide a technology for inhibiting the degradation of the reliability of the semiconductor device.

The above and other objects and novel features of the present invention will become apparent from a statement in the present specification and the accompanying drawings.

The following is a brief description of the outline of a representative aspect of the invention disclosed in the present application.

That is, a semiconductor device as an embodiment of the present invention has a first chip mounting portion including a first top surface having a first semiconductor chip mounted thereover, a first bottom surface located on the opposite side of the first top surface and exposed from a sealing body, and a plurality of side surfaces located between the first top surface and the first bottom surface. Of the side surfaces of the first chip mounting portion, the first side surface has a first portion continued to the first bottom surface of the first chip mounting portion, a second portion located outwardly of the first portion and continued to the first top surface of the first chip mounting portion, and a third portion located outwardly of the second portion and continued to the first top surface of the first chip mounting portion to face the same direction as each of the first and second portions. In planar view, the outer edge of the first semiconductor chip is located between the first portion and the second portion of the first chip mounting portion, and the outer edge of an adhesive material for adhesively fixing the first semiconductor chip to the first chip mounting portion is located between the first semiconductor chip and the second portion.

The following is a brief description of effects achievable by the representative aspect of the invention disclosed in the present application.

That is, according to an embodiment of the present invention, it is possible to inhibit the degradation of the reliability of a semiconductor device.

DETAILED DESCRIPTION

Figure 1:
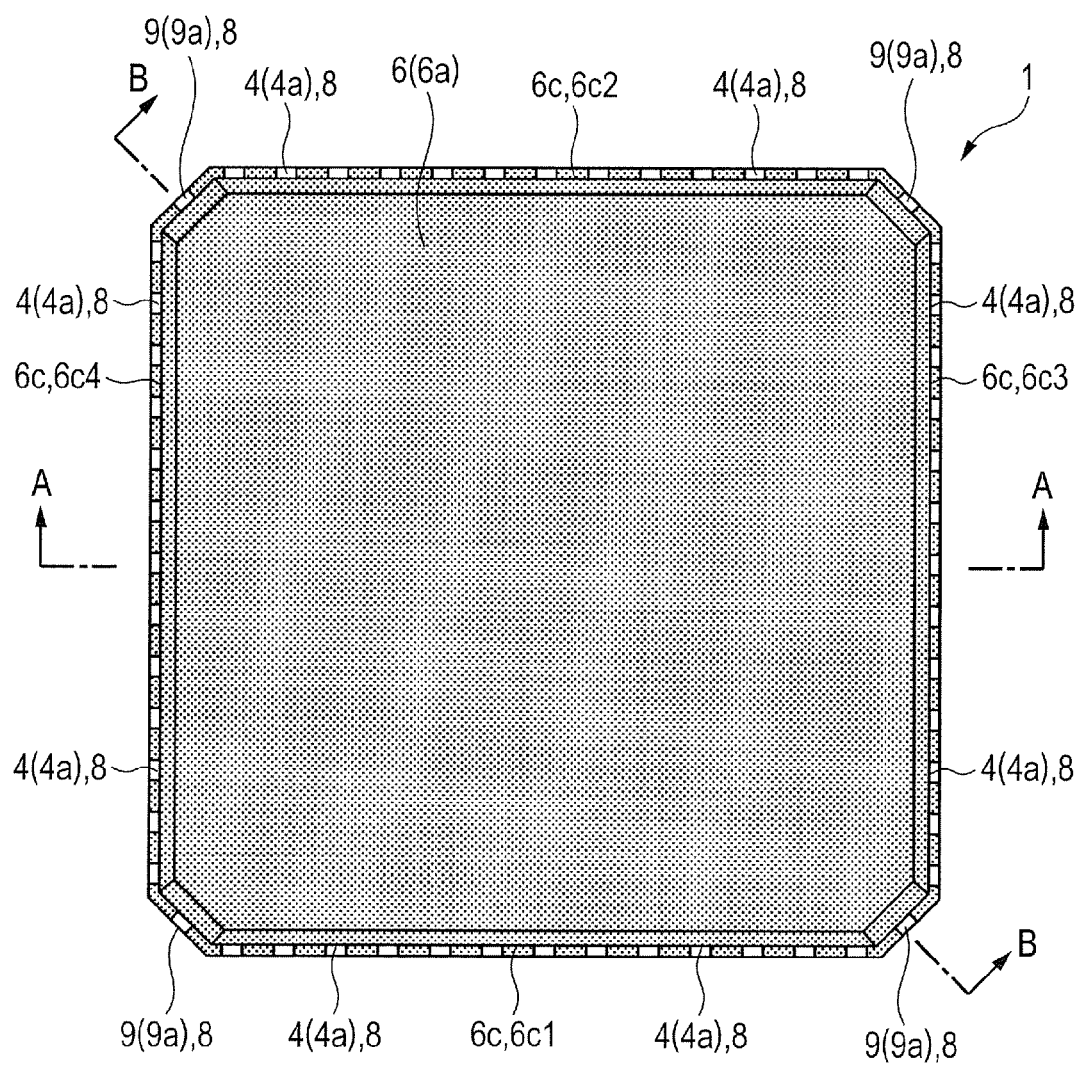
FIG. 1 is a top view of a semiconductor device as an embodiment of the present invention.

[Explanation of Description Form, Basic Terminology, and Use thereof in Present Application]

In the present application, if necessary for the sake of convenience, the description of a form of implementation may be such that the form of implementation is divided into a plurality of sections or the like in the description thereof. However, they are by no means independent of or distinct from each other unless particularly explicitly described otherwise, and one of the individual sections of a single example is details, modifications, and so forth of part or the whole of the others irrespective of the order thereof in the description. In principle, a repeated description of like parts will be omitted. Each constituent element in the form of implementation is not indispensable unless particularly explicitly described otherwise, unless the constituent element is theoretically limited to a given number, or unless it is obvious from the context that the constituent element is indispensable.

Likewise, even when such wording as "X comprised of A" is used in association with a material, a composition, or the like in the description of the form of implementation or the like, it does not exclude a material, a composition, or the like which contains an element other than A unless particularly explicitly described otherwise or unless it is obvious from the context that it excludes such a material, a composition, or the like. For example, when a component is mentioned, the wording means "X containing A as a main component" or the like. It will be appreciated that, even when, e.g., a "silicon member" or the like is mentioned, it is not limited to pure silicon, and a member containing a SiGe (silicon-germanium) alloy, another multi-element alloy containing silicon as a main component, another additive, or the like is also included. Additionally, even when a gold plating, a Cu layer, a nickel plating, or the like is mentioned, it is assumed to include not only a pure gold plating, a pure Cu layer, a pure nickel plating, or the like, but also a member containing gold, Cu, nickel, or the like as main component unless it is particularly explicitly described otherwise.

Further, when a specific numerical value or numerical amount is mentioned, it may be a value more or less than the specific numerical value unless particularly explicitly described otherwise, unless the numerical value is theoretically limited to a given number, or unless it is obvious from the context that the numeral value is limited to the given number.

In each of the drawings of the embodiments, the same or like parts are designated by the same or similar marks or reference numerals, and a description thereof will not be repeated in principle.

In the accompanying drawings, hatching or the like may be omitted even in a cross section when hatching or the like results in complicated illustration or when the distinction between a portion to be hatched and a vacant space is distinct. In relation thereto, even a two-dimensionally closed hole may have a background outline thereof omitted when it is obvious from the description or the like that the hole is two-dimensionally closed, and so forth. On the other hand, even though not shown in a cross section, a portion other than a vacant space may be hatched or depicted in a dot pattern to clearly show that the portion is not a vacant space or clearly show the boundary of a region.

(First Embodiment)

Figure 2:
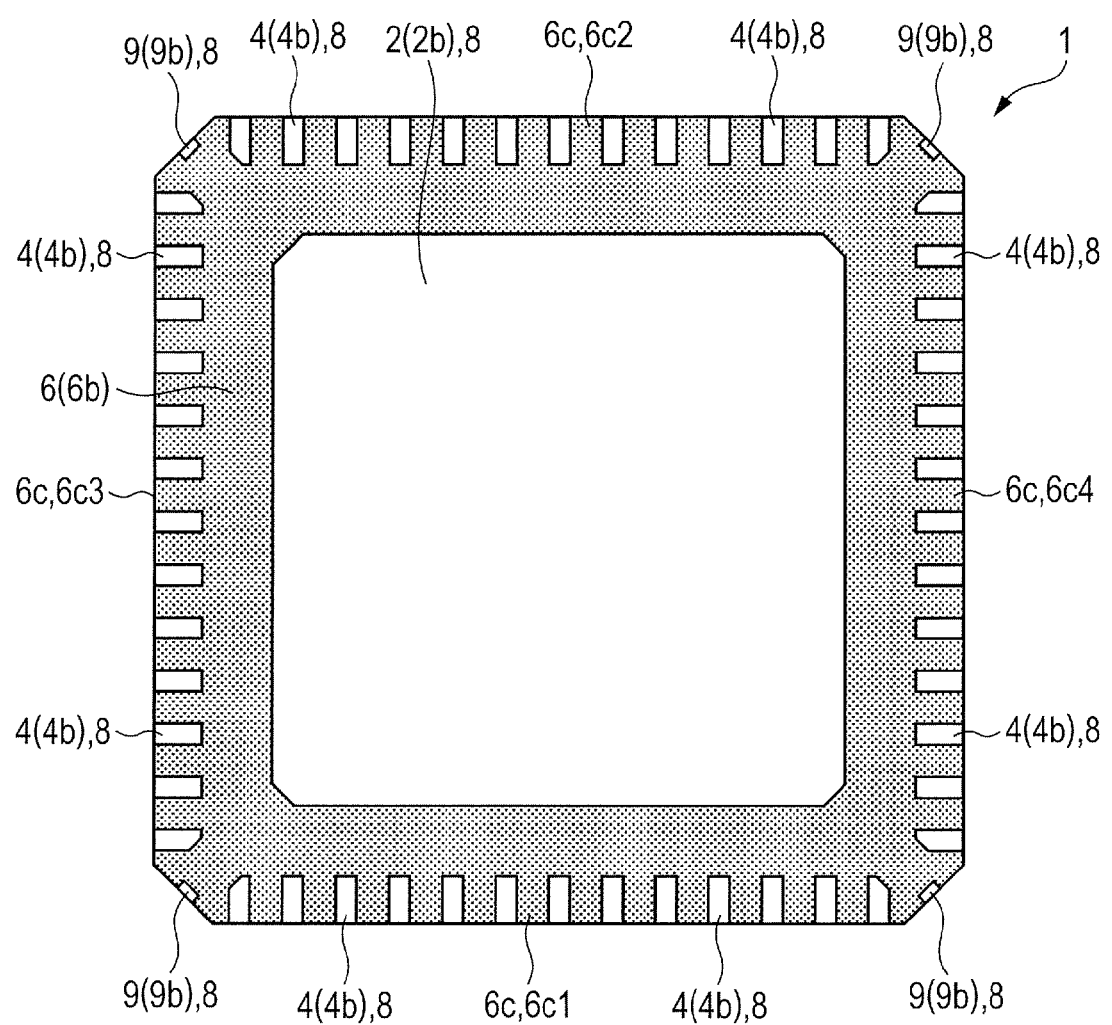
FIG. 2 is a bottom view of the semiconductor device shown in FIG. 1.
Figure 3:
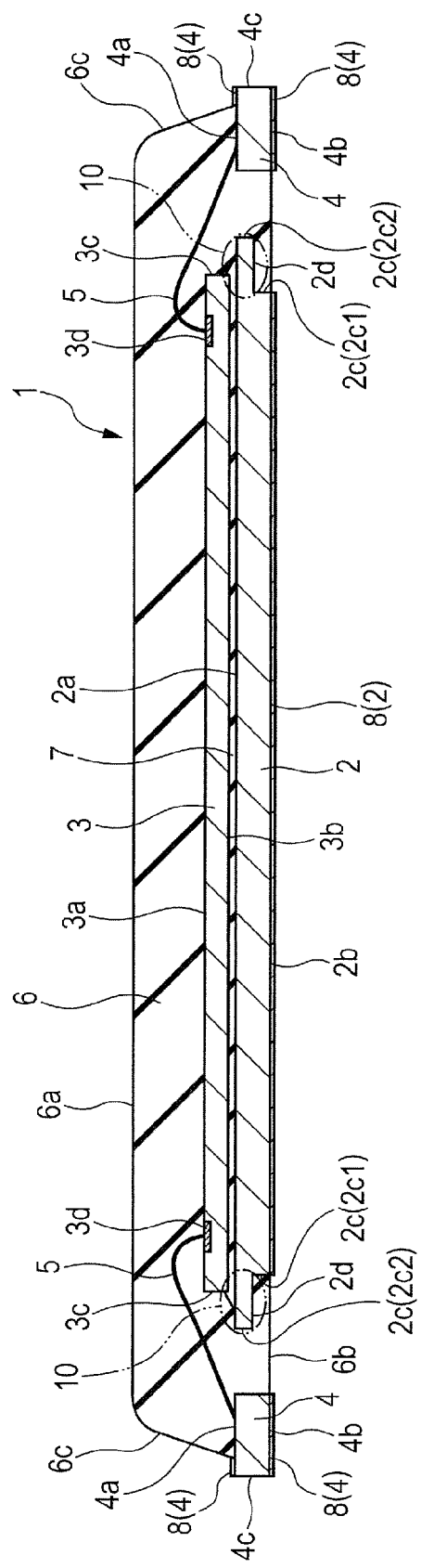
FIG. 3 is a cross-sectional view along the line A-A of FIG. 1.
Figure 4:
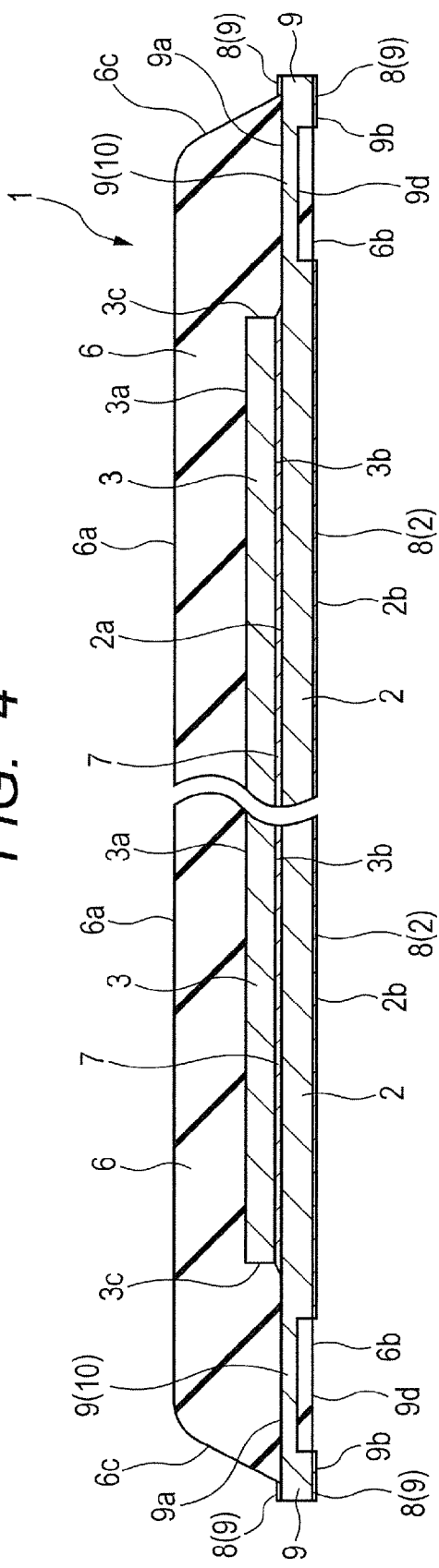
FIG. 4 is a cross-sectional view along the line B-B of FIG. 1.
Figure 5:
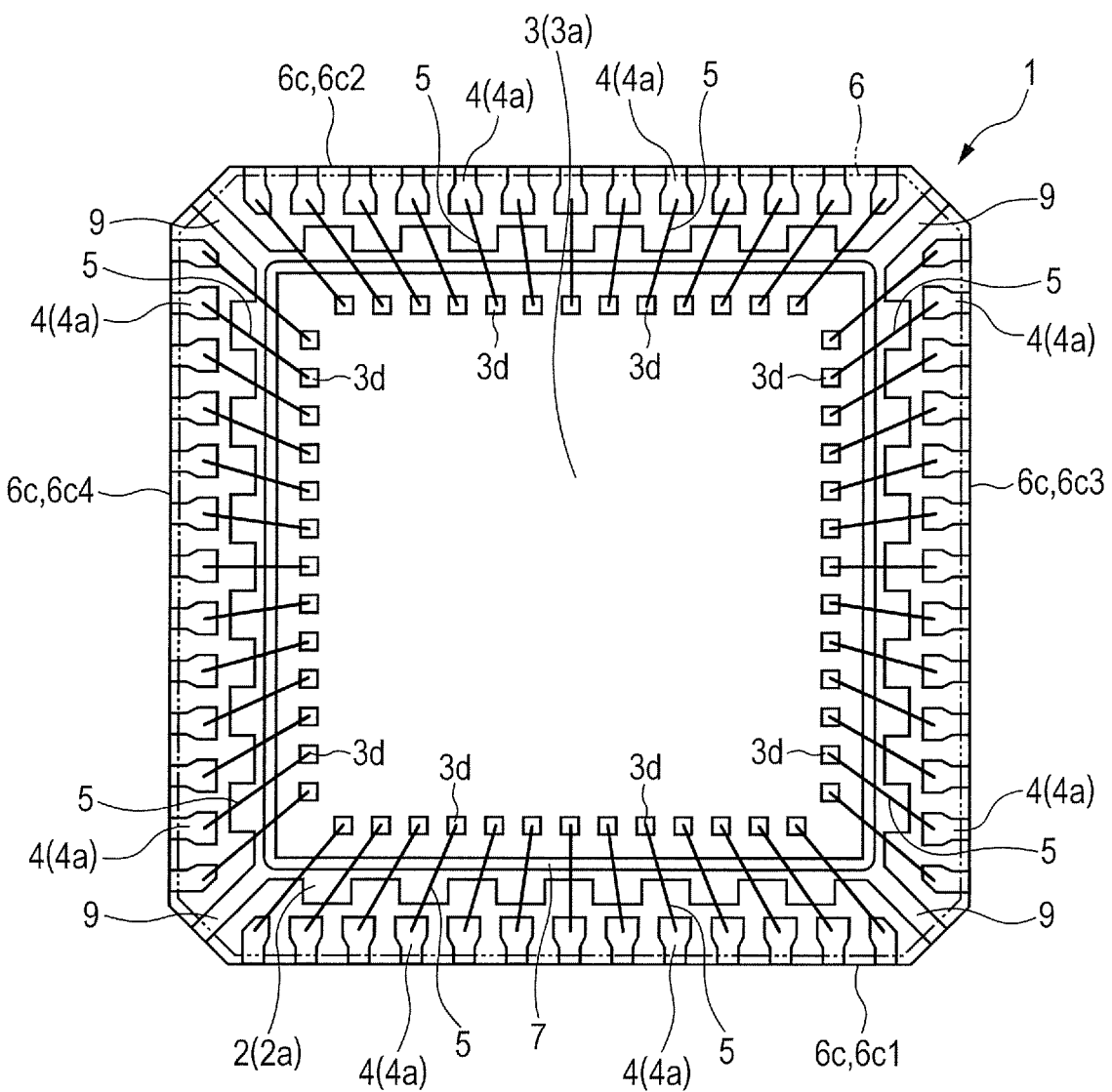
FIG. 5 is a plan view showing an internal structure of the semiconductor device from which the sealing resin shown in FIG. 1 has been removed.

In the present embodiment, a description will be given to a form of implementation in which the present invention is applied to a QFN (Quad Flat Non-leaded package) type semiconductor device in which parts of a chip mounting portion and a plurality of leads are exposed at the bottom surface of a sealing body having a quadrilateral two-dimensional shape as an example a tab-exposed-type semiconductor device. FIG. 1 is a top view of the semiconductor device of the present embodiment. FIG. 2 is a bottom view of the semiconductor device shown in FIG. 1. FIG. 3 is a cross-sectional view along the line A-A of FIG. 1. FIG. 4 is a cross-sectional view along the line B-B of FIG. 1. FIG. 5 is a plan view showing an internal structure of the semiconductor device from which the sealing resin shown in FIG. 1 has been removed.

<Semiconductor Device>

A configuration of a semiconductor device 1 of the present embodiment will be described using FIGS. 1 to 5. As shown in FIGS. 1 to 5, the semiconductor device 1 of the present embodiment includes a tab 2 (see FIGS. 3 and 5), and a semiconductor chip 3 (see FIGS. 3 and 5) mounted over the tab 2 via an adhesive material (die-bond material) 7 (see FIGS. 3 and 5). The semiconductor device 1 also has a plurality of leads 4 (see FIGS. 3 and 5) disposed around the semiconductor chip 3, and a plurality of wires 5 (see FIGS. 3 and 5) electrically coupling a plurality of pads 3d (see FIGS. 3 and 5) of the semiconductor chip 3 to the plurality of leads 4 thereof. The semiconductor device 1 also includes a sealing body 6 (see FIGS. 3 and 5) sealing therein the semiconductor chip 3, the plurality of wires 5, and the plurality of leads 4. The tab 2 is coupled to a plurality of suspension leads 9 (see FIGS. 4 and 5).

First, a description will be given to an outer appearance structure of the semiconductor device 1. A sealing body (resin body) 6 shown in FIG. 1 is comprised of a resin obtained by adding filler particles of silica or the like to, e.g., an epoxy-based thermosetting resin. In planar view, the sealing body 6 is in the form of a quadrangle having four sides (main sides). The sealing body 6 includes a side (main side) 6c1, a side (main side) 6c2 opposing the side 6c1, a side (main side) 6c3 located between the side 6c1 and the side 6c2, and a side (main side) 6c4 opposing the side 6c3. In corner portions between the individual sides 6c1, 6c2, 6c3, and 6c4, chamfered portions are disposed to inhibit the sealing body 6 from chipping. If the chamfered portions are included in the two-dimensional shape of the sealing body 6, the two-dimensional shape of the sealing body 6 is strictly an octagon (octagon in which the side of each of the chamfered portions is counted as one side). However, each of the sides of the chamfered portions (corner portions) is sufficiently small compared to the length of each of the main sides along which the plurality of leads 4 are arranged in juxtaposition. Therefore, the two-dimensional shape of the sealing body 6 can be substantially regarded as a quadrangle (quadrilateral). In the present invention, the sealing body 6 will be described on the assumption that the chamfered portions are the corner portions of the sealing body 6, and the two-dimensional shape of the sealing body 6 is the quadrangle (quadrilateral). The sealing body also has a top surface (upper surface) 6a, a bottom surface (back surface or mounting surface) 6b (see FIG. 2) opposite to the top surface 6a, and side surfaces 6c located between the top surface 6a and the bottom surface 6b. As shown in FIGS. 3 and 4, the side surfaces 6c are inclined surfaces.

Also, as shown in FIGS. 1 and 2, in the semiconductor device 1, the plurality of leads 4 are arranged along each of the sides (main sides) of the sealing body 6. The plurality of leads 4 are each comprised of a metal material, and comprised of, e.g., copper (Cu) in the present embodiment. Specifically, a plating film (not shown) comprised of, e.g., nickel (Ni) is formed over the surface of a base material comprised of copper (Cu). As shown in FIG. 2, bottom surfaces 4b of the plurality of leads 4 are exposed from the sealing body 6 at the bottom surface 6b of the sealing body 6. At the peripheral edge portion (outer peripheral portion in planar view) of the sealing body 6, parts of top surfaces 4a of the plurality of leads 4 and the plurality of suspension leads 9 are exposed from the sealing body 6. Also, as shown in FIG. 3, outer side surfaces 4c of the plurality of leads 4 are exposed from the sealing body 6 at the side surfaces 6c of the sealing body 6. Over the surfaces of the leads 4 exposed from the sealing body 6, conductor films (external plating films) 8 (see FIG. 3) are formed. The conductor films 8 are, e.g., solder films formed by a plating method and, by forming the conductor films 8, when the semiconductor device 1 is mounted over a mounting substrate not shown, it is possible to allow easy wet-spreading of a bonding material (e.g., a solder material) over the exposed surfaces of the leads 4.

Also, as shown in FIG. 2, inwardly of the plurality of leads 4, the tab (die pad or chip mounting portion) 2 as the chip mounting portion over which the semiconductor chip 3 (see FIG. 3) is mounted is disposed. The bottom surface 2b of the tab 2 is exposed from the sealing body 6 at the bottom surface 6b of the sealing body 6. That is, the semiconductor device 1 is a tab-exposed-type (die-pad-expose-type) semiconductor device. The tab 2 is comprised of a metal material having a heat conductivity higher than that of the sealing body 6. In the present embodiment, the tab 2 is comprised of, e.g., copper (Cu). Specifically, over the surface of a base material comprised of copper (Cu), a plating film (not shown) comprised of, e.g., nickel (Ni) is formed. By thus exposing a metal member (tab 2) comprised of, e.g., copper (Cu) or the like having a heat conductivity higher than that of the sealing body 6, the heat release property of the package can be improved compared to that in a semiconductor device in which the tab 2 is not exposed. When the semiconductor device 1 is mounted over the mounting substrate not shown, if the bottom surface 2b of the tab 2 is coupled to the terminals of the mounting substrate via, e.g., a solder material (bonding material), heat generated in the semiconductor device 1 can be more efficiently released toward the mounting substrate. For this purpose, in the present embodiment, the conductor films (external plating films) 8 (see FIG. 3) are formed on the bottom surface 2b side of the tab 2. This can improve the wettability of the solder material serving as the bonding material when the tab 2 is coupled to the terminals of the mounting substrate. If the bottom surface 2b of the tab 2 is electrically coupled to the terminals of the mounting substrate via a conductive member such as the solder material, it is possible to utilize the tab 2 as the electrode of the semiconductor device 1.

Also, as shown in FIGS. 1 and 2, in the semiconductor device 1, parts of the suspension leads 9 are exposed from the sealing body 6 in the corner portions of the sealing body 6. Specifically, as shown in FIGS. 4 and 5, one end portion of each of the suspension leads 9 is coupled to the tab 2 (integrally formed therewith), while the other end portion (exposed portion) thereof is exposed from the sealing body 6. Since the suspension leads 9 are integrally formed with the tab 2, the suspension leads 9 including the exposed portions are each comprised of the same metal material as that of the tab 2. In the present embodiment, over the surface of the base material comprised of copper (Cu), a plating film (not shown) comprised of, e.g., nickel (Ni) is formed.

Next, a description will be given to an internal structure of the semiconductor device 1. As shown in FIG. 5, in the sealing body 6, the semiconductor chip 3 is sealed. As shown in FIG. 3, the semiconductor chip 3 has a top surface (upper surface or main surface) 3a, a back surface (bottom surface or main surface) 3b located on the opposite side of the top surface 3a, and side surfaces 3c located between the top surface 3a and the back surface 3b. As shown in FIG. 5, the top surface 3a of the semiconductor chip 3 is in the form of a quadrangle (quadrilateral) in planar view. The back surface 3b (see FIG. 3) of the semiconductor chip 3 is also in the form of a quadrangle (quadrilateral) in planar view, though not shown. Over the top surface 3a, a plurality of pads (electrodes, chip electrodes, or bonding pads) 3d are disposed. In the example shown in FIG. 5, the plurality of pads 3d are arranged along each of the sides forming the outer edge of the top surface 3a of the semiconductor chip 3. Over the main surface of the semiconductor chip 3 (specifically, over a semiconductor element formation region provided in the top surface of the base material (semiconductor substrate) of the semiconductor chip 3), a plurality of semiconductor elements (circuit elements) are formed, though not shown. The plurality of pads 3d are electrically coupled to the semiconductor elements via wiring lines (not shown) formed in wiring layers disposed within the semiconductor chip 3 (specifically, between the top surface 3a and the semiconductor element formation region not shown).

The semiconductor chip 3 (specifically, the base material of the semiconductor chip 3) is comprised of, e.g., silicon (Si). Over the top surface 3a, an insulating film covering the base material and the wiring lines of the semiconductor chip 3 are formed. The top surfaces of the plurality of pads 3d are exposed from the insulating film in openings formed in the insulating film. The pads 3d are comprised of, e.g., a metal, e.g., aluminum (Al).

As also shown in FIG. 5, around the semiconductor chip 3 (around the tab 2), the plurality of leads 4 comprised of, e.g., copper (Cu) similarly to the tab 2 are disposed. Each of the plurality of leads 4 includes a top surface 4a, the bottom surface 4b located on the opposite side of the top surface 4a, and the side surfaces 4c located between the top surface 4a and the bottom surface 4b. The plurality of pads 3d formed over the top surface 3a of the semiconductor chip 3 are electrically coupled to the portions (inner lead portions) of the plurality of leads 4 located in the sealing body 6 via the plurality of wires (conductive materials) 5. The wires 5 are comprised of, e.g., gold (Au) or copper (Cu). Each of the wires 5 has one portion (e.g., one end portion) thereof bonded to the pad 3d and the other portion (e.g., the other end portion) thereof bonded to the bonding region of the top surface 4a of the lead 4.

Also, as shown in FIGS. 3 to 5, the semiconductor chip 3 is adhesively fixed to a top surface (chip mounting surface) 2a of the tab 2 via an adhesive material (die-bond material) 7. In the present embodiment, the semiconductor chip 3 is mounted over the middle of the tab 2. The semiconductor chip 3 is mounted over the tab 2 via the adhesive material 7 with the back surface 3b thereof opposing the top surface 2a of the tab 2. The adhesive material 7 is used when the semiconductor chip 3 is die-bonded. In the present embodiment, a conductive adhesive material such as a die-bond material in which, e.g., metal particles comprised of silver (Ag) or the like are contained in an epoxy-based thermosetting resin or a solder material. As shown in FIG. 3, the tab 2 includes the top surface 2a having the semiconductor chip 3 mounted thereover, the bottom surface 2b located on the opposite side of the top surface 2a, and a plurality of side surfaces 2c located between the top surface 2a and the bottom surface 2b.

In planar view, a part of the bottom surface 2b of the tab 2 closer to the peripheral edge portion thereof has been removed to provide a region (thinner region 10 shown in FIG. 3) thinner than the middle region thereof. The thinner region 10 of the tab 2 is sealed in the sealing body 6. From another viewpoint, each of the side surfaces 2c of the tab 2 has a portion (side surface) 2c1 continued to the bottom surface 2b of the tab 2, and a portion (side surface) 2c2 located outwardly of the portion 2c1 (closer to the lead 4 in planar view) and continued to the top surface 2a of the tab 2. The height of the portion 2c2 is shorter than the distance from the top surface 2a of the tab 2 to the bottom surface 2b thereof. Also, a bottom surface (portion) 2d continued to the portion 2c1 is sealed in the sealing body 6. From still another viewpoint, the area of the top surface 2a of the tab 2 is larger than the area of the bottom surface 2b of the tab 2, and the region of the tab 2 located outside the bottom surface 2b thereof exposed from the sealing body 6 has the bottom surface 2d located between the bottom surface 2b and the top surface 2a. From yet another viewpoint, in planar view, the tab 2 has the middle region and a peripheral edge region located outside the middle region. The peripheral edge region includes the top surface 2a, and the bottom surface 2d located on the opposite side of the top surface 2a and between the top surface 2a and the bottom surface 2b. Accordingly, the thickness of the peripheral edge region defined by the distance between the top surface 2a and the bottom surface 2d is smaller than the thickness of the middle region defined by the distance between the top surface 2a and the bottom surface 2b. The region having the bottom surface located at a position (closer to the top surface 2a) higher than that of the bottom surface 2b, and sealed in the sealing body 6 will be described as the thinner region 10.

As shown in FIG. 3, as a result of providing the tab 2 with the thinner region 10, the sealing body 6 is located under the thinner region 10. That is, the tab 2 is supported, by the sealing body 6 via the thinner region 10. As a result, it is possible to prevent or inhibit the tab 2 from falling out of (coming off) the sealing body 6. Note that the thinner region 10 may be divided at a midway point. However, in the present embodiment, the thinner region 10 is formed around the entire periphery of the tab 2. A configuration in which the area of the bottom surface 2b of the tab 2 is set smaller than the area of the top surface 2a is preferred from the following viewpoint. That is, when the two-dimensional size of the semiconductor chip 3 is increased while the two-dimensional size of the semiconductor device 1 is inhibited from increasing, the two-dimensional size of the tab 2 as a chip mounting portion increases. However, if the area of the bottom surface 2b of the tab 2 shown in FIG. 2 is increased, the distance between the tab 2 and each of the plurality of leads 4 disposed in the peripheral edge portion of the package is reduced. When the distance between the tab 2 and each of the plurality of leads 4 is excessively reduced to bring the tab 2 too close to the plurality of leads 4, the solder material as the bonding material is undesirably bridged over the mounting substrate not shown. That is, the plurality of leads 4 may be short-circuited via the tab 2 over the mounting substrate. Accordingly, by setting the area of the bottom surface 2b of the tab 2 smaller than the area of the top surface 2a thereof (see FIGS. 3 and 5) as in the present embodiment, it is possible to prevent the distance between the tab 2 and each of the plurality of leads 4 from being excessively reduced and prevent the tab 2 from becoming too close to the plurality of leads 4. In addition, since the top surface 2a of the tab 2 can be increased in size in accordance with the two-dimensional size of the semiconductor chip 3 as shown in FIG. 5, the entire back surface 3b (see FIG. 3) of the semiconductor chip 3 can be adhesively fixed to the tab 2. Note that a more detailed shape of the thinner region 10 of the tab 2 and the reason for adopting the shape will be described later in detail.

As shown in FIG. 5, the plurality of suspension leads 9 are coupled (connected) to the tab 2. The plurality of suspension leads 9 have one end portions thereof coupled to the corner portions (corners) of the tab 2. The plurality of suspension leads 9 also have the other end portions thereof extending toward the corner portions of the sealing body 6 to be exposed from the sealing body 6. By extending the suspension leads 9 toward the corner portions of the sealing body 6, it is possible to dispose the plurality of leads 4 along each of the sides (each of the main sides) of the sealing body 6 without disturbing the arrangement thereof. Therefore, the number of the leads 4, i.e., the number of terminals in the semiconductor device 1 can be increased. Also, as shown in FIG. 4, each of the suspension leads 9 is provided with the thinner region 10. Specifically, from the portion of the suspension lead 9 coupling the tab 2 to the portion thereof exposed from the sealing body 6, a part closer to the bottom surface 9b has been removed. The coupling portion of the suspension lead 9 includes a bottom surface (portion) 9d located on the opposite side of the top surface 9a and located between the bottom surface 9b and the top surface 9a. The thinner region 10 of the suspension lead is sealed in the sealing body 6. This allows the suspension lead 9 and the sealing body 6 to be securely fixed. Therefore, it is possible to prevent or inhibit the suspension lead 9 and the tab 2 coupled to the lead 9 from coming off the sealing body 6.

<Detailed Configuration of Chip Mounting Portion>

Figure 6:
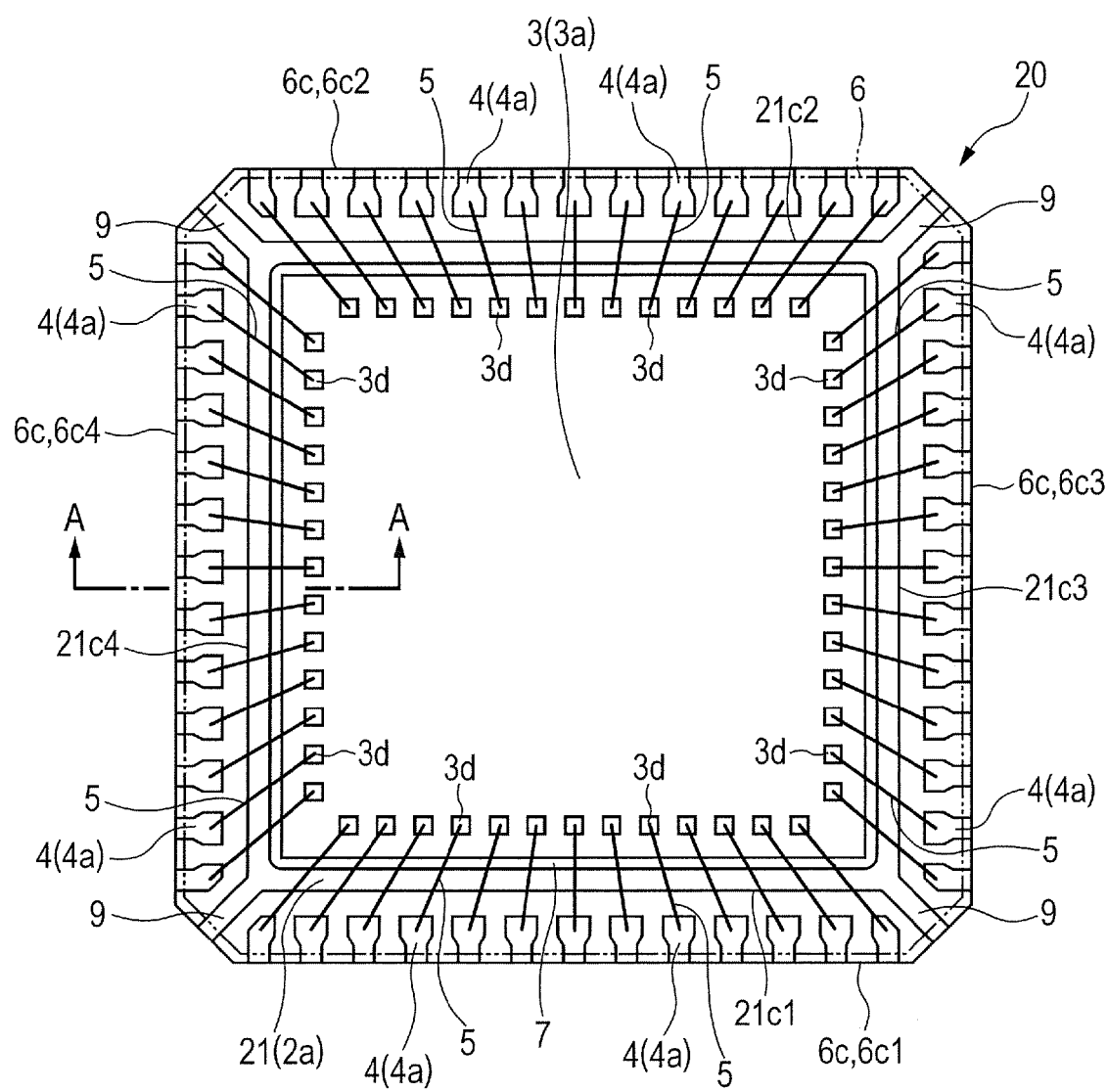
FIG. 6 is a plan view showing an internal structure of a semiconductor device as another form of implementation other than that shown in FIG. 5.
Figure 7:
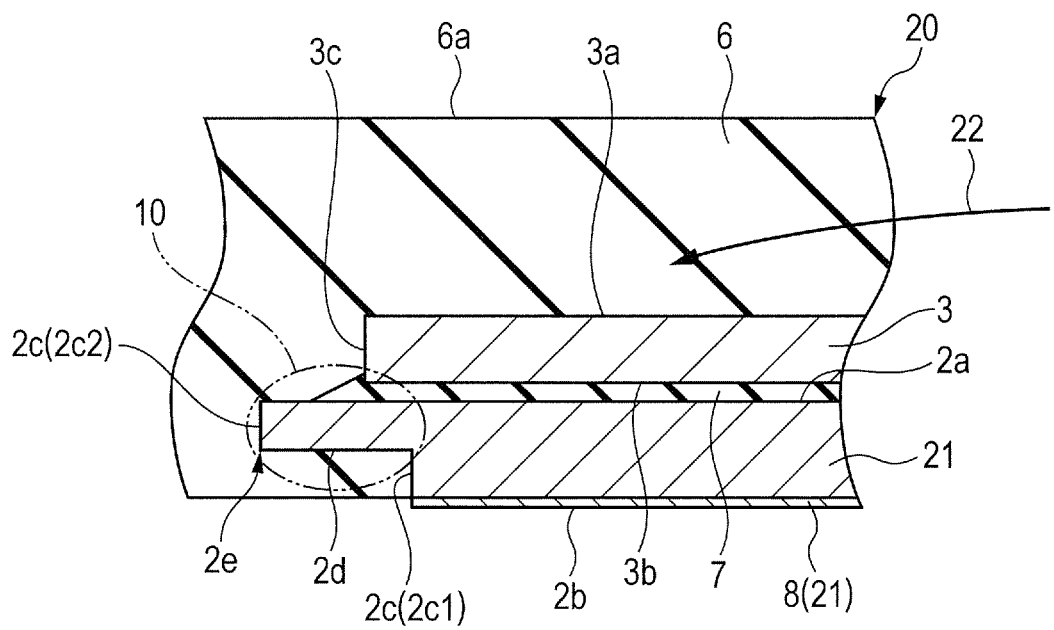
FIG. 7 is an enlarged cross-sectional view along the line A-A shown in FIG. 6.
Figure 8:
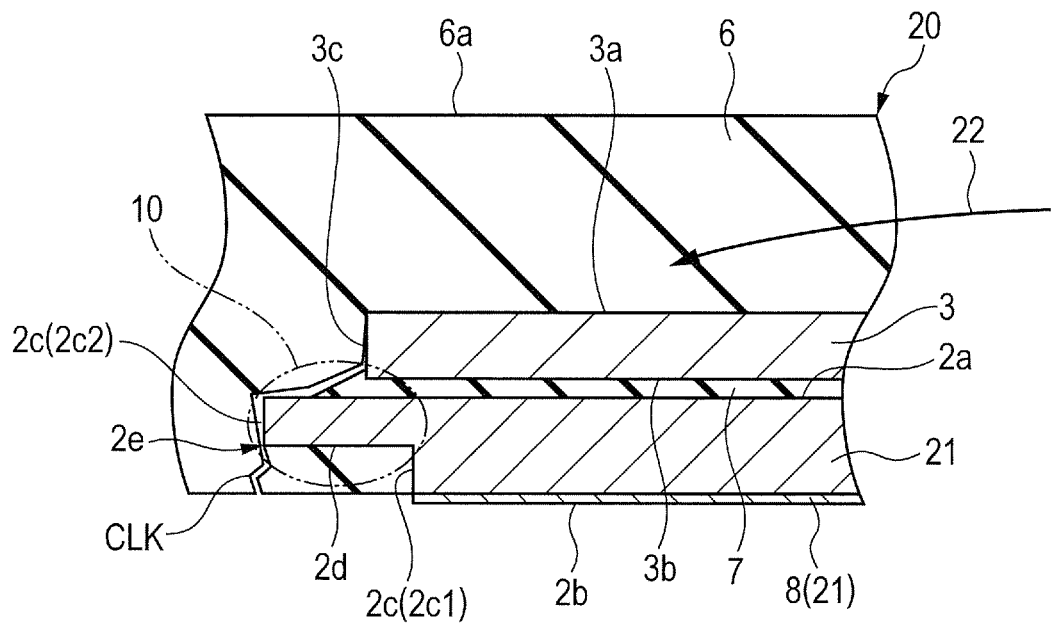
FIG. 8 is an enlarged cross-sectional view schematically showing the state of the semiconductor device shown in FIG. 7 that has been deformed under a temperature cycle load given thereto.
Figure 9:
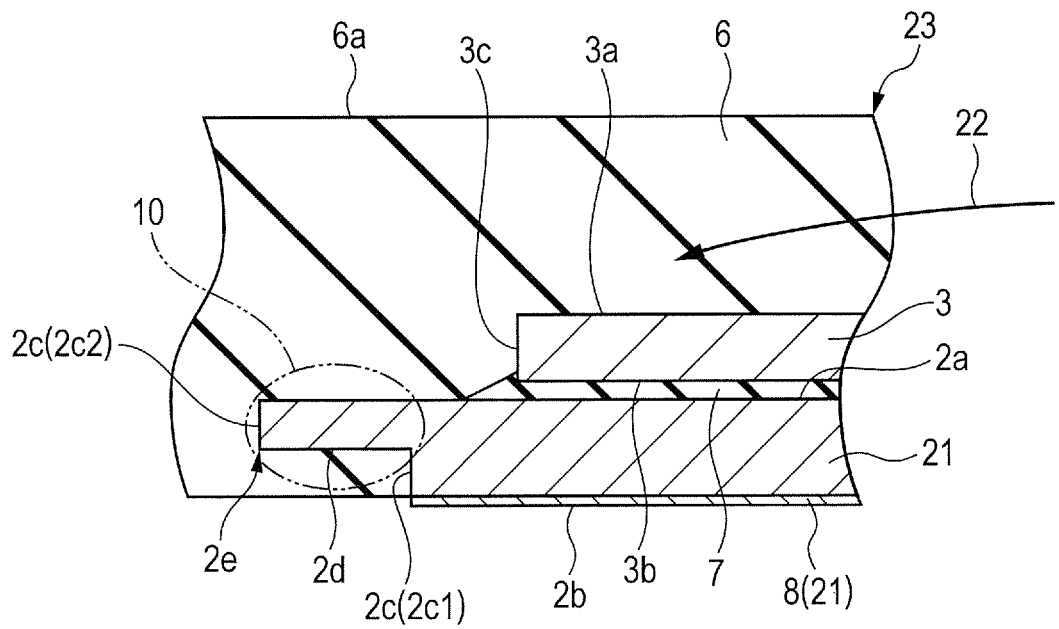
FIG. 9 is an enlarged cross-sectional view of a semiconductor device as another form of implementation other than that shown in FIG. 7.
Figure 10:
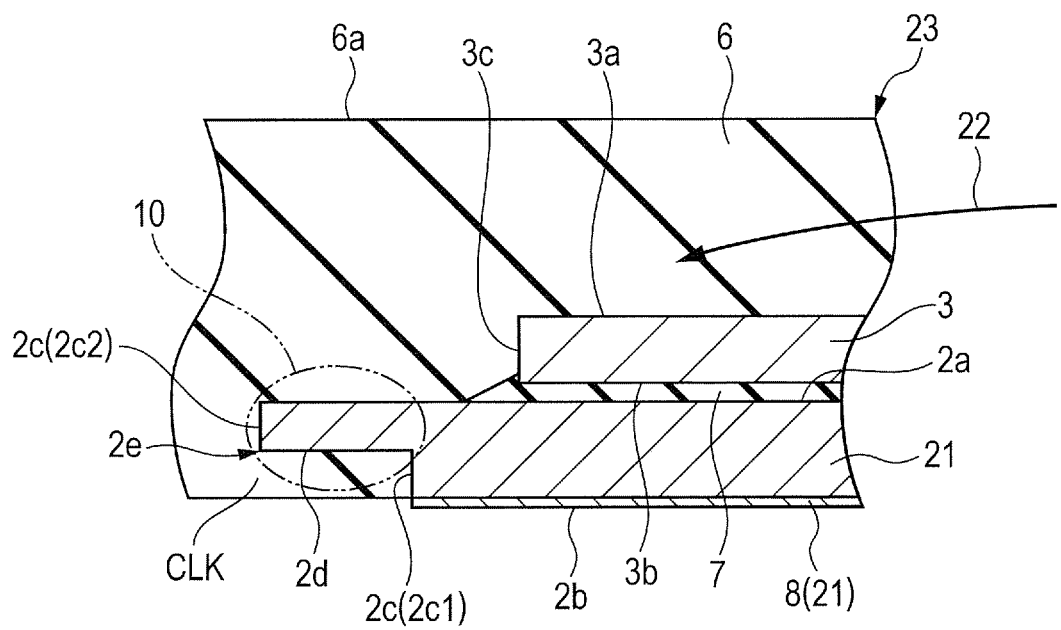
FIG. 10 is an enlarged cross-sectional view schematically showing the state of the semiconductor device shown in FIG. 9 that has been deformed under a temperature cycle load given thereto.

Next, a description will be given to a detailed shape of the tab 2 shown in FIGS. 2 to 5. Here, the problem found by the present inventors will be described first, and then the configuration of the tab 2 of the present embodiment will be described. FIG. 6 is a plan view showing an internal structure of a semiconductor device as another form of implementation other than that shown in FIG. 5. FIG. 7 is an enlarged cross-sectional view along the line A-A shown in FIG. 6. FIG. 8 is an enlarged cross-sectional view schematically showing the state of the semiconductor device shown in FIG. 7 that has been deformed under a temperature cycle load given thereto. FIG. 9 is an enlarged cross-sectional view of a semiconductor device as another form of implementation other than that shown in FIG. 7. FIG. 10 is an enlarged cross-sectional view schematically showing the state of the semiconductor device shown in FIG. 9 that has been deformed under a temperature cycle load given thereto.

A semiconductor device 20 shown in FIGS. 6 to 8 is different from the semiconductor device 1 shown in FIGS. 1 to 5 in that the outer edge of the top surface 2a of a tab 21 having the semiconductor chip 3 mounted thereover has four sides 21c1, 21c2, 21c3, and 21c4 which linearly extend along the respective sides 6c1 to 6c4 of the sealing body 6. The semiconductor device 20 is otherwise the same as the semiconductor device 1. A semiconductor device 23 shown in FIGS. 9 and 10 is different from the semiconductor device 20 shown in FIGS. 6 to 8 in that the two-dimensional size of the semiconductor chip 3 is smaller, and the semiconductor chip 3 and the adhesive material 7 do not overlap the thinner region 10 in planar view. The semiconductor device 23 is otherwise the same as the semiconductor device 20. In planar view, the tab 21 of the semiconductor device 20 shown in FIGS. 6 to 8 has the peripheral edge portion thereof provided with the thinner region 10, similarly to the tab 2 of the semiconductor device 1 shown in FIGS. 3 to 5. Therefore, as described above, it is possible to prevent or inhibit the tab from falling out of the sealing body 6. It is also possible to prevent the plurality of leads 4 (see FIG. 6) from becoming too close to the tab 2 due to a reduced distance therebetween.

However, as a result of performing a temperature cycle test on the semiconductor device 20, the present inventors have found that, in the vicinity of the thinner region 10 of the tab 2, a minute crack (defect) CLK occurs in a sealing body 6 as shown in, e.g., FIG. 8. When the crack CLK has occurred in the sealing body 6, it serves as a path through which moisture or the like enters the sealing body 6. If the semiconductor device is used continuously in the state where the crack CLK has occurred, the crack CLK develops to be larger in size to consequently cause the degradation of the reliability of the semiconductor device. According to observation of the semiconductor device 20 in which the crack CLK has occurred, the crack CLK occurs with high frequency at a position $2e$ as a starting point where the bottom surface $2d$ of the thinner region 10 and the portion (side surface) $2c2$ intersect. In planar view, a position in the vicinity of the middle of each of the linearly extending sides $21c1$, $21c2$, $21c3$, and $21c4$ is likely to serve as the starting point of the crack CLK (see FIG. 8), as shown in FIG. 6. On the other hand, in the case of the semiconductor device 23 shown in FIGS. 9 and 10, even when the temperature cycle test was similarly performed, the occurrence of a crack CLK as shown in FIG. 8 was not recognized. Also, the temperature cycle test was similarly performed on a semiconductor device as another example of the semiconductor device 20 shown in FIGS. 6 to 8 in which the two-dimensional size of the semiconductor chip 3 was increased to be larger than the top surface $2a$ of the tab 21, and the side surface $3c$ of the semiconductor chip 3 was located outside the tab 21 in planar view, though not shown, but the occurrence of a crack CLK as shown in FIG. 8 was not recognized. Also, the temperature cycle test was similarly performed on a semiconductor device as still another example of the semiconductor device 20 shown in FIGS. 6 to 8 in which the amount of the adhesive material disposed between the semiconductor chip 3 and the tab 21 was reduced so as to prevent the adhesive material 7 from overlapping the thinner region 10 in planar view, though not shown, but the occurrence of a crack CLK as shown in FIG. 8 was not recognized. That is, it has been found that the crack CLK shown in FIG. 8 is a phenomenon which occurs when the outer edge (side surface $3c$) of the semiconductor chip 3 is located between the portion (side surface) $2c1$ and the portion (side surface) $2c2$ of the tab 21 and the outer edge of the adhesive material 7 is located between the semiconductor chip 3 and the portion (side surface) $2c2$ in planar view.

From the result of the foregoing study conducted by the present inventors, it can be considered that the crack CLK shown in FIG. 8 occurs as follows. When a temperature cycle load is given to each of the semiconductor devices 1, 20, and 23, a stress results from the different linear expansion coefficients of the constituent materials thereof. For example, in the case of the semiconductor devices 1, 20, and 23, compared to the linear expansion coefficients of the semiconductor chip 3, the sealing body 6, and the adhesive material 7, the linear expansion coefficients of the tabs 2 and 21 each comprised of a metal material are particularly high. Accordingly, when the temperature cycle load is given to the semiconductor devices 1, 20, and 23, a stress derived from the tab 2 or 21 is produced in members around the tab 2 or 21. In particular, when a temperature drops, as shown by the arrows added to FIGS. 7 to 10, deformation (projecting deformation) which is upward projection of a middle portion of a package in planar view is likely to occur. When the projecting deformation has occurred, in a region around the thinner region 10 shown in FIG. 8, a force (stress which causes opening deformation) which deforms the sealing body 6 and the tab 21 in a direction (opening direction) in which the sealing body 6 and the tab 21 are pulled apart from each other is produced.

Here, when the semiconductor chip 3 and the adhesive material 7 do not overlap the thinner region 10 of the tab 21 in planar view, as in the semiconductor device 23 shown in FIG. 10, the thinner region 10 is not in contact with a member other than the sealing body 6. Accordingly, the sealing body 6 comprised of a resin deforms following the thinner region 10 to thereby allow a stress resulting from the temperature cycle load to be released (reduced). However, when parts of the semiconductor chip 3 and the adhesive material 7 overlap the thinner region 10 in planar view as shown FIG. 8, the semiconductor chip 3 fixed to the thinner region 10 via the adhesive material 7 inhibits the deformation of the thinner region 10. As a result, the stress produced in the thinner region 10 of the tab 21 is less likely to be released (reduced), and is locally concentrated. A place on which the stress is likely to be concentrated in cross-sectional view is the position $2e$ where the bottom surface $2d$ of the thinner region and the portion (side surface) $2c2$ intersect. In planar view, the stress is likely to be concentrated on a middle position on each of the linearly extending sides $21c1$, $21c2$, $21c3$, and $21c4$, as shown in FIG. 6. Therefore, it can be considered that the place on which the stress is concentrated serves as the starting point of the crack CLK. Note that, when the outer edge (side surface $3c$) of the semiconductor chip 3 described above is located outside the tab 21, the deformation of the thinner region 10 is inhibited in the same manner as in the semiconductor device 20 shown in FIG. 8. However, in this case, the stress is transmitted to the semiconductor chip 3 so that the stress is not concentrated on the position $2e$ shown in FIG. 8. Under the back surface $3b$ of the semiconductor chip 3, the sealing body 6 is thick so that, even if the stress is concentrated on the outer edge portion of the back surface $3b$ of the semiconductor chip 3, the crack CLK is less likely to occur. In the case of the example in which the semiconductor chip 3 and the thinner region 10 overlap and the adhesive material 7 does not overlap the thinner region 10 in planar view as described above, the deformation of the thinner region 10 is not inhibited in the same manner as in the semiconductor device 23 shown in FIG. 10. Therefore, a crack CLK as shown in FIG. 8 is less likely to occur.

From the result of the study described above, it can be considered that, if the semiconductor chip 3 and the adhesive material 7 are disposed so as not to overlap the thinner region 10 in planar view as in the semiconductor device 23 shown in FIGS. 9 and 10, it is possible to inhibit the occurrence of the crack CLK. However, in the semiconductor device 23, the size of the thinner region 10, i.e., the two-dimensional size of the top surface $2a$ of the tab 21 needs to be increased in accordance with the two-dimensional size of the semiconductor chip 3. This causes another problem that it is difficult to reduce the size of the package or reduce a mounting area. As for the adhesive material 7 for adhesively fixing the semiconductor chip 3 to the tab 21, a part thereof is wet-spread up to the side surface $3c$ of the semiconductor chip 3 to thereby allow an improvement in the adhesive strength of the adhesive material 7. Accordingly, in the case of the example in which the semiconductor chip 3 overlaps the thinner region 10 and the adhesive material 7 does not overlap the thinner region 10, the reliability of the adhesive strength of the adhesive material 7 may be degraded.

Figure 11:
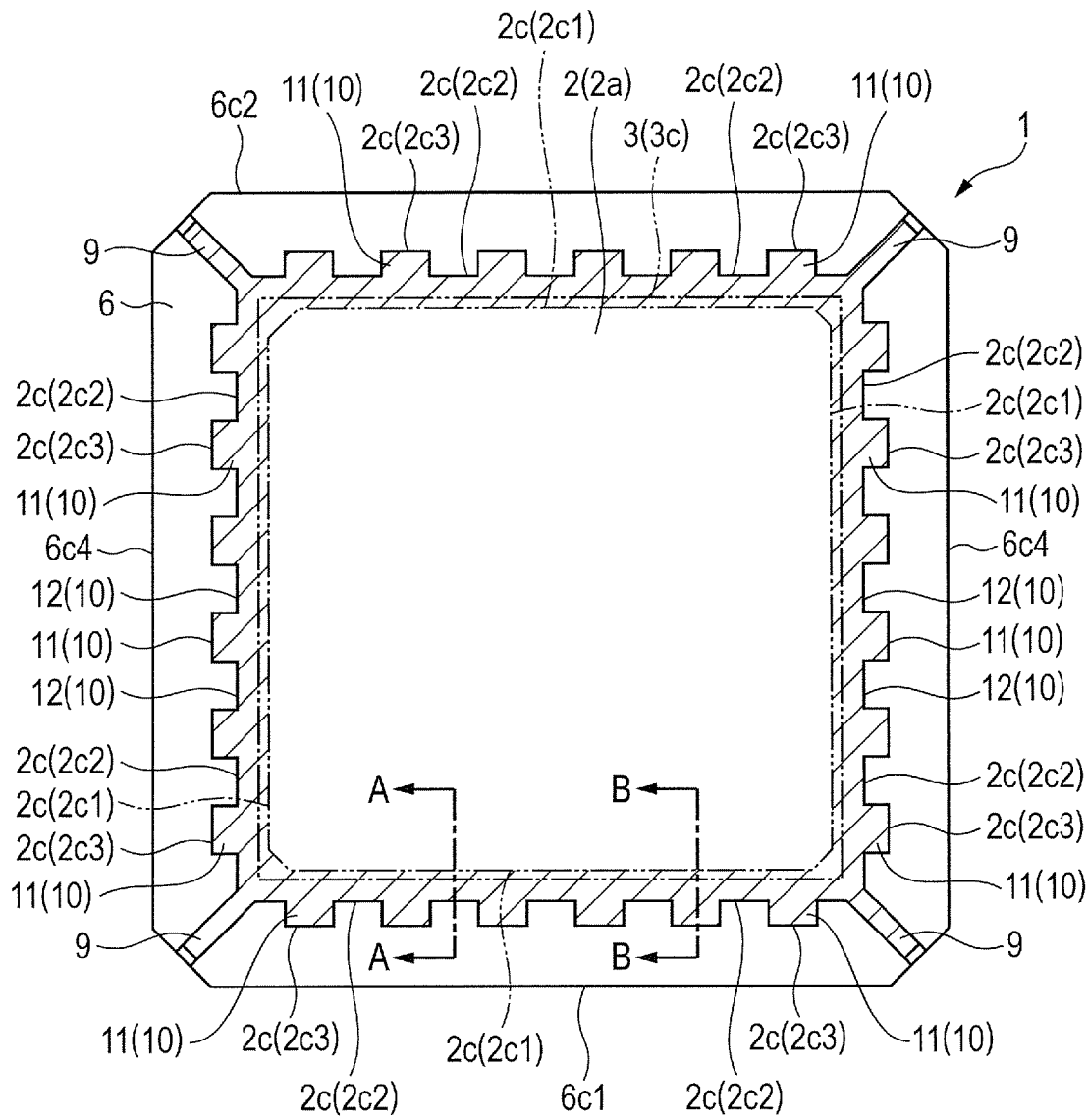
FIG. 11 is a plan view showing the range of the thinner region of the chip mounting portion shown in FIG. 5.
Figure 12:
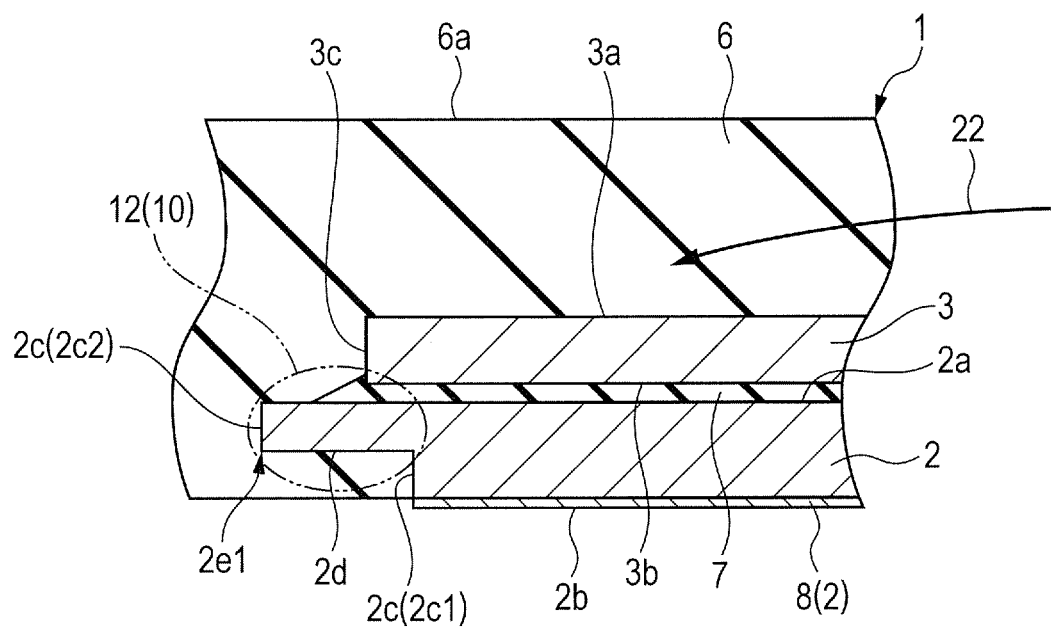
FIG. 12 is an enlarged cross-sectional view along the line A-A of FIG. 11.
Figure 13:
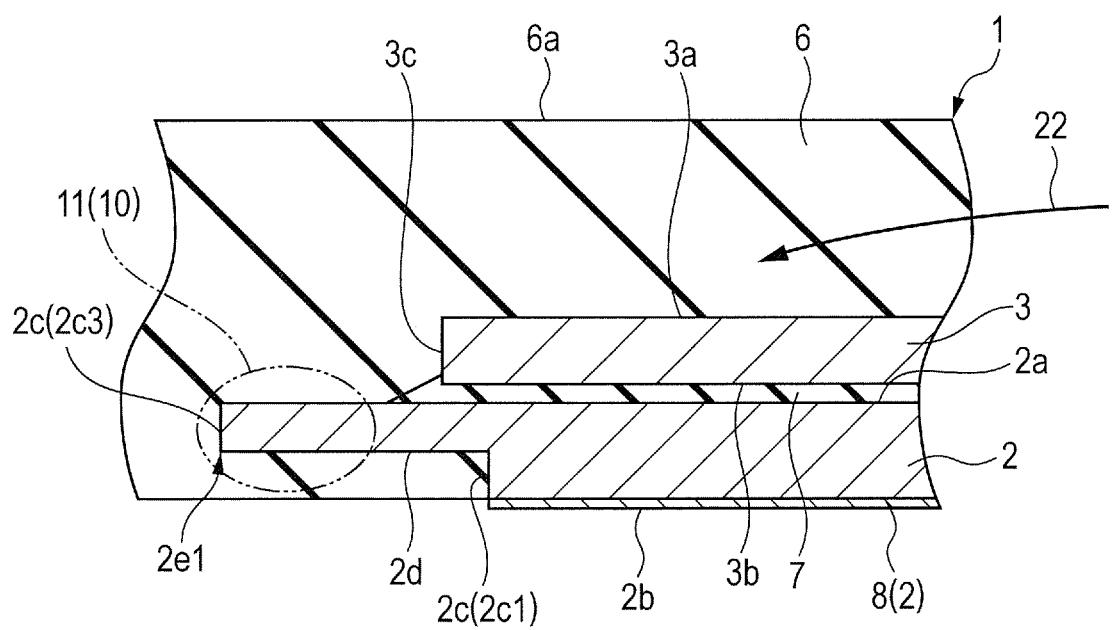
FIG. 13 is an enlarged cross-sectional view along the line B-B of FIG. 11.

In view of the result of the study described above, the present inventors have found the configuration of the tab 2 of the semiconductor device 1 shown in FIGS. 11 to 13. FIG. 11 is a plan view showing the range of the thinner region of the chip mounting portion shown in FIG. 5. FIG. 12 is an enlarged cross-sectional view along the line A-A of FIG. 11. FIG. 13 is an enlarged cross-sectional view along the line B-B of FIG. 11. Note that, in FIG. 11, the structure of the tab 2 is shown in a state where the semiconductor chip 3, the plurality of wires 5, and the plurality of leads 4 which are shown in FIG. 5 have been removed for improved clarity of illustration. However, the position of the outer edge (side surface) 3c) of the semiconductor chip 3 in planar view is shown by the two-dot-dash line.

As shown in FIG. 11, the tab 2 of the present embodiment has the sides thereof along (opposing) the respective sides 6c1, 6c2, 6c3, and 6c4 of the sealing body 6 which meander in planar view. That is, the tab 2 is the same as the tab 21 of the semiconductor device 20 shown in FIGS. 7 and 8 in that each of the side surfaces 2c of the tab 2 has the portion (side surface) 2c1 continued to the bottom surface 2b of the tab 2, and the portion (side surface) 2c2 located outwardly of the portion 2c1 (closer to the leads 4 in planar view) and continued to the top surface 2a of the tab 2. However, the side surface 2c of the tab 2 of the present embodiment also has a portion (side surface) 2c3 located outwardly of the portion (side surface) 2c2 and continued to the top surface 2a of the tab 2 to face the same direction as each of the portions (side surfaces) 2c1 and 2c2 in addition to the portions (side surfaces) 2c1 and 2c2. From another viewpoint, in the portion (side surface) 2c2 of the tab 2, protruding portions 11 protruding toward the sides 6c1, 6c2, 6c3, and 6c4 of the sealing body 6 are disposed along the extending directions of the sides 6c1, 6c2, 6c3, and 6c4. Conversely, if a description is given on the assumption that the portions (side surfaces) 2c3 are reference surfaces, the portions (side surfaces) 2c3 have recessed portions 12 which are recessed in a direction intersecting the sides 6c1, 6c2, 6c3, and 6c4 of the sealing body 6. The tab 2 of the present embodiment, in planar view as shown in FIG. 11, can prevent or inhibit the occurrence of a crack CLK as shown in FIG. 8 by forming indentations in the thinner region 10. A description will be given below to the reason therefor.

As shown in FIG. 12, the cross-sectional structure of the tab 2 of the semiconductor device 1 at the portions (side surfaces) 2c2 is the same as the structure of the tab 21 of the semiconductor device 20 shown in FIG. 7. That is, in planar view, respective parts of the semiconductor chip 3 and the adhesive material 7 overlap the thinner region 10 of the tab 2. In other words, in planar view, the outer edge (side surface 3c) of the semiconductor chip 3 is located between the portions (side surfaces) 2c1 and 2c2 of the tab 2, and the outer edge of the adhesive material 7 is located between the semiconductor chip 3 (outer edge) of the semiconductor chip 3 and the portion (side surface) 2c2. That is, a part of the bonding material 7 wets up to the side surface 3c of the semiconductor chip 3 to form a fillet. Formation of the fillet allows an improvement in the adhesive strength of the semiconductor chip 3. However, when a temperature cycle load is given to the semiconductor device 1, in the same manner as in the case of the semiconductor device 20 described above, the semiconductor chip 3 fixed to the thinner region 10 via the adhesive material 7 inhibits the deformation of the thinner region 10 so that a stress is produced in the thinner region 10 of the tab 2. However, in the case of the tab 2 of the present embodiment, the portion (side surface) 2c3 is located further outside the portion (side surface) 2c2 shown in FIG. 12, and the portions (side surface) 2c2 and 2c3 are integrally formed. Accordingly, the stress produced in the portion (side surface) 2c2 is transmitted to the portion (side surface) 2c3. As a result, it is possible to prevent or inhibit the occurrence of the crack CLK (see FIG. 8) in the portion (side surface) 2c2. On the other hand, to the portion (side surface) 2c3 shown in FIG. 13, the stress produced in the portion (side surface) 2c2 is transmitted as described above. However, since the outer edges of the semiconductor chip 3 and the adhesive material 7 are located between the portions (side surfaces) 2c1 and 2c2, in the vicinity (protruding portions 11) of the portions (side surfaces) 2c3, the thinner region 10 is not in contact with a member other than the sealing body 6. As a result, the sealing body 6 comprised of a resin deforms following the thinner region 10 to allow the stress resulting from the temperature cycle load to be released (reduced). In other words, the plurality of protruding portions 11 formed in the thinner region 10 shown in FIG. 11 function as stress release ends to thereby release (reduce) the stress and successfully inhibit the occurrence of the crack CLK (see FIG. 8).

Thus, when the temperature cycle load is given to the semiconductor device 1 of the present embodiment, the stress resulting from the load may be produced in a part of the tab 2, but the stress can be released in the vicinity of the portions (side surfaces) 2c3. As a result, in the semiconductor device 1, it is possible to inhibit the occurrence of a crack CLK, as shown in FIG. 8. This can inhibit the reliability of the semiconductor device 1 from being degraded by the crack CLK. According to the present embodiment, a part of the adhesive material 7 wets up to the side surface 3c of the semiconductor chip 3 to form the fillet and thereby allow an improvement in the adhesive strength between the semiconductor chip 3 and the tab 2. As a result, it is possible to inhibit the degradation of the reliability due to the reduced adhesive strength of the adhesive material 7. Also, according to the present embodiment, it is possible to dispose the semiconductor chip 3 over the thinner region 10 and therefore allow a reduction in the two-dimensional size of the top surface of the tab 2. As a result, it is possible to inhibit an increase in the two-dimensional size of the semiconductor device 1, while inhibiting the degradation of the reliability thereof.

<Preferred Forms of Implementation>

Figure 14:
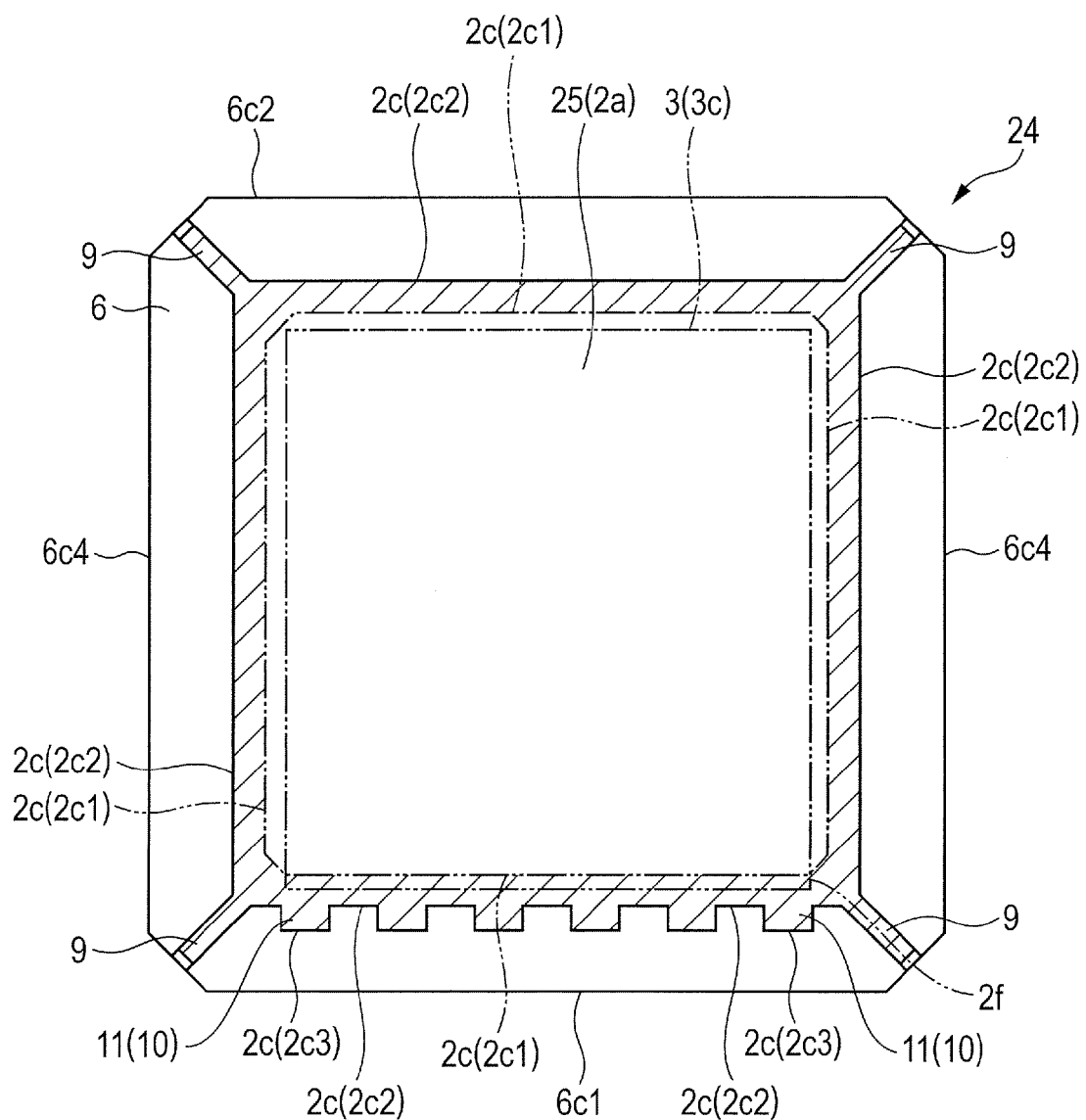
FIG. 14 shows a modification of the semiconductor device of FIG. 11, which is a plan view showing a positional relationship between the thinner region of the chip mounting portion of a semiconductor device and a semiconductor chip.
Figure 15:
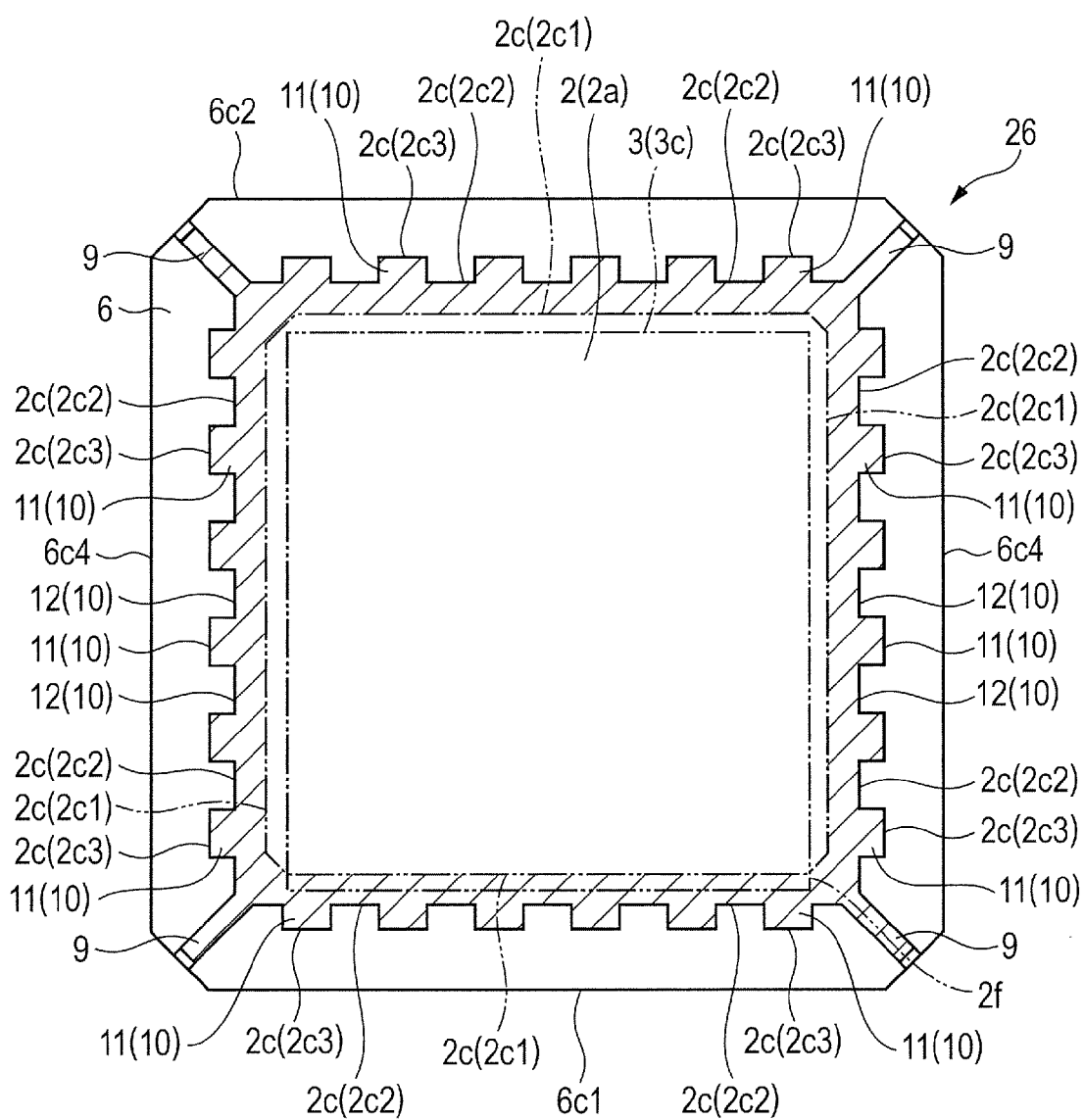
FIG. 15 shows a modification of the semiconductor device of FIG. 14, which is a plan view showing a positional relationship between the thinner region of the chip mounting portion of a semiconductor device and a semiconductor chip.

Next, a description will be given to preferred forms of implementation of the present embodiment, while giving a description to modifications of the semiconductor device shown in FIGS. 1 to 5 and FIGS. 11 to 13. FIG. 14 shows a modification of the semiconductor device of FIG. 11, which is a plan view showing a positional relationship between the thinner region of the chip mounting portion of a semiconductor device and a semiconductor chip. FIG. 15 shows a modification of the semiconductor device of FIG. 14, which is a plan view showing a positional relationship between the thinner region of the chip mounting portion of a semiconductor device and a semiconductor chip. Note that a semiconductor device 24 shown in FIG. 14 is the same as the semiconductor device 1 shown in FIG. 11 except that the two-dimensional size of the semiconductor chip 3 and the placement thereof over the top surface 2a of the tab 2 are different, and the shape of the thinner region 10 of a tab 25 is different. Also, a semiconductor device 26 shown in FIG. 15 is the same as the semiconductor device 1 shown in FIG. 11 except that the two-dimensional size of the semiconductor chip 3 and the placement thereof over the top surface 2a of the tab 2 are different.

According to the study conducted by the present inventors, a crack CLK as shown in FIG. 8 occurs along the side along which the semiconductor chip 3 and the adhesive material 7 overlap the thinner region 10 in planar view. Therefore, when the semiconductor chip 3 having a quadrilateral plan view shape is mounted such that only one of the four sides thereof overlaps the thinner region 10 as in the semiconductor device 24 shown in FIG. 14, if anti-crack measures are implemented on the side overlapping the semiconductor chip 3, the occurrence of a crack can be inhibited. That is, as shown in FIG. 14, when the semiconductor chip 3 overlaps the thinner region 10 only along the one (opposing side) of the four sides of the tab 25 extending along the side 6c1 of the sealing body 6, only the side overlapping the semiconductor chip 3 may be provided with the protruding portions 11 (recessed portions 12). On the other hand, the sides (sides along the sides 6c2, 6c3, and 6c4 of the sealing body 6) along which the semiconductor chip 3 does not overlap the thinner region 10 are not provided with the protruding portions 11 and the recessed portions 12. However, since the tab 25 is formed integrally, a stress produced along the side opposing the side 6c1 may possibly be transmitted to another side. Accordingly, in terms of more reliably inhibiting the occurrence of the crack, as in the semiconductor device 26 shown in FIG. 15, it is preferable to provide the thinner region 10 with the protruding portions 11 and the recessed portions 12 even along the sides (sides along the sides 6c2, 6c3, and 6c4 of the sealing body 6) along which the semiconductor chip 3 does not overlap the thinner region 10.

The number of the protruding portions 11 along each of the sides is not limited to that in the form of implementation shown in FIG. 11. For example, it is possible to provide a structure in which each of the sides is provided with one protruding portion 11, though not shown. However, since the stress produced in the tab 2 is concentrated on the protruding portion 11, in terms of inhibiting the stress from being concentrated on a specified protruding portion and distributing the stress, it is preferable to provide the plurality of protruding portions 11 along each of the sides, as shown in FIG. 11. In other words, as shown in FIG. 11, it is preferable to alternately arrange the plurality of portions 2c2 and the plurality of portions 2c3 along each of the sides (opposing sides) along the sides 6c1, 6c2, 6c3, and 6c4 of the sealing body 6. By thus providing the plurality of protruding portions 11, it is possible to reduce the stress transmitted to each of the protruding portions.

Figure 16:
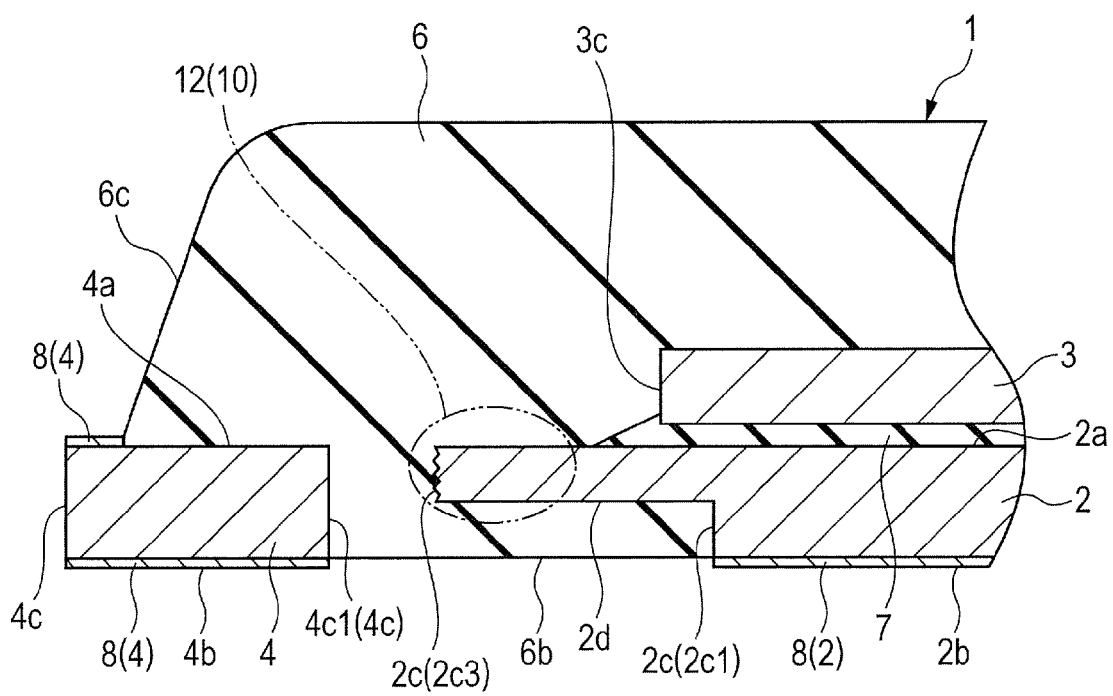
FIG. 16 shows a modification of the semiconductor device of FIG. 13, which is an enlarged cross-sectional view of the periphery of the thinner region of a semiconductor device.

In addition, according to the study conducted by the present inventors, by improving the adhesion at the contact interface between the tab 2 and the sealing body 6 in the vicinity of the position on which the stress is concentrated, it is possible to inhibit the sealing body 6 from peeling from the thinner region of the tab 2, and further inhibit the occurrence of the crack CLK shown in FIG. 8. Therefore, as shown in FIG. 16, it is preferable to perform a surface roughening treatment on the portion (side surface) 2c3 and reduce the planarity thereof to a level lower than that of, e.g., each of the side surfaces 4c (inner side surfaces 4c) of the leads 4. FIG. 16 shows a modification of the semiconductor device of FIG. 13, which is an enlarged cross-sectional view of the periphery of the thinner region of the semiconductor device. As a result, the adhesion between the sealing body 6 and the tab 2 improves in the vicinity of the place on which the stress is concentrated. Therefore, it is possible to more reliably inhibit the occurrence of the crack CLK shown in FIG. 8.

Figure 17:
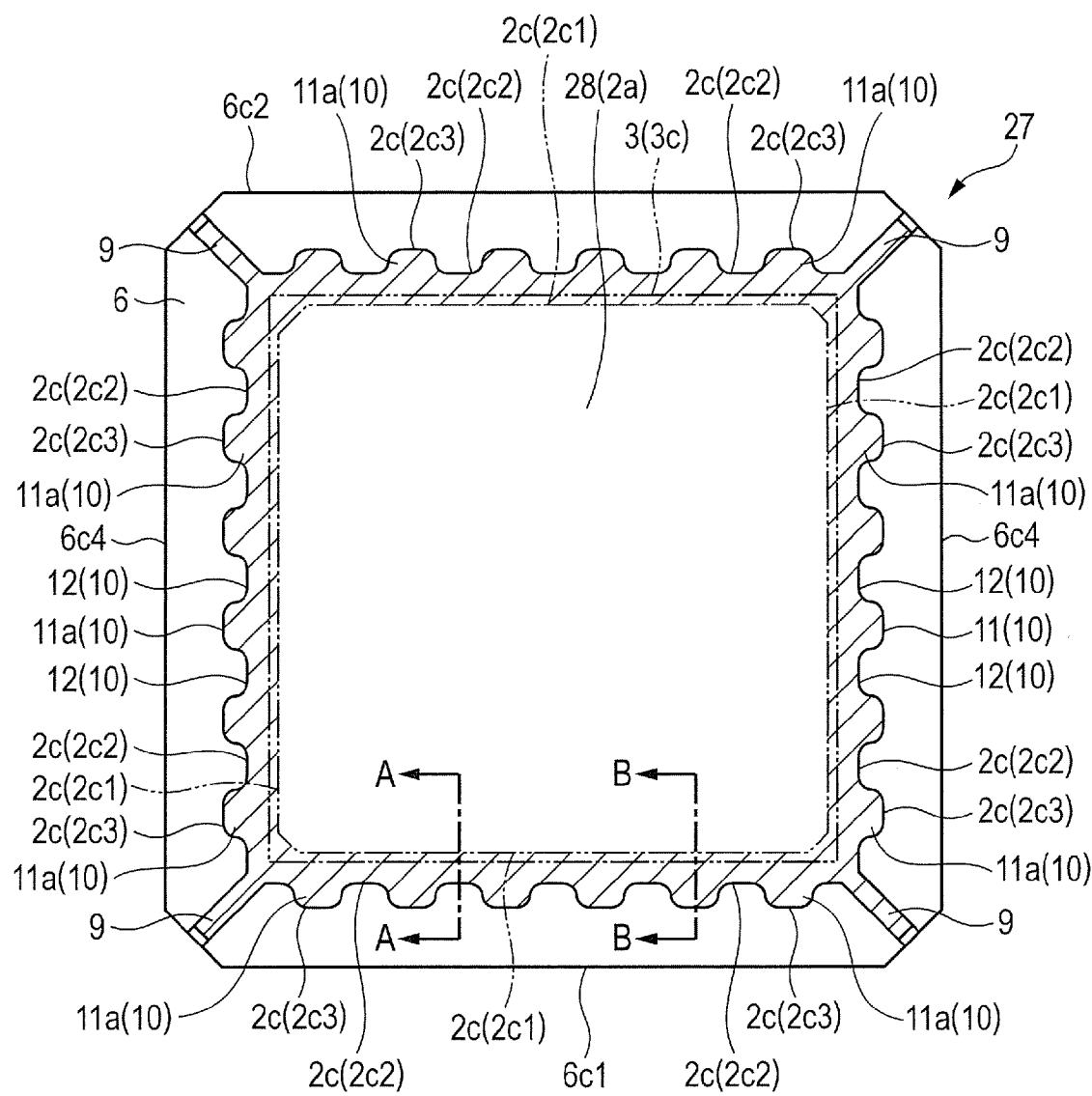
FIG. 17 shows another modification of the semiconductor device of FIG. 11, which is a plan view showing a positional relationship between the thinner region of the chip mounting portion of a semiconductor device and a semiconductor chip.

Using FIGS. 11, 14, and 15, the description has been given to the forms of implementation in each of which the protruding portions 11 each having a rectangular plan view shape are provided. However, the two-dimensional shape of each of the protruding portions 11 is appropriate as long as the stress produced due to the temperature cycle load can be reduced, and is not limited to a rectangle. For example, as in a tab 28 of a semiconductor device 27 shown in FIG. 17, it is also possible to use a configuration provided with protruding portions 11a having a wavy plan view shape. FIG. 17 shows another modification of the semiconductor device of FIG. 11, which is a plan view showing a positional relationship between the thinner region of the chip mounting portion of the semiconductor device and a semiconductor chip. In the semiconductor device 27 shown in FIG. 17, by providing the tab 28 with the plurality of protruding portions 11a having the wavy two-dimensional shape, it is possible to inhibit local concentration of the stress.

<Method of Manufacturing Semiconductor Device>

Figure 18:
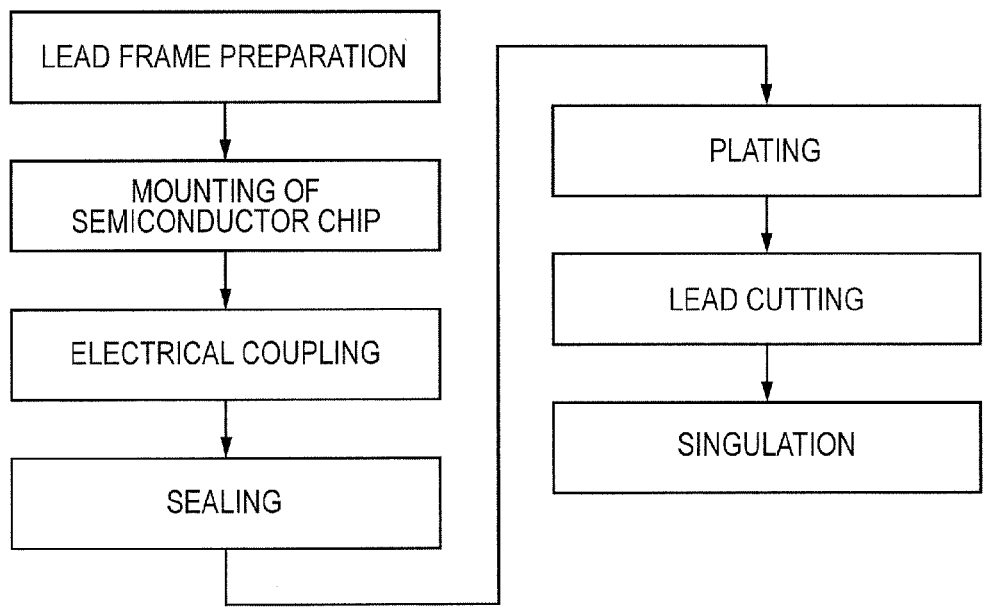
FIG. 18 is an illustrative view showing the flow of assembly of the semiconductor device as the embodiment of the present invention.

Next, a description will be given to the manufacturing steps of the semiconductor device 1 described using FIGS. 1 to 16 along the process step flow shown in FIG. 18. FIG. 18 is an illustrative view showing the flow of assembly of the semiconductor device of the present embodiment.

1. Lead Frame Preparing Step

Figure 19:
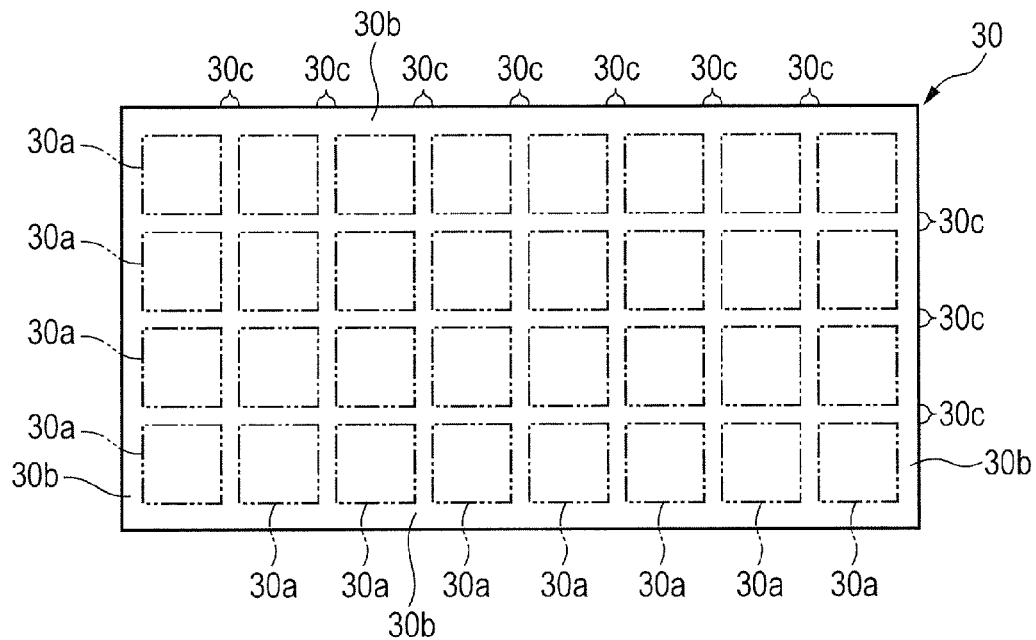
FIG. 19 is a plan view showing the overall structure of a wiring substrate prepared in the substrate preparing step shown in FIG. 18.
Figure 20:
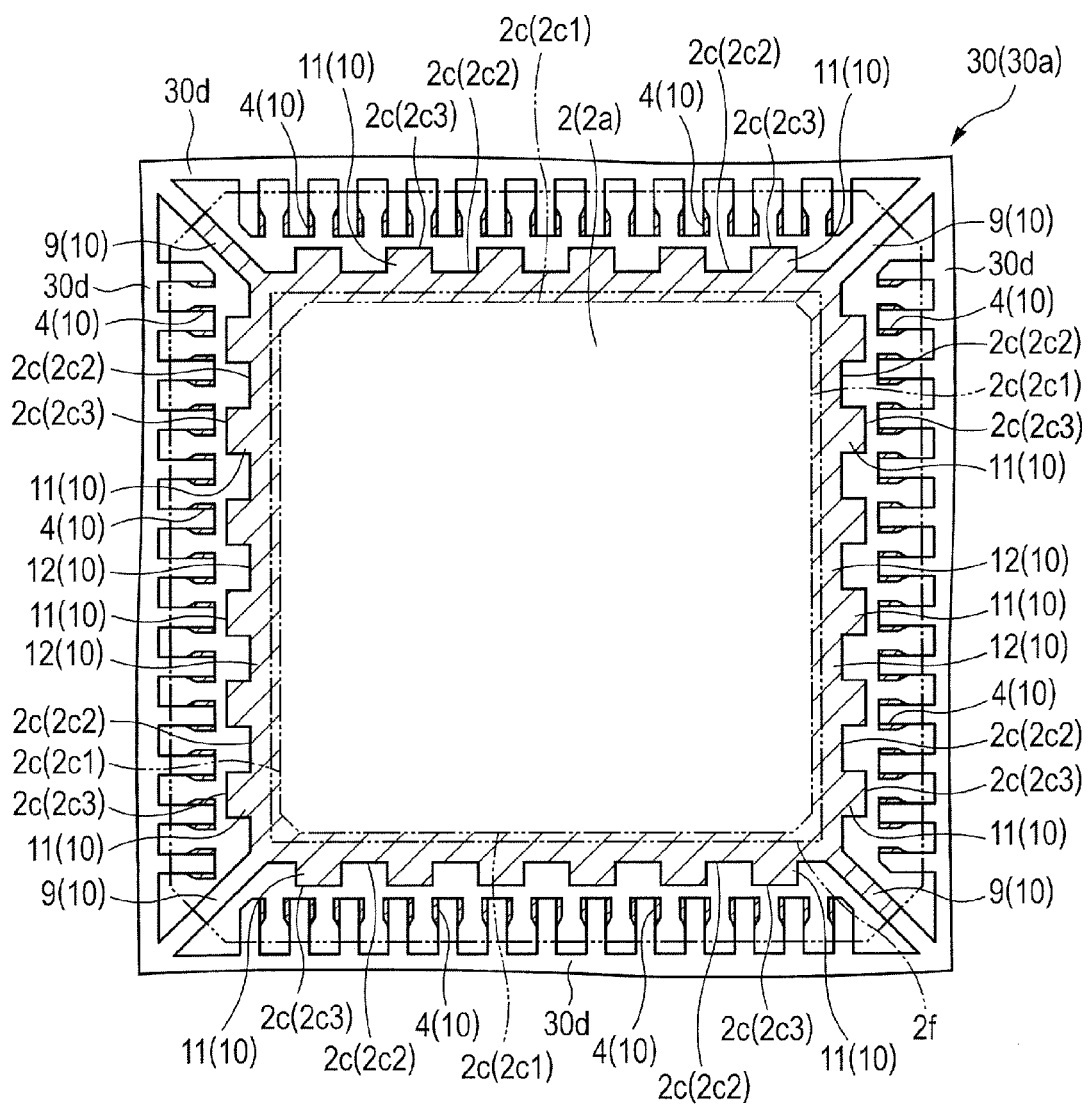
FIG. 20 is an enlarged plan view showing one of the product formation regions of FIG. 19 under magnification.

FIG. 19 is a plan view showing the overall structure of a wiring substrate prepared in the substrate preparing step shown in FIG. 18. FIG. 20 is an enlarged plan view showing one of the product formation regions of FIG. 19 under magnification. In the substrate preparing step shown in FIG. 18, the wiring substrate shown in FIGS. 19 and 20 is prepared first.

As shown in FIG. 19, a lead frame 30 prepared in the present step includes a plurality of product formation regions 30a within a frame portion (frame body) 30b. Specifically, the plurality of product formation regions 30a are arranged in a matrix configuration. Each of the plurality of product formation regions 30a corresponds to one semiconductor device 1 shown in FIG. 5. Between the individual product formation regions 30a, cut regions (cut lines) 30c serving as places where cutting is performed in the singulation step shown in FIG. 18 are disposed. By thus using the lead frame 30 including the plurality of product formation regions 30a, it is possible to simultaneously manufacture a plurality of the semiconductor devices 1, and therefore improve manufacturing efficiency.

As shown in FIG. 20, each of the product formation regions 30a of the lead frame 30 prepared in the present step is already formed with the tab 2, the plurality of leads 4 disposed around the tab 2, and the plurality of suspension leads 9 for supporting the tab 2 which are provided in the semiconductor device 1. The plurality of leads 4 are coupled to a dam portion 30d, and formed integrally via the dam portion 30d. The plurality of suspension leads 9 are each coupled to the dam portion 30d. Accordingly, the tab 2 is coupled to the dam portion 30d via the suspension leads 9, and thereby supported by the lead frame 30. The tab 2 is already formed with the thinner region 10 shown by hatching in FIG. 20. The thinner region 10 is not only formed in the tab 2, but also in each of the plurality of leads 4 and the plurality of suspension leads 9. The thinner region 10 of the tab 2 overlaps a chip mounting region 2f as a region for mounting thereover the semiconductor chip 3 (see FIG. 5) in planar view. The thinner region 10 of the tab 2 is already formed with the protruding portions 11 and the recessed portions 12 each described using FIGS. 11 to 13. In other words, each of the side surfaces 2c of the tab 2 has the portion (side surface) 2c1 continued to the bottom surface 2b of the tab 2, and the portion (side surface) 2c2 located outwardly of the portion 2c1 (closer to the leads 4 in planar view) and continued to the top surface 2a of the tab 2. The side surface 2c is also formed with the portion (side surface) 2c3 located outwardly of the portion (side surface) 2c2 and continued to the top surface 2a of the tab 2 to face the same direction as each of the portions (side surfaces) 2c1 and 2c2.

The height of the portion 2c2 is shorter than the distance from the top surface 2a of the tab 2 to the bottom surface 2b thereof. In the present embodiment, the height of the portion 2c3 is shorter than the distance from the top surface 2a of the tab 2 to the bottom surface 2b thereof.

By thus forming the thinner region 10, the protruding portions 11, and the recessed portions 12 in advance in the state of the lead frame 30, easy processing can be performed. For example, when the shapes of the tab 2, the plurality of leads 4, and the plurality of suspension leads 9 of the lead frame 30 are formed by etching, by appropriately using a so-called half-etching method in which the peripheral edge portion of the tab 2 is halfway etched from the bottom surface side of the lead frame, it is possible to form the thinner region 10, the protruding portions 11, and the recessed portions 12. Alternatively, when the shapes of the tab 2, the plurality of leads 4, and the plurality of suspension leads 9 of the lead frame 30 are formed by press working using a cutting mold die (not shown), by appropriately using a press method in which the mold die is pressed against the peripheral edge portion of the tab 2 from the bottom surface side of the lead frame to halfway crush the peripheral edge portion, it is possible to form the thinner region 10, the protruding portions 11, and the recessed portions 12.

2. Semiconductor Chip Mounting Step

Figure 21:
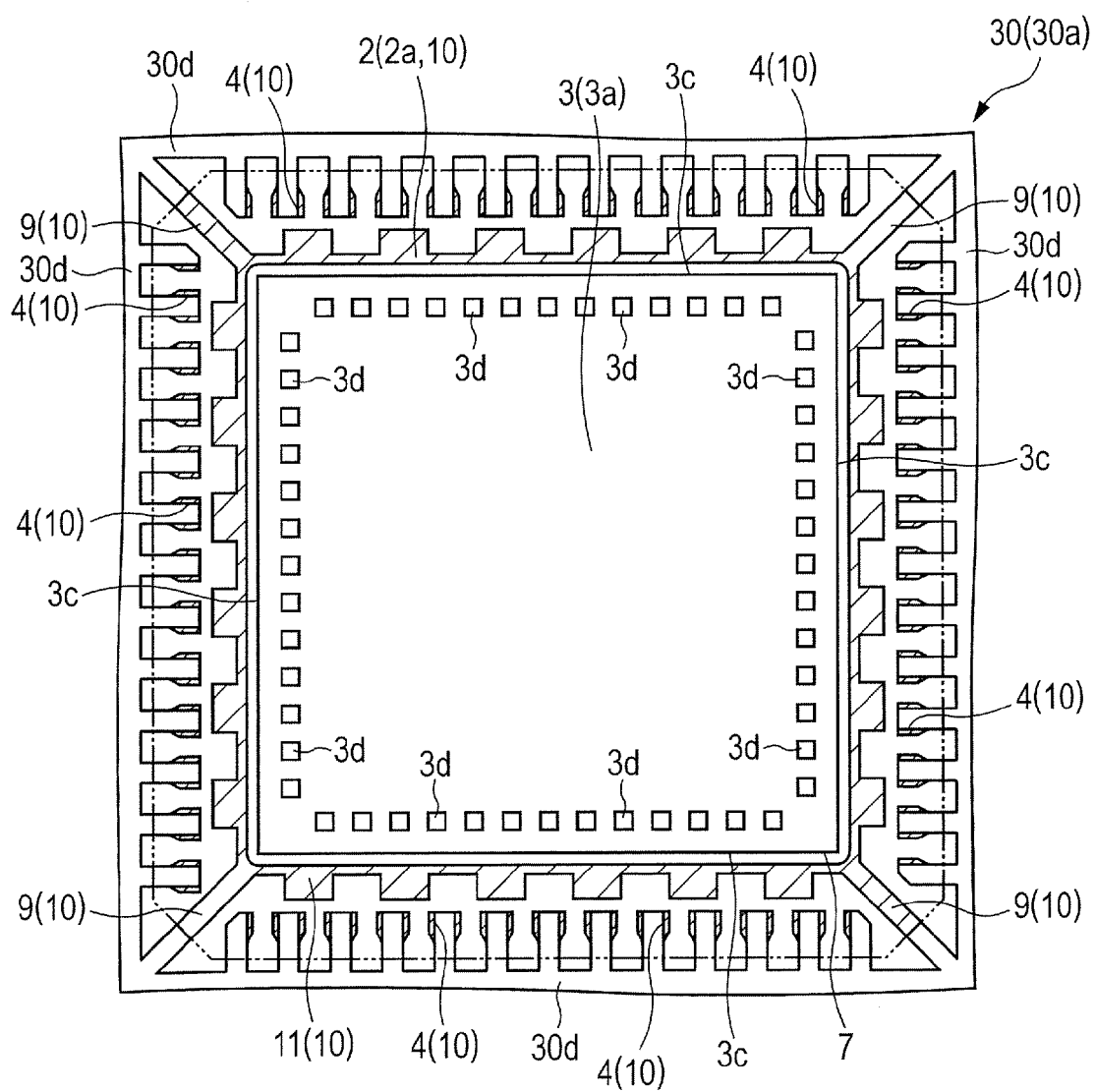
FIG. 21 is an enlarged plan view showing a state where a semiconductor chip is mounted over the chip mounting portion shown in FIG. 20 via an adhesive material.

FIG. 21 is an enlarged plan view showing a state where the semiconductor chip is mounted over the chip mounting portion shown in FIG. 20 via adhesive material. Next, in the semiconductor chip mounting step shown in FIG. 18, as shown in FIG. 21, the semiconductor chip 3 is mounted over the tab in each of the product formation regions 30a. In the present embodiment, via the adhesive material 7 which is, e.g., an epoxy-based thermosetting resin or a thermosetting resin in which silver (Ag) particles are mixed, the semiconductor chip 3 is mounted. As a mounting method, e.g., a so-called face-up mounting method is used in which the semiconductor chip 3 is mounted with the back surface 3b (see FIG. 3) thereof opposing the top surface 2a of the tab 2. When the semiconductor chip 3 is mounted via the paste-like adhesive material having a paste-like property before hardened, the paste like adhesive material 7 is placed on (applied to) the top surface of the chip mounting region 2f (see FIG. 20) of the tab 2. Subsequently, the semiconductor chip 3 is prepared and, when the back surface 3b (see FIG. 3) is pressed against the tab 2, the adhesive material 7 wet-spreads to the periphery. A part of the adhesive material 7 which has spread to the outside of the side surfaces 3c of the semiconductor chip 3 also wet-spreads over to the side surfaces of the semiconductor chip 3 so that a fillet shape as shown in FIG. 3 is formed. When the adhesive material 7s in this state is heated and the resin component thereof is hardened, the semiconductor chip 3 is adhesively fixed onto the tab 2.

3. Electrical Coupling Step

Figure 22:
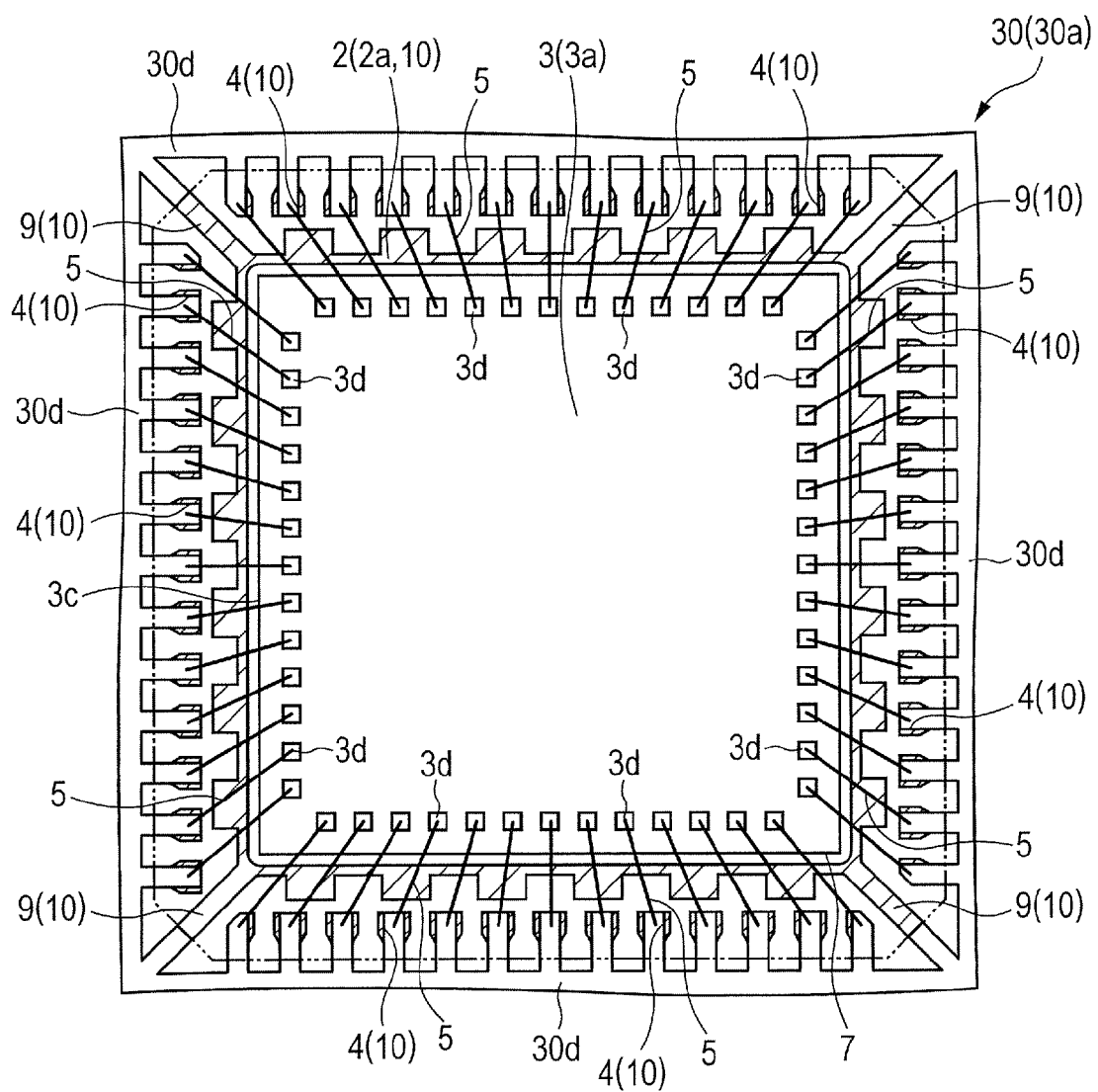
FIG. 22 is an enlarged plan view showing a state where a plurality of pads and a plurality of leads of the semiconductor chip shown in FIG. 21 are electrically coupled to each other via a plurality of wires.

FIG. 22 is an enlarged plan view showing a state where the plurality of pads and the plurality of leads of the semiconductor chip shown in FIG. 21 are electrically coupled to each other via a plurality of wires. Next, in the electrical coupling step shown in FIG. 18, as shown in FIG. 22, the plurality of pads 3d of the semiconductor chip 3 are electrically coupled to the plurality of respective leads 4 disposed around the semiconductor chip 3 via the plurality of wires (conductive materials) 5. In the present step, for example, a heat stage (not shown) is prepared and, over the tab 2 in each of the product formation regions 30a, the lead frame 30 having the semiconductor chip 3 mounted thereover is placed over the heat stage. Then, by a so-called nail head bonding method in which, e.g., the wires 5 are supplied via capillary (not shown) and bonded using an ultrasonic wave and thermocompression in combination, the wires 5 are coupled.

4. Sealing Step

Figure 23:
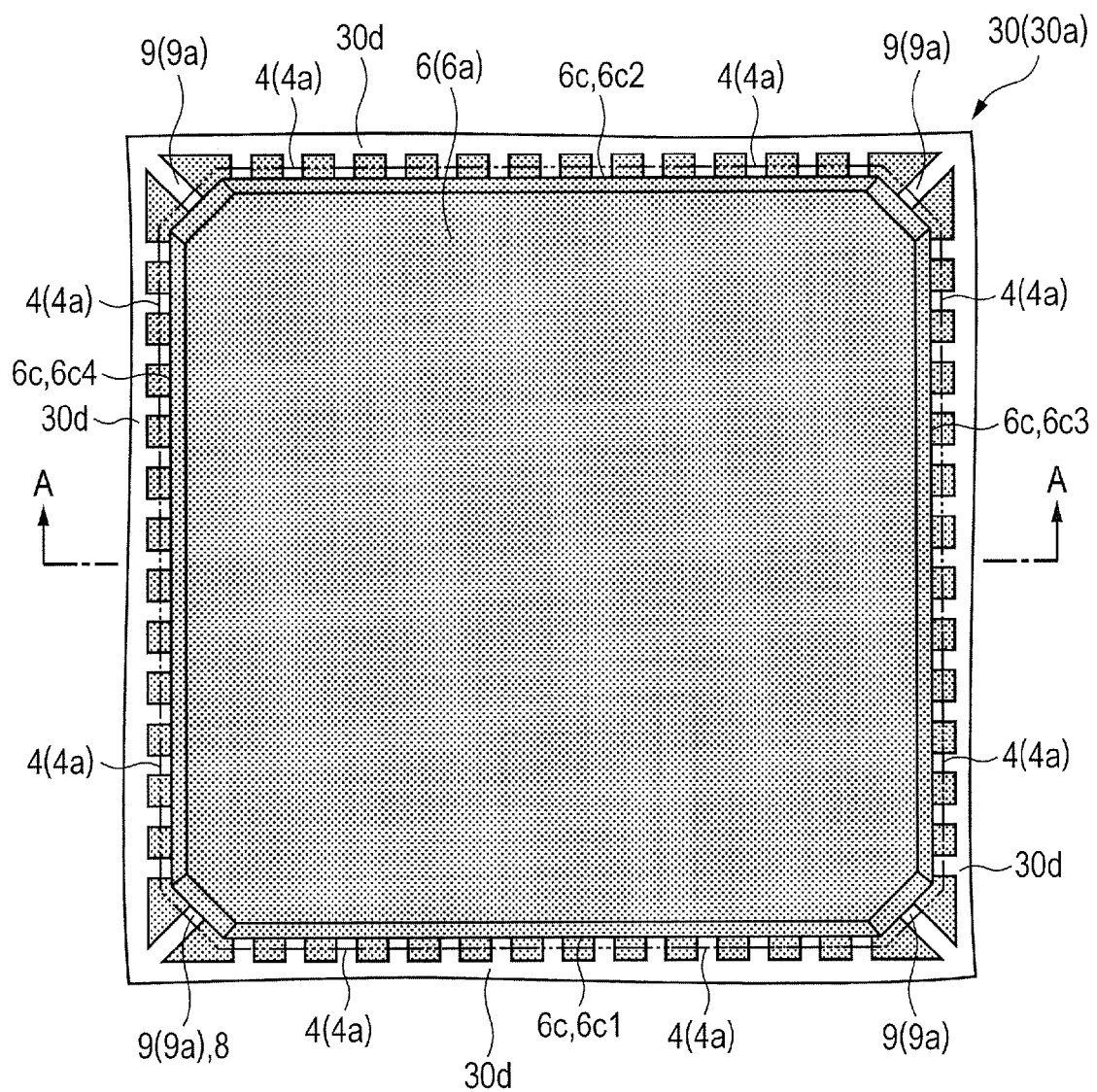
FIG. 23 is an enlarged plan view showing a state where a sealing body is formed in which the semiconductor chip, the plurality of wires, and the plurality of leads each shown in FIG. 22 are sealed.
Figure 24:
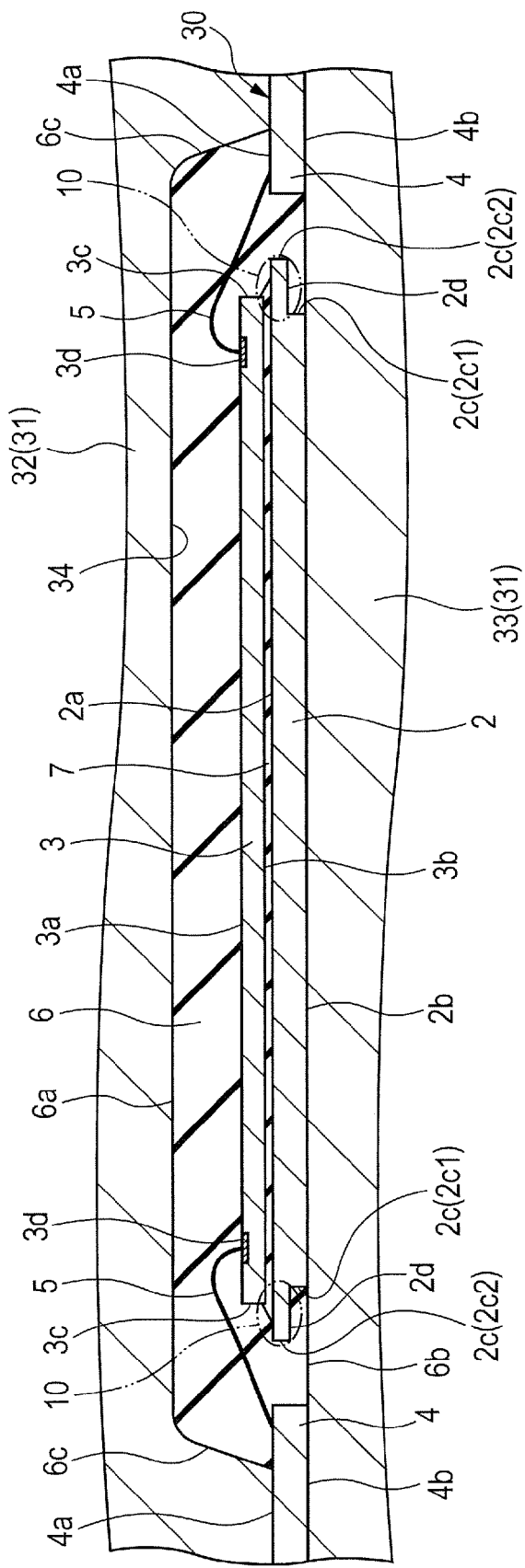
FIG. 24 is an enlarged cross-sectional view along the line A-A of FIG. 23.

FIG. 23 is an enlarged plan view showing a state where the sealing body is formed in which the semiconductor chip, the plurality of wires, and the plurality of leads each shown in FIG. 22 are sealed. FIG. 24 is an enlarged cross-sectional view along the line A-A of FIG. 23. Next, in the sealing step shown in FIG. 18, as shown in FIG. 24, the sealing body 6 is formed in each of the product formation regions. The semiconductor chip 3, parts of the tab 2 (top surface 2a and the thinner region 10), the plurality of wires 5, and parts (inner lead portions) of the plurality of leads 4 are sealed in the sealing body. In the present step, by using, e.g., a mold die 31 including an upper die (first mold die) 32 and a lower die (second mold die) 33 and a so-called transfer mold method, the sealing body 6 is formed. Specifically, the lead frame 30 is placed such that, e.g., the tab 2 and parts (inner lead portions) of the plurality of leads disposed around the tab 2 are positioned in a cavity 34 formed in the upper die 32 to be clamped with (sandwiched between) the upper die 32 and the lower die 33. In this state, a softened (plasticized) thermosetting resin (sealing resin) is introduced under pressure into the cavity of the mold die to be supplied into the space formed by the cavity 34 and the lower die 33 and molded. At this time, since the dam portion 30d shown in FIG. 23 dams the sealing resin, it is possible to inhibit the sealing resin from randomly leaking out to the outside of the dam portion 30d. Then, the sealing resin is heated to be hardened to form the sealing body 6 shown in FIGS. 23 and 24. In the transfer mold method, the sealing resin is supplied under pressure into the cavity 34, and therefore the thinner region 10 can be reliably sealed. As a result, it is possible to prevent or inhibit the tab 2, the plurality of leads 4, or the suspension leads 9 (see FIG. 23) from falling out of the sealing body 6.

5. Plating Step

Next, in the plating step shown in FIG. 18, e.g., the lead frame 30 shown in FIG. 23 is dipped in a plating solution not shown so that the conductor films (plating films) 8 (see FIGS. 1 to 4) are formed over the surfaces of metal portions exposed from the sealing body 6. In the present embodiment, e.g., the lead frame 30 is dipped in a solder solution so that the conductor films 8 as solder films are formed by an electroplating method. Examples of the types of the solder film that can be used include tin-lead plating, pure-tin plating as Pb-free plating, and tin-bismuth plating.

Note that it may also be possible to use a pre-plated lead frame in which a conductor film is formed in advance. At this time, the conductor film is formed in most cases of, e.g., a nickel film, a palladium film formed over the nickel film, and a gold film formed over the palladium film. When the pre-plated lead frame is used, the present plating step is omitted.

6. Lead Cutting Step and Singulation Step

Next, in the lead cutting step shown in FIG. 18, the plurality of leads 4 of the lead frame 30 shown in FIG. 22 are cut inwardly of the dam portion 30d to be separated from each other, as shown in FIG. 1. In the singulation step shown in FIG. 18, the plurality of suspension leads 9 of the lead frame 30 shown in FIG. 22 are cut inwardly of the dam portion to be separated from the dam portion 30d. In this manner, the singulated semiconductor device 1 can be obtained, as shown in FIG. 1. A singulation method is not particularly limited, and a method which performs cutting by press working using a cutting mold die, a method which performs cutting using a rotary blade called a dicing blade, or the like can be used appropriately.

By each of the foregoing steps, the semiconductor device 1 described using FIGS. 1 to 16 is obtained. Thereafter, necessary inspections and tests such as an outer appearance inspection and an electrical test are performed on the semiconductor device 1, which is shipped or mounted over a mounting substrate not shown.

(Second Embodiment)

In the foregoing first embodiment, for easy understanding of the problems found by the present inventors and the solutions thereto, the description has been given to the example in which one semiconductor chip is mounted over one chip mounting portion. However, each of the number of chip mounting portions and the number of semiconductor chips is not limited to one. In particular, in the case of a semiconductor device including a plurality of chip mounting portions independent of each other in one package, the direction of deformation when a temperature cycle load is given to the semiconductor device is complicated so that a crack is likely to occur. Accordingly, in the present embodiment, a power semiconductor device incorporated in a power conversion device such as a DC-DC converter to function as a switching device will be described as an example of the semiconductor device including the plurality of chip mounting portions independent of each other in the one package. Note that, in the present embodiment, a repeated description of items common to those of the semiconductor device 1 described in the foregoing first embodiment is omitted in principle, and the description will be given mainly to the difference between the power semiconductor and the semiconductor device 1.

<Circuit Configuration>

Figure 25:
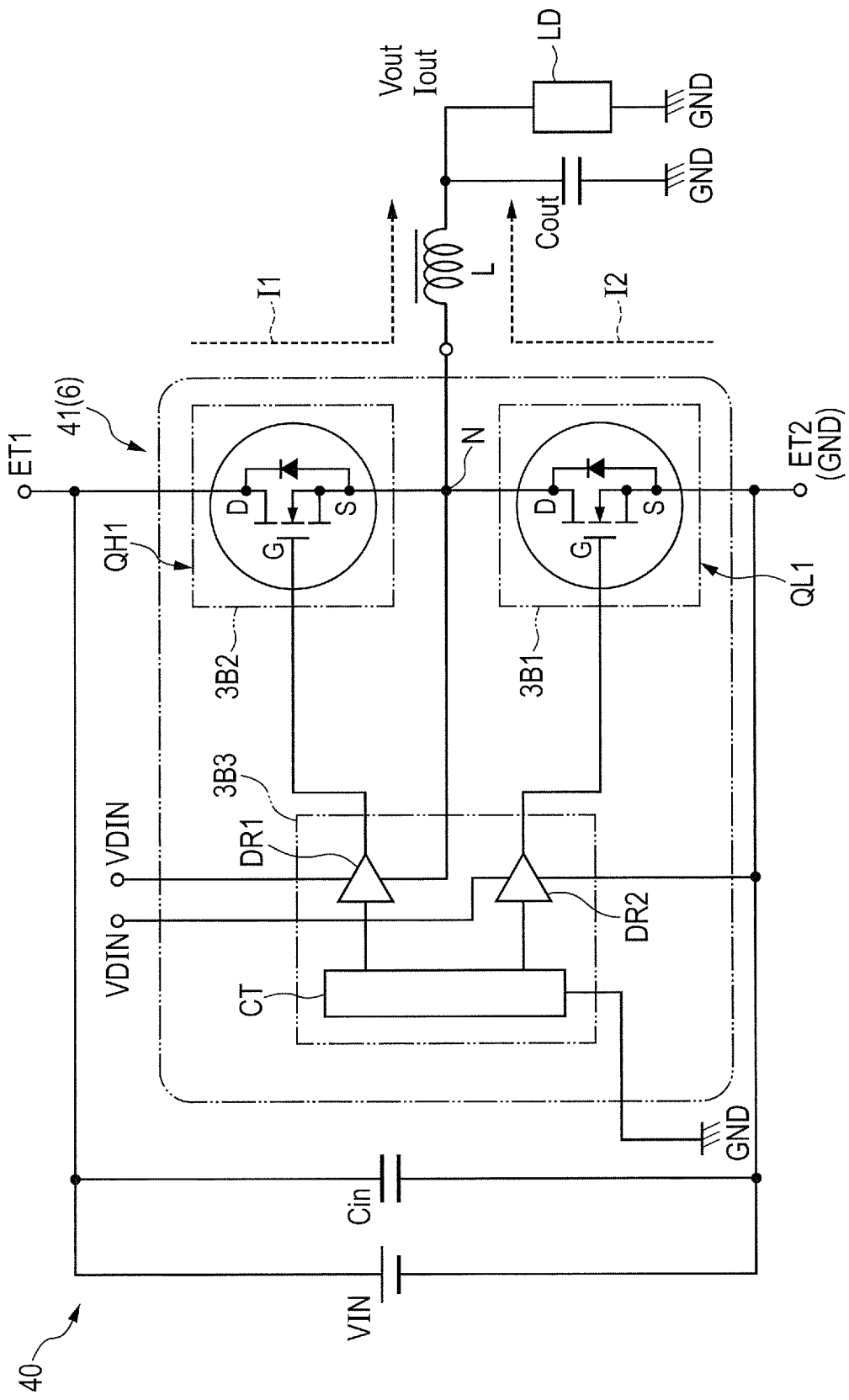
FIG. 25 is a circuit diagram of an example of a non-insulated-type DC-DC converter having a semiconductor device as another embodiment of the present invention.

FIG. 25 is a circuit diagram of an example of a non-insulated-type DC-DC converter having the semiconductor device of the present embodiment. A non-insulated-type DC-DC converter 40 is used in a power source circuit for electronic equipment such as, e.g., a desk-top personal computer, a note-type personal computer, a server, or a game machine, and has a semiconductor device 41, an input capacitor Cin, an output capacitor Cout, and a coil L. Note that the marks VIN, GND, Iout, and Vout denote an input power source, a reference potential (e.g., 0 V at a ground potential), an output current, and an output voltage, respectively. The semiconductor device 41, has two driver circuits DR1 and DR2, a control circuit CT for transmitting respective control signals to the driver circuits DR1 and DR2, and two power MOSFETs (Metal Oxide Semiconductor Field Effect Transistors each hereinafter simply referred to as a power MOSFET or power transistor) QH1 and QL1. The driver circuits DR1 and DR2, the control circuit CT, and the power MOSFETs QH1 and QL1 are sealed (contained) in the same sealing body (package) 6.

The control circuit CT is a circuit for controlling the operations of the power MOSFETs QH1 and QL1, and is formed of, e.g., a PWM (Pulse Width Modulation) circuit. The PWM circuit compares an instruction signal to the amplitude of a triangular wave to output a PWM signal (control signal). Based on the PWM signal, the output voltage (i.e., the width of voltage switch-ON (ON time)) of each of the power MOSFETs QH1 and QL1 (i.e., the non-insulated-type DC-DC converter 40) is controlled.

The output of the control circuit CT is electrically coupled to the input of each of the driver circuits DR1 and DR2 via a wiring line formed in a semiconductor chip 3B3. The respective outputs of the driver circuits DR1 and DR2 are electrically coupled to the gate terminal of the power MOSFET QH1 and to the gate terminal of the power MOSFET QL1. The driver circuits DR1 and DR2 respond to Pulse Width Modulation (PWM) signals supplied from the control circuit CT to control potentials at the respective gate terminals, of the power MOSFETs QH1 and QL1, and control the operations of the power MOSFETs QH1 and QL1. The output of the driver circuit DR1 is electrically coupled to the gate terminal of the power MOSFET QH1. On the other hand, the output of the driver circuit DR2 is electrically coupled to the gate terminal of the power MOSFET QL1. The control circuit CT and the two driver circuits DR1 and DR2 are formed in the same semiconductor chip 3B3. Note that the mark VDIN denotes the input power sources or the driver circuits DR1 and DR2.

The power MOSFETs QH1 and QL1, which are the power transistors, are coupled in series between a terminal (first power source terminal) ET1 for supplying a high potential (first power source potential) of the input power source VIN and a terminal (second power source terminal) ET2 for supplying the reference potential (second power source potential) GND. That is, the power MOSFET QH1 has a source-drain path thereof coupled in series between the terminal ET1 for supplying the high potential of the input power source VIN and an output node (output terminal) N, while the power MOSFET QL1 has a source-drain path thereof coupled in series between the output node N and the terminal ET2 for supplying the reference potential GND. Note that, in FIG. 25, parasitic diodes (internal diodes) are shown in the power MOSFETs QH1 and QL1. In addition, the marks D and S denote the drain of each of the power MOSFETs QH1 and QL1 and the source of each of the power MOSFETs QH1 and QL1, respectively.

The power MOSFET (first field effect transistor or power transistor) QH1 is a field effect transistor for high-side switch (high-potential-side or first operating voltage, hereinafter simply referred to as high-side), and has a switching function for storing energy in the foregoing coil L. The coil L is an element for supplying power to the output (input of a load LD) of the non-insulated-type DC-DC converter 40. The high-side power MOSFET QH1 is formed in a semiconductor chip 3B2 different from the foregoing semiconductor chip 3B3. Also, the power MOSFET QH1 is formed of, e.g., an n-channel field effect transistor. Here, the channel of the field effect transistor is formed in the thickness direction of the semiconductor chip 3B2. In this case, compared to a field effect transistor in which the channel is formed along the main surface (surface orthogonal to the thickness direction of the semiconductor chip 3B2) of the semiconductor chip 3B2, the channel width per unit area can be increased to allow a reduction in ON resistance. As a result, it is possible to miniaturize the element, and reduce the size of packaging.

On the other hand, the power MOSFET (second field effect transistor or power transistor) QL1 is a field effect transistor for low-side switch (low-potential-side or second operating voltage, hereinafter simply referred to as low-side), and has the function of reducing the resistance of the transistor in synchronization with a frequency from the control circuit CT and performing rectification. That is, the power MOSFET QL1 is a rectifier transistor in the non-insulated-type DC-DC converter 40.

The low-side power MOSFET QL1 is formed in a semiconductor chip 3B1 different from the foregoing semiconductor chips 3B3 and 3B2. The power MOSFET QL1 is formed of, e.g., an n-channel power MOSFET, and the channel is formed in the thickness of the semiconductor chip 3B1 in the same manner as in the foregoing power MOSFET QH1. The following is the reason for using the power MOSFET in which the channel is formed in the thickness direction of the semiconductor chip 3B1. That is, the ON time (time during which the voltage is applied) of the low-side power MOSFET QL1 is longer than the ON time of the high-side power MOS- FET QH1, and a loss due to the ON resistance seems to be larger than a switching loss in the low-side power MOSFET QL1. Therefore, the use of the field effect transistor in which the channel is formed in the thickness direction of the semiconductor chip 3B1 allows the channel width per unit area to be increased compared to the case of using a field effect transistor in which the channel is formed to extend along the main surface of the semiconductor chip 3B1. That is, by forming the low-side power MOSFET QL1 of the field effect transistor in which the channel is formed in the thickness direction of the semiconductor chip 3B1, the ON-resistance can be reduced. Therefore, even when a current flowing in the non-insulated-type DC-DC converter 40 is increased, voltage conversion efficiency can be improved.

The foregoing input capacitor Cin is a power source which temporarily stores energy (charges) supplied from the input power source VIN, and supplies the stored energy to the main circuit of the non-insulated-type DC-DC converter 40. The input capacitor Cin is electrically coupled in parallel to the input power source VIN. The foregoing output capacitor Cout is electrically coupled between an output wiring line coupling the coil L and the load LD and the terminal for supplying the reference potential GND.

A wiring line coupling the source of the power MOSFET QH1 of the non-insulated-type DC-DC converter 40 and the drain of the power MOSFET QL1 thereof is provided with the foregoing output node N for supplying an output power source potential to the outside. The output node N is electrically coupled to the coil L via the output wiring line, and is further electrically coupled to the load LD via the output wiring line. Examples of the load LD include a hard disc drive HDD, ASIC (Application Specific Integrated Circuit), FPGA (Field Programmable Gate Array), an expansion card (PCI CARD), a memory (such as a DOR memory, a DRAM (Dynamic RAM), or a flash memory), and a CPU (Central Processing Unit).

In such a non-insulated-type DC-DC converter 40, conversion of a power source voltage is performed by alternately turning ON/OFF the power MOSFETs QH1 and QL1 while providing synchronization therebetween. That is, when the high-side power MOSFET QH1 is ON, a current (first current) I1 flows from the terminal ET1 to the output node N through the power MOSFET QH1. On the other hand, when the high-side power MOSFET QH1 is OFF, a current I2 flows due to the counter electromotive voltage of the coil L. By turning ON the low-side power MOSFET QL1 when the current I2 is flowing, a voltage drop can be reduced.

<Structure of Semiconductor Device>

Figure 26:
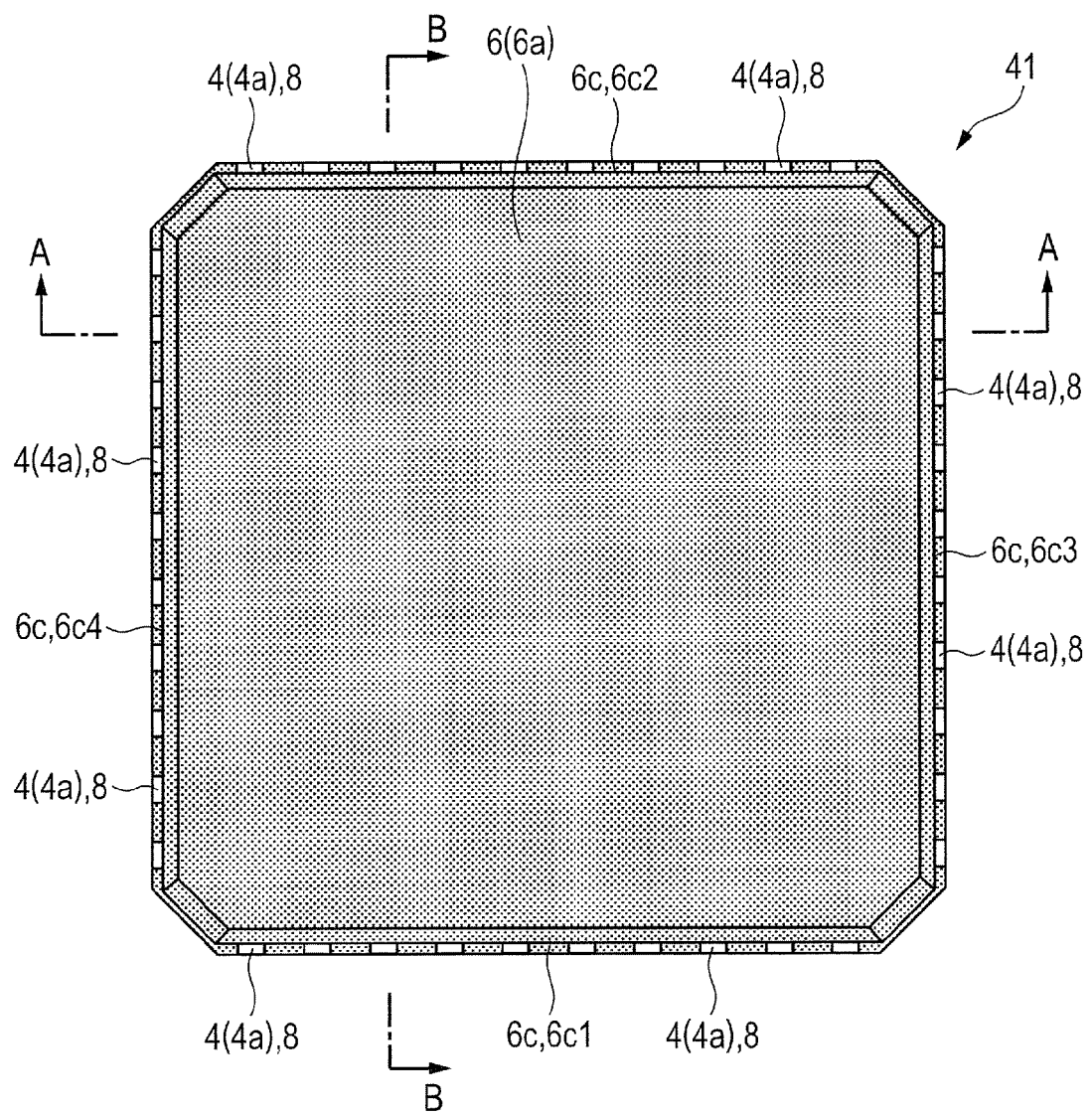
FIG. 26 is a top view of the semiconductor device shown in FIG. 25.
Figure 27:
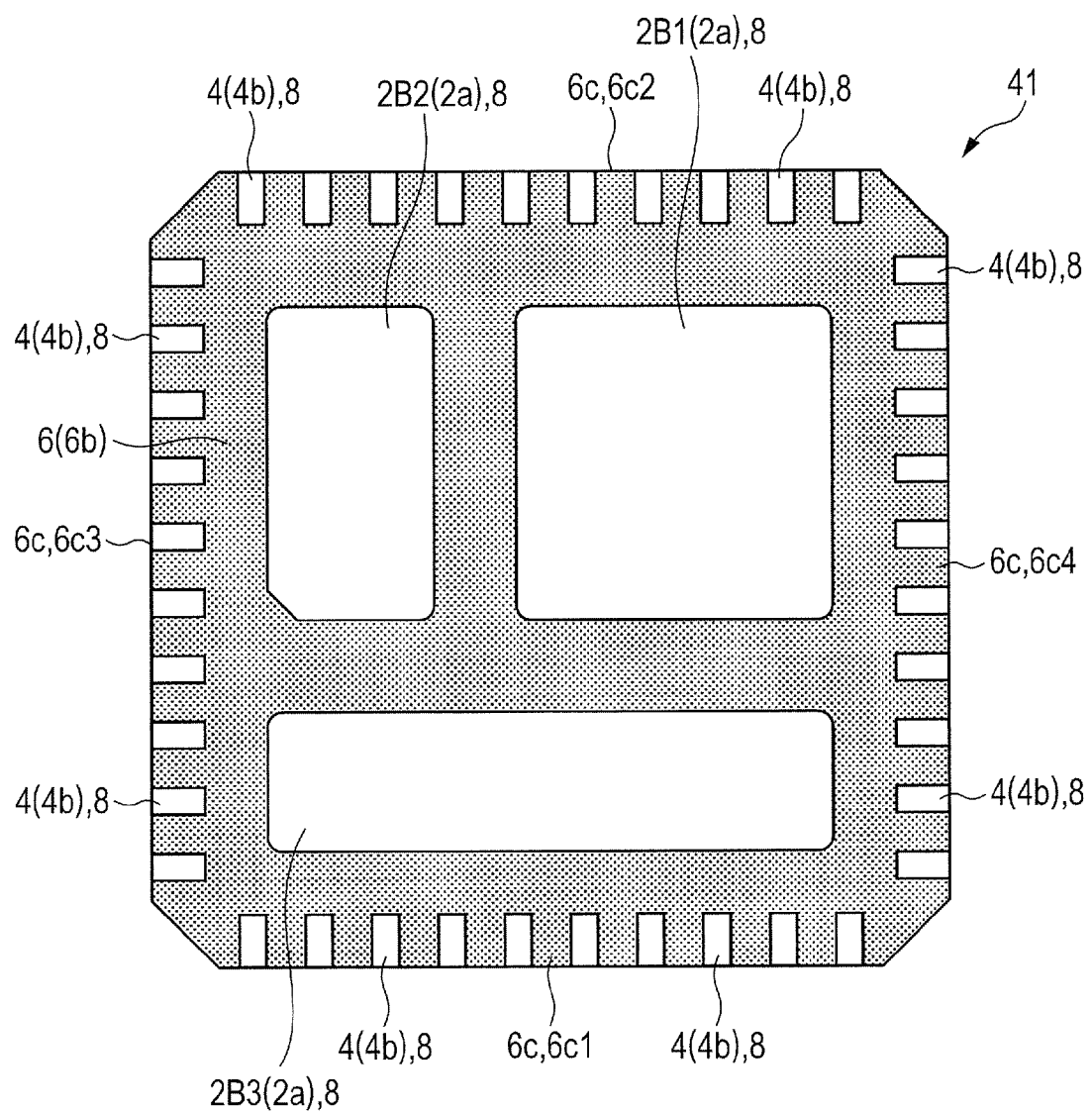
FIG. 27 is a bottom view of the semiconductor device of FIG. 26.
Figure 28:
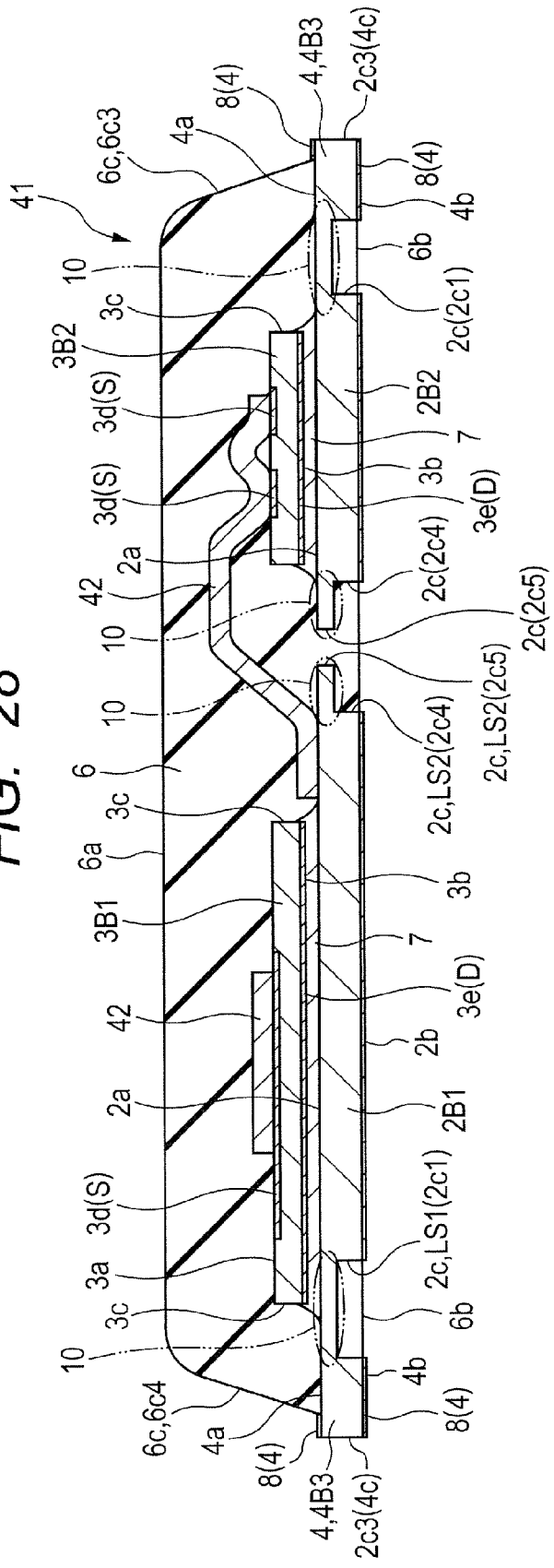
FIG. 28 is a cross-sectional view along the line A-A of FIG. 26.
Figure 29:
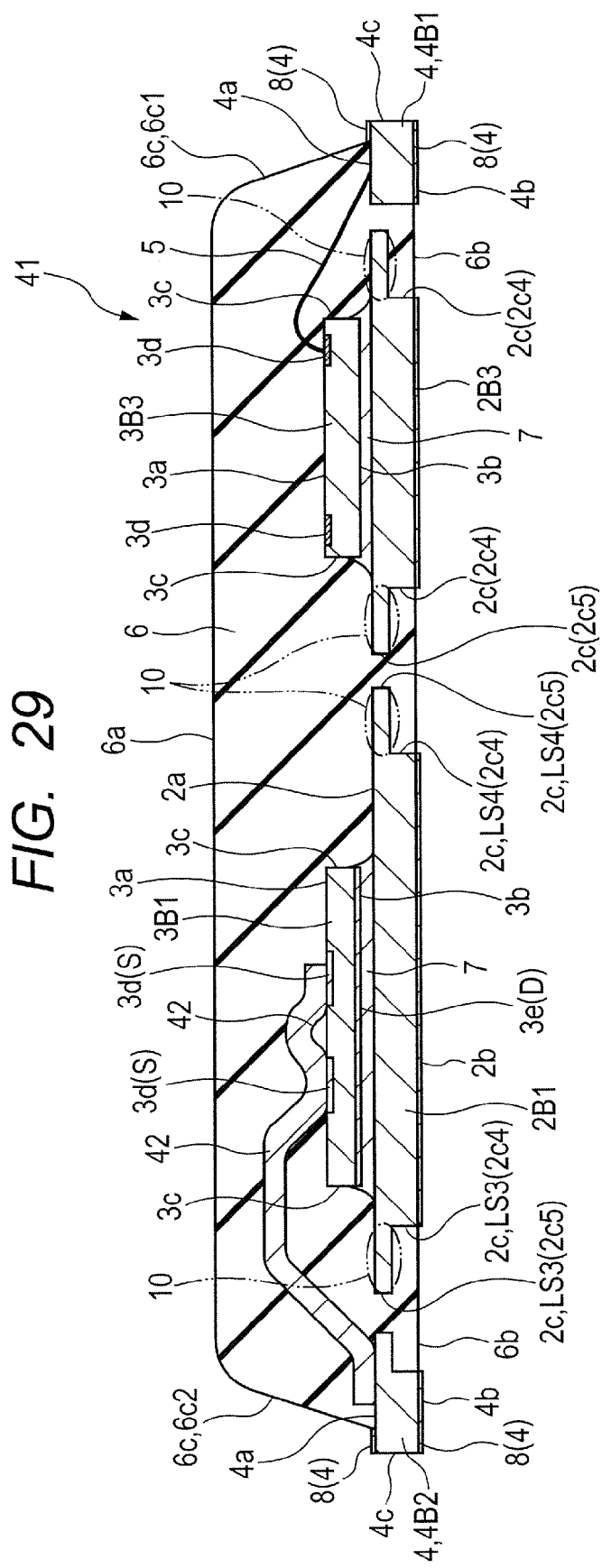
FIG. 29 is a cross-sectional view along the line B-B of FIG. 26.
Figure 30:
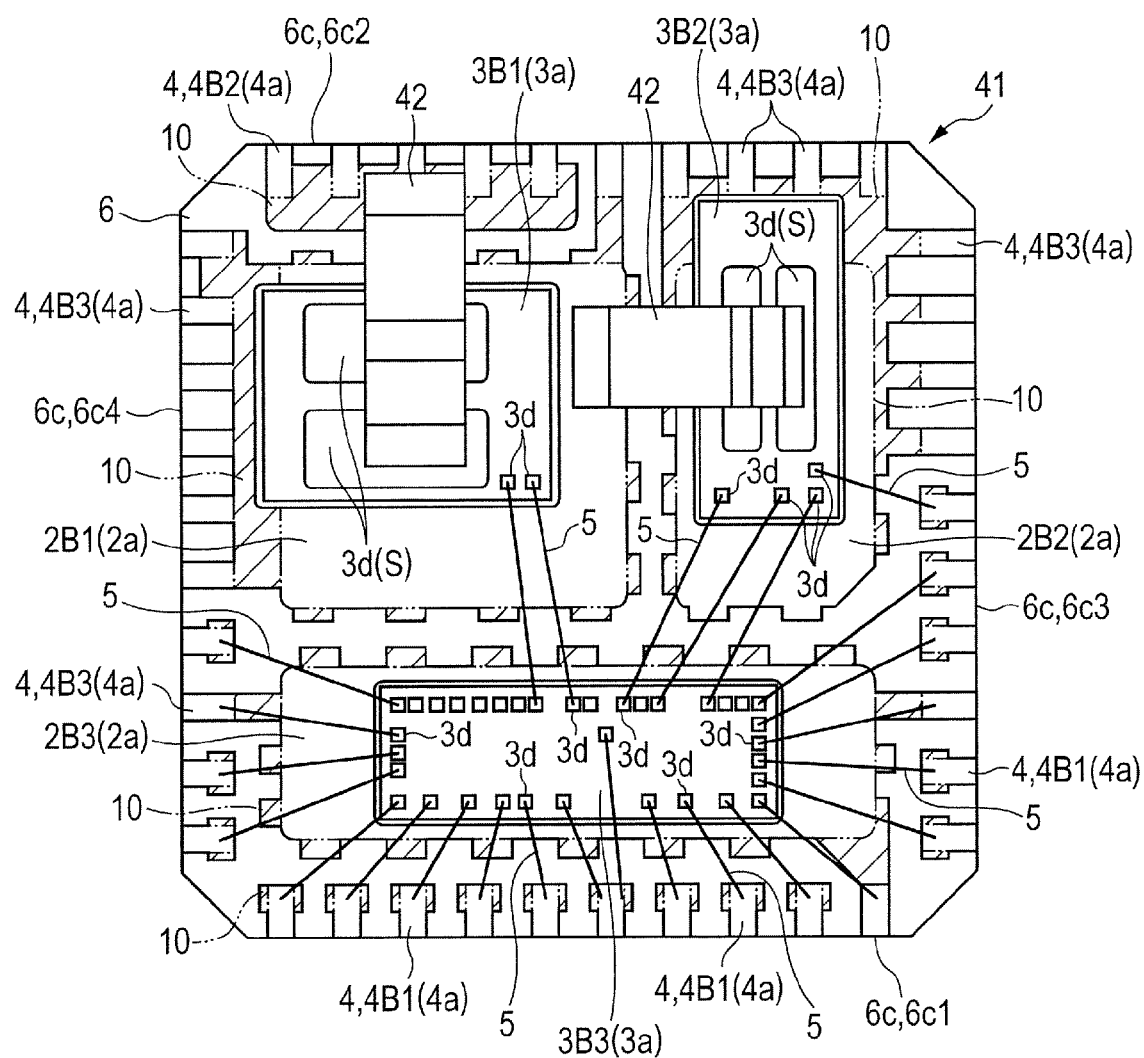
FIG. 30 is a plan view showing an internal structure of the semiconductor device from which the sealing body shown in FIG. 26 has been removed.

Next, a description will be given to a structure of the semiconductor device 41 shown in FIG. 25. FIG. 26 is a top view of the semiconductor device shown in FIG. 25. FIG. 27 is a bottom view of the semiconductor device of FIG. 26. FIG. 28 is a cross-sectional view along the line A-A of FIG. 26. FIG. 29 is a cross-sectional view along the line B-B of FIG. 26. FIG. 30 is a plan view showing an internal structure of the semiconductor device from which the sealing body shown in FIG. 26 has been removed.

The outer appearance structure of the top surface side of the semiconductor device 41 of the present embodiment shown in FIG. 26 is the same as that of the semiconductor device 1 shown in FIG. 1 described in the foregoing first embodiment. On the other hand, the outer appearance structure of the lower-surface side thereof shown in FIG. 27 is different from that of the semiconductor device 1 shown in FIG. 2 in that, inwardly of the plurality of leads 4, tabs (die pads or chip mounting portions) 2B1, 2B2, and 2B3 as the plurality of chip mounting portions independent of each other are disposed.

The tabs 2B1, 2B2, and 2B3 are disposed to have respective centers thereof displaced from the center of the sealing body 6. Among the tabs 2B1, 2B2, and 2B3, the tab 2B1 has a largest gross area. The bottom surface 2b of each of the tabs 2B1, 2B2, and 2B3 is exposed from the sealing body 6 at the bottom surface 6b of the sealing body 6. The tabs 2B1, 2B2, and 2B3 are formed of the same material as that of the tab 2 (see FIG. 3) described in the foregoing embodiment. The tabs 2B1, 2B2, and 2B3 are also the same as the tab 2 in that, over the surface of the base material comprised of, e.g. copper (Cu), a plating film (not shown) comprised of, e.g., nickel (Ni) is formed. As described above, the semiconductor device 41 includes the semiconductor chips 3B2 and 3B1 formed with the power transistors, and a large current flows therein. Accordingly, by exposing the tabs 2B1, 2B2, and 2B3 each having a heat conductivity higher than that of the sealing body 6, the degradation of the reliability of the semiconductor device 41 is inhibited. In addition, in terms of improving the wettability of a solder material serving as a bonding material when the bottom surface 2b of each of the tabs 2B1, 2B2, and 2B3 is coupled to the terminals of a mounting substrate not shown, conductor films (external plating films) 8 are formed over the respective bottom surfaces 2b.

Next, a description will be given to an internal structure of the semiconductor device 41. As shown in FIG. 30, in the sealing body 6, the semiconductor chips 3B3, 3B2, and 3B1 each having the top surface (upper surface or main surface) 3a, the back surface (bottom surface or main surface) 3b located on the opposite side of the top surface 3a, and the side surfaces 3c located between the top surface 3a and the back surface 3b are sealed.

The semiconductor chip 3B1 formed with the low-side power MOSFET has the plurality of pads 3d formed on the top surface 3a side. The plurality of pads 3d include source pads S electrically coupled to the source of the power MOSFET (power transistor). The plurality of pads 3d also include the pad (gate pad) 3d electrically coupled to the gate of the power MOSFET (power transistor). Each of the source pads S is formed to have a plane area wider than that of each of the other pads 3d (e.g., the gate pad). As shown in FIGS. 28 and 29, the semiconductor chip 3B1 has a back-side electrode 3e formed on the back surface 3b side. In the present embodiment, the back-side electrode 3e serves as a drain electrode D electrically coupled to the drain of the power MOSFET (power transistor). The semiconductor chip 3B1 is mounted over (fixed to) the tab 2B1 with the back surface 3b thereof formed with the drain electrode D opposing the top surface 2a of the tab 2B1. The adhesive material 7 is a conductive adhesive material, and the tab 2B1 is electrically coupled to the back-side electrode 3e via the conductive adhesive material 7. In the present embodiment, as the conductive adhesive material, a die-bond material which is an epoxy-based thermosetting resin containing metal particles comprised of silver (Ag) or the like is used. However, the conductive adhesive material 7 is not limited to the foregoing. For example, a solder material can be used as the adhesive material 7. By thus providing the drain electrode D on the back surface 3b side of the semiconductor chip 3B1 and electrically coupling the drain electrode D to the tab 2B1 via the conductive adhesive material 7, the bottom surface 2b of the tab 2B1 can be used as the drain terminal of the semiconductor device 41.

The semiconductor chip 3B2 formed with the high-side power MOSFET shown in FIG. 30 has the plurality of pads 3b formed on the top surface 3a side. The plurality of pads 3d include the source pads S electrically coupled to the source of the power MOSFET (power transistor). The plurality of pads 3d also include a pad (gate pad) 3d electrically coupled to the gate of the power MOSFET (power transistor). Each of the source pads S is formed to have a plane area wider than that of each of the other pads 3*d* (e.g., the gate pad). As shown in FIG. 28, the semiconductor chip 3B2 has the back-side electrode 3*e* formed on the back surface 3*b* side. In the present embodiment, the back-side electrode 3*e* serves as the drain electrode D electrically coupled to the drain of the power MOSFET (power transistor). The semiconductor chip 3B2 is mounted over (fixed to) the tab 2B2 with the back surface 3*b* thereof formed with the drain electrode D opposing the top surface 2*a* of the tab 2B2. The adhesive material 7 is a conductive adhesive material, and the tab 2B1 is electrically coupled to the back-side electrode 3*e* via the conductive adhesive material 7. By thus providing the drain electrode D on the back surface 3*b* side of the semiconductor chip 3B2 and electrically coupling the drain electrode D to the tab 2B2 via the conductive adhesive material 7, the bottom surface 2*b* of the tab 2B2 can be used as the drain terminal of the semiconductor device 41.

The semiconductor chip 3B3 formed with the driver circuits (the driver circuits and the control circuit in the present embodiment) for driving the two power MOSFETs described above has the plurality of pads 3*d* formed on the top surface 3*a* side. The semiconductor chip 3B3, which is a control-system semiconductor chip, needs a larger number of external terminals than those needed by a power semiconductor chip. Accordingly, the number of the pads 3*d* of the semiconductor chip 3B3 is larger than the number of the pads 3*d* of each of the other semiconductor chips 3B1 and 3B2. Moreover, in the semiconductor chip 3B3, a large current such as that flowing in each of the source pads S of the other semiconductor chips 3B1 and 3B2 does not flow. Accordingly, source pads S such as those of each of the other semiconductor chips 3B1 and 3B2 are not formed over the semiconductor chip 3B3. Also, as shown in FIG. 29, on the back surface 3*b* side of the semiconductor chip 3B3, a back-side electrode 3*e* such as that of each of the other semiconductor chip 3B1 and 3B2 is not formed. Accordingly, it is also possible to provide a configuration in which the tab 2B3 is not electrically coupled to the back surface 3*b* of the semiconductor chip 3B3. However, in the present embodiment, the semiconductor chip 3B3 is mounted over (fixed to) the top surface 2*a* of the tab 2B3 via the conductive adhesive material 7. By thus mounting the semiconductor chip 3B3 over the tab 2B3 via the conductive adhesive material 7 similarly to each of the other semiconductor chips 3B1 and 3B2, the heat release property of the semiconductor chip 3B3 can be improved. Also, by thus mounting the semiconductor chip 3B3 over the tab 2B3 via the conductive adhesive material 7 similarly to each of the other semiconductor chips 3B1 and 3B2, the manufacturing steps can be simplified.

As shown in FIG. 30, the semiconductor chips 3B3, 3B2, and 3B1 are electrically coupled to each other via conductive materials. The pads 3*d* of the semiconductor chip 3B1 are electrically coupled to the pads 3*d* of the semiconductor chip 3B3 via the wires (conductive materials) 5. The pads 3*d* of the semiconductor chip 3B2 are electrically coupled to the pads 3*d* of the semiconductor chip 3B3 via the wires (conductive materials) 5. In addition, the source pads S of the semiconductor chip 3B2 are electrically coupled to the tab 2B1 disposed adjacent to the tab 2B2 via a metal plate (conductive material or ribbon material (belt material)) 42. Specifically, as shown in FIG. 28, the Metal plate 42 has one end portion thereof bonded to the source pads S of the semiconductor chip 3B2 to extend from the portion thereof bonded to the source pads S so as to pass over the side surface LS2 of the tab 2B1, while having the other end portion thereof bonded to the top surface 2*a* of the tab 2B1. That is, the source pads S of the semiconductor chip 3B2 are electrically coupled to the back-side electrode 3*e* of the semiconductor chip 3B1 via the metal plate 42, the tab 2B1, and the conductive adhesive material 7.

Also, as shown in FIG. 30, around the semiconductor chips 3B3, 3B2, and 3B1 (around the tabs 2B1, 2B2, and 2B3), the plurality of leads 4 are disposed. In the second embodiment, the plurality of leads 4 include a plurality of leads 4B1 disposed in a state separate from each other, a lead (plate lead) 4B2 in which the plurality of leads 4 are formed integrally, and leads 4B3 each integrated with any of the tabs 2B1, 2B2, and 2B3 to function also as the suspension leads. In the example shown in FIG. 30, the plurality of leads 4 are formed of the leads 4B1, 4B2, and 4B3.

The semiconductor chips 3B3, 3B2, and 3B1 are electrically coupled to the plurality of leads 4 via the conductive materials. The source pads S of the semiconductor chip 3B1 are electrically coupled to the lead 4 (lead 4B2) disposed adjacent to the tab 2B1 via the metal plate (conductive material or ribbon material (belt material) 42. Specifically, as shown in FIG. 29, the metal plate 42 has one end portion thereof bonded to the source pads S of the semiconductor chip 3B1 to extend from the portion thereof bonded to the source pads S so as to pass over the side surface LS3 of the tab 2B1, while having the other end portion thereof bonded to the top surface 4*a* of the lead 4B2. Some of the pads 3*d* of the semiconductor chip 3B2 are electrically coupled to the lead 4 (lead 4B1) via the wire 5. The source pads S of the semiconductor chip 3B2 are electrically coupled to the lead 4B2 integrally formed with the tab 2B1 via the metal plate 42 and the tab 2B1. Some of the pads 3*d* of the semiconductor chip 3B3 are electrically coupled to leads 4B1 and the lead 4B3 via the wires 5.

As described above, in the present embodiment, to the source pads S in which a relatively large current larger than those flowing in the other pads 3*d* flows, the metal plate 42 is coupled. In this case, the cross-sectional area of a conductive path can be increased to be larger than in the case where the plurality of wires 5 are coupled to the source pads S. This can reduce the impedance component of the conductive path, and therefore can improve the reliability of the semiconductor device 41. In addition, by using the metal plate 42, the cross-sectional area of a heat transfer path can be increased. This can improve the heat release property of each of the semiconductor chips 3B1 and 3B2 each serving as the main heat generation source of the semiconductor device 41, and therefore can inhibit the degradation of the reliability of the semiconductor device 41 under the influence of heat.

The material of the metal plate 42 is not particularly limited, and the metal plate 42 of the present embodiment is comprised of aluminum. To electrically couple the metal plate 42 to bonding target portions such as the semiconductor chips 3B1 and 3B2, the tab 2B1, and the leads 4, it is necessary to mold the belt-like metal plate 42 in consideration of level differences between the individual members, as shown in, e.g., FIGS. 28 and 29. There is a technique which uses, as the metal plate 42, a plate material comprised of copper (Cu). In this case, a copper plate molded in advance in a predetermined shape is bonded to the bonding target portion via a conductive bonding material such as a solder material or a resin containing conductive particles. Alternatively, if the metal plate 42 as the metallic ribbon material comprised of aluminum is used, it is possible to bond the metal plate 42 to the bonding target portion without interposition of a conductive bonding material such as a solder material. Since the aluminum plate has a moldability higher than that of the copper plate, aluminum plates can be sequentially molded, while being bonded to the bonding target portions. Accordingly, if a plate material molded in advance in a predetermined shape is used, it is necessary to individually preserve the metal plates 42 on a per product basis. However, in the case of using the metallic ribbon material, there is no need for such preservation, resulting in high versatility. Therefore, in the present embodiment, a metallic ribbon material (aluminum ribbon) capable of improving manufacturing efficiency is used as the metal plate 42.

<Detailed Structure of Chip Mounting Portion>

Figure 31:
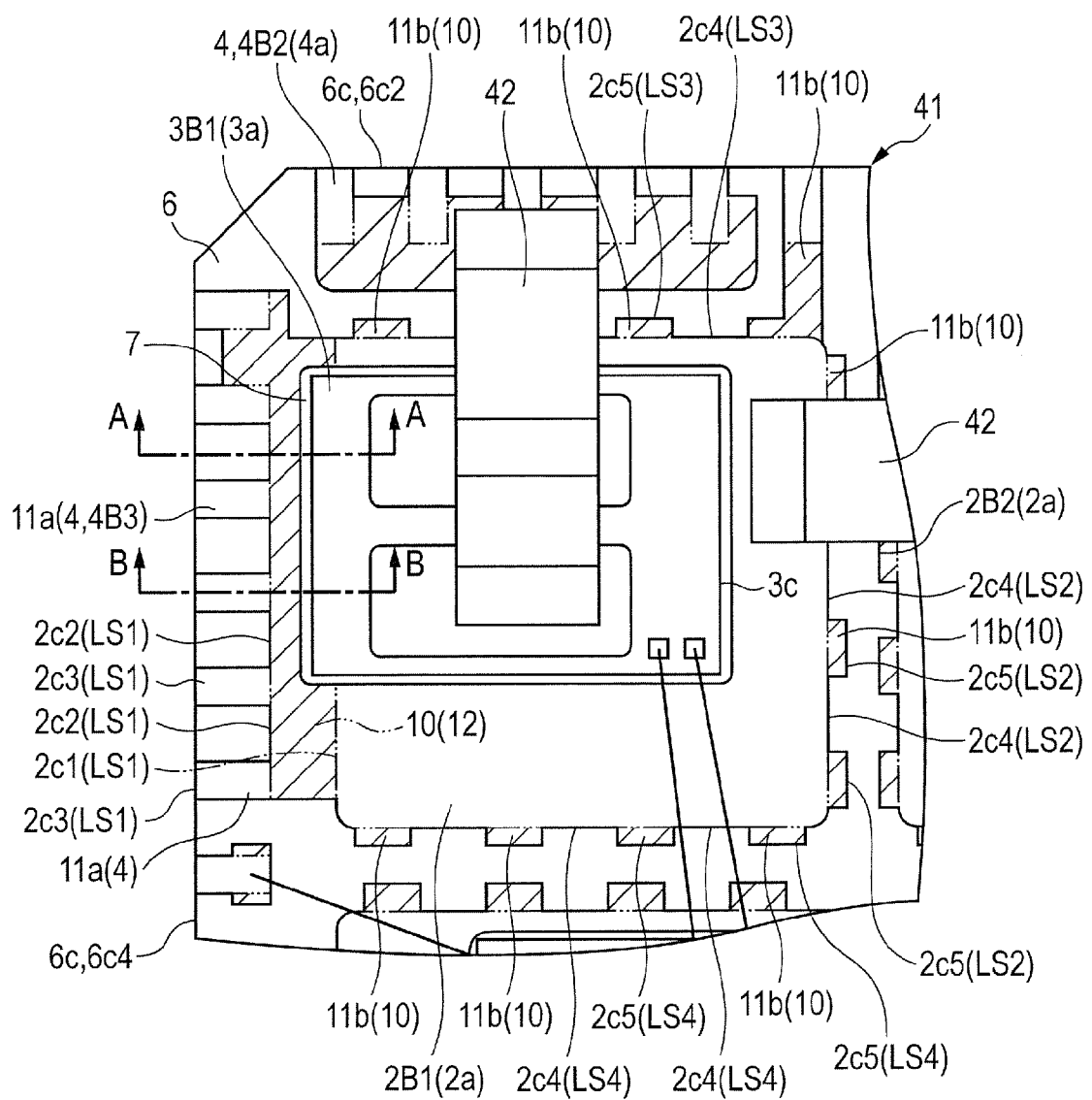
FIG. 31 is an enlarged plan view showing, under magnification, the periphery of the chip mounting portion having the low-side semiconductor chip shown in FIG. 30 mounted thereover.
Figure 32:
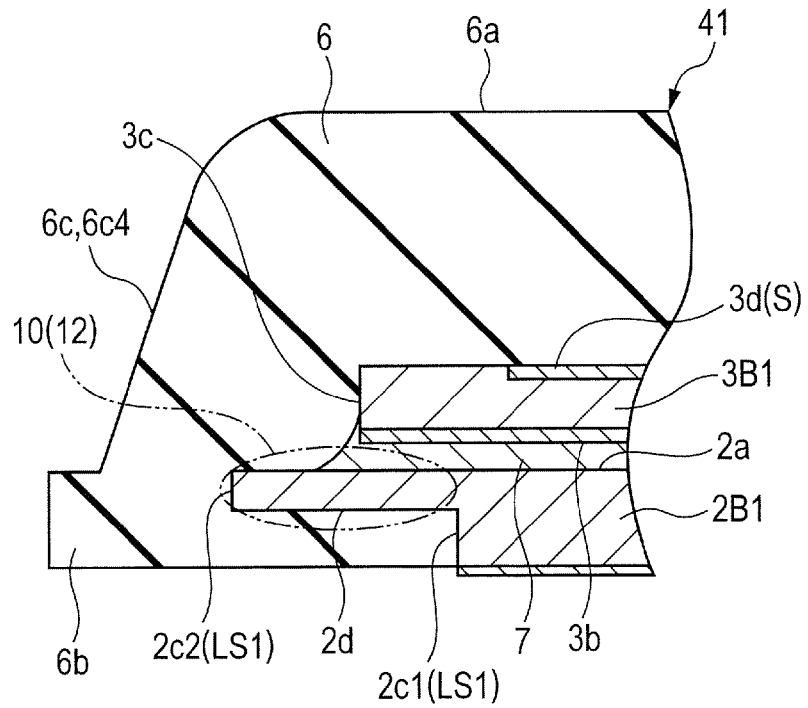
FIG. 32 is an enlarged cross-sectional view along the line A-A of FIG. 31.
Figure 33:
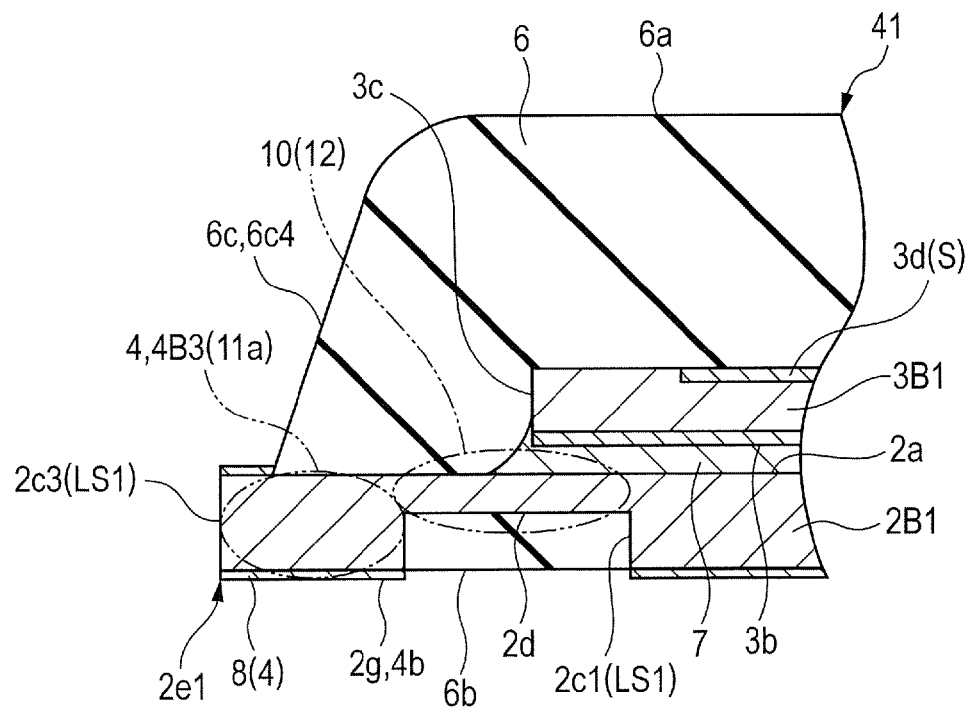
FIG. 33 is an enlarged cross-sectional view along the line B-B of FIG. 31.
Figure 34:
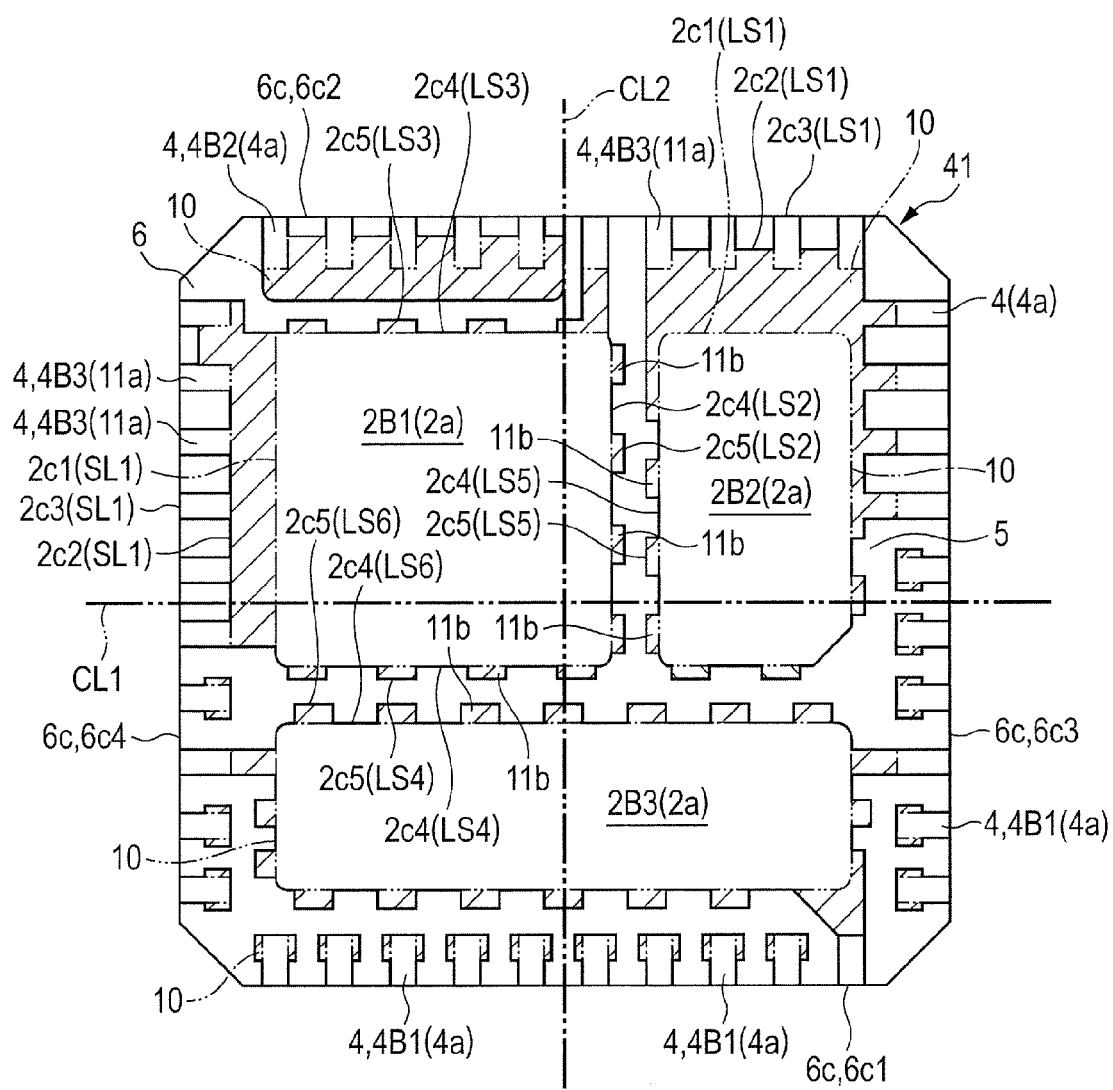
FIG. 34 is an illustrative view showing a positional relationship between center lines which quadrisect the sealing body shown in FIG. 30 in planar view and the chip mounting portions.

Next, a description will be given to a detailed structure of the plurality of chip mounting portions of the semiconductor device 41 of the present embodiment. FIG. 31 is an enlarged plan view showing, under magnification, the periphery of the chip mounting portion having the low-side semiconductor chip shown in FIG. 30 mounted thereover. FIG. 32 is an enlarged cross-sectional view along the line A-A of FIG. 31. FIG. 33 is an enlarged cross-sectional view along the line B-B of FIG. 31. FIG. 34 is an illustrative view showing a positional relationship between center lines which quadrisect the sealing body shown in FIG. 30 in planar view and the chip mounting portions. Note that, in FIG. 34, for improved clarity of illustration of the positions of the tabs 2B1 to 2B3, the semiconductor chips 3B1 to 3B3, the metal plate 42, and the wires 5 which are shown in FIG. 30 are not shown.

The tab 2B1 over which the low-side semiconductor chip 3B1 shown in FIG. 31 is mounted has a side surface LS1 located along the side 6c4 of the sealing body 6, a side surface LS2 opposing the side surface LS1, a side surface LS3 located closer to the side 6c2 of the sealing body 6, and a side surface LS4 opposing the side surface LS3. As shown by hatching in FIGS. 30 and 31, around the peripheral edge portion of the tab 2B1, the thinner region 10 is formed. That is, as shown in FIGS. 32 and 33, each of the side surfaces LS1 to LS4 of the tab 2B1 has the portion (side surface) 2c1 continued to the bottom surface 2b of the tab 2B1, and the portion (side surface) 2c2 located outwardly of the portion 2c1 (closer to the leads 4 in planar view) and continued to the top surface 2a of the tab 2B1. In the present embodiment, around the tab 2B1, the thinner region 10 is provided, but the configuration of the thinner region 10 is different from that in the tab 2 described in the foregoing first embodiment. In the present embodiment, the thinner region 10 is provided intermittently so as to surround the periphery of the tab 2B1. Specifically, along the side surface L1 among the four side surfaces LS1 to LS4 of the tab 2B1, the thinner region 10 is disposed so as to extend continuously. On the other hand, along each of the other side surfaces LS2, LS3, and LS4 of the tab 2B1, the thinner region 10 is disposed intermittently.

Here, as shown in FIG. 31, on the side surface LS1 side of the tab 2B1, the semiconductor chip 3B1 and the adhesive material 7 overlap the thinner region 10 of the tab 2B1 in planar view. That is, as shown in FIG. 32, the outer edge (side surface 3c) of the semiconductor chip 3B1 is located between the portion 2c1 of the tab 2B1 and the portion 2c2 thereof, and the outer edge of the adhesive material 7 is located between the outer edge of the semiconductor chip 3B1 and the portion 2c2. As in the present embodiment, when the conductive material (metal plate 42) is bonded to the tab 2B1, it is necessary for at least the region where the conductive material is bonded to include a region other than the thinner region 10. In addition, in terms of stably bonding the conductive material, even when the region where the conductive material is bonded includes the thinner region 10, the area thereof is preferably minimized. On the other hand, as described above, in terms of reducing the mounting area of the semiconductor device, it is requested to reduce the two-dimensional size thereof. Therefore, it is necessary to ensure a region where the conductive material is bonded in a limited space over the tab 2B1. Accordingly, as shown in FIG. 31, the semiconductor chip 3B1 is disposed over the top surface 2a of the tab 2B1 such that the center position thereof is displaced from the center position of the tab 2B1. As a result, a part of the semiconductor chip 3B1 overlaps the thinner region 10 of the tab 2B1. For example, to ensure the region where the metal plate 42 is bonded in the top surface 2a of the tab 2B1, the distance from the outer edge (side surface 3c closer to the tab 2B2) of the semiconductor chip 3B1 to the portion 2c of the side surface LS2 of the tab 2B1 is longer than the distance from the outer edge (side surface 3c closer to the side 6c4 of the sealing body 6) of the semiconductor chip 3B1 to the portion 2c2 of the side surface LS1 of the tab 2B1. In other words, to ensure the region where the metal plate 42 is bonded in the top surface 2a of the tab 2B1, the semiconductor chip 3B1 is disposed (mounted) to be closer to the side surface LS1. As a result, a part of the semiconductor chip 3B1 is positioned to overlap the thinner region 10 on the side surface LS1 side. On the side surface LS1 side of the tab 2B1 to which the semiconductor chip 3B1 is disposed closer, the thinner region 10 is disposed to extend continuously along the side surface LS1, and therefore it is possible to bond the entire back surface of the semiconductor chip 3B1 to the top surface of the tab 2B1.

As described above, in the present embodiment, the metallic ribbon material comprised of, e.g., aluminum is used as the metal plate 42, and the metal plate 42 is bonded to the tab 2B1 without interposition of a conductive bonding material such as a solder material. As a method for thus bonding the metal plate 42 to the tab 2B1, there is one which effects bonding by applying an ultrasonic wave to a bonding jig (bonding tool). In the method, unlike in the so-called nail head bonding method described in the electrical coupling step of the foregoing first embodiment, a thermocompression method is not used in combination. Accordingly, it is necessary to efficiently transmit the ultrasonic wave to a bonded portion. As a result, in the step of bonding the metal plate 42, it is necessary to clamp the vicinity of the bonded portion, i.e., a part of the tab 2B1. In addition, to securely fix the periphery of the bonded portion, it is necessary for the regions (clamped regions) press-held by a pressing jig (clamper) to include a region other than the thinner region 10 during bonding. In terms of stably bonding the metal plate 42, even when the clamped regions include the thinner region 10, the area thereof is preferably minimized. Therefore, the semiconductor chip 3B1 cannot be mounted over the clamped regions, and consequently a part of the semiconductor chip 3B1 overlaps the thinner region 10 of the tab 2B1.

When the semiconductor chip 3B1 and the adhesive material 7 thus overlap the thinner region 10 of the tab 2B1 in planar view, as described in the foregoing first embodiment, it is necessary to reduce the stress produced when the temperature cycle load is given. For this purpose, there is a method in which the protruding portions 11 formed integrally with the thinner region 10 are formed outside the thinner region 10 in the same manner as in the semiconductor device 1 described in the foregoing first embodiment. However, in the case of a semiconductor device having a structure in which a plurality of chip mounting portions are disposed to be arranged two-dimensionally as in the present embodiment, the space where the protruding portions 11 are formed may not be able to be ensured due to a request for a reduction in the two-dimensional size thereof. Accordingly, in the present embodiment, the structure of protruding portions 11a shown in FIG. 33 is used appropriately as a modification of the protruding portions 11 described in the foregoing first embodiment. Hereinbelow, a description will be given using FIG. 33.

The protruding portions 11a shown in FIG. 33 are the same as the protruding portions 11 shown in FIG. 13 and described in the foregoing first embodiment in that they have the function of transmitting a stress to the portions (side surfaces) 2c3 outside the protruding portions 11 and 11a, but are different therefrom in the following point. That is, in each of the protruding portions 11 illustrated in FIG. 13, the height of each of the portions (side surfaces) 2c3 is shorter than the distance from the top surface 2a of the tab 2 to the bottom surface 2b thereof. Accordingly, the portion 2c3 and the bottom surface 2d continued to the portion 2c3 are sealed in the sealing body 6. In the case of this structure, as described above, the sealing body 6 comprised of a resin deforms following the thinner region 10 to thereby release (reduce) the stress resulting from the temperature cycle load. On the other hand, in the protruding portion 11a shown in FIG. 33, the height of each of the portions 2c3 is the same as the distance from the top surface 2a of the tab 2B1 to the bottom surface 2b thereof. In other words, bottom surface 2g continued to the portion (side surface) 2c3 is exposed from the sealing body 6 at the bottom surface 6b of the sealing body 6. That is, in cross-sectional view, the sealing body 6 is not disposed under the position 2e on which the stress is most likely to be concentrated. As a result, it is possible to prevent a crack CLK as shown in, e.g., FIG. 8 from occurring in the sealing body 6 due to the stress. In addition, between the portions 2c3 and 2c1, the thinner region 10 having the bottom surface 2d thereof sealed in the sealing body 6 is disposed. In other words, at the bottom surface 6b of the sealing body 6, between the bottom surface 2b of the tab 2B1 and the bottom surface 2g of each of the protruding portions 11a, a part of the sealing body 6 is located. Therefore, it is possible to prevent or inhibit the tab 2B1 from falling out of the sealing body 6.

As shown in FIG. 33, in the present embodiment, the plurality of leads 4 as the external terminals of the semiconductor device 41 which are disposed along the tab 2B1 are used as the protruding portions 11a of the tab 2B1. As described above, in the semiconductor device 41, the plurality of leads 4 include the leads 4B3 each formed integrally with any of the tabs 2B1, 2B2, and 2B3 to also function as the suspension leads. Of the plurality of leads 4 disposed around the peripheral edge portion of the sealing body 6 in planar view, the lead 4 at the same potential as that of the tab 2B1 can be increased in the cross-sectional area of the conductive path thereof by being integrated with the tab 281. Accordingly, as shown in FIG. 33, by utilizing the lead 4B2 formed integrally with the tab 2B1 as the protruding portion 11a, even when the protruding portions 11a are provided, it is possible to inhibit an increase in the two-dimensional size of the semiconductor device 41. When any of the plurality of leads 4 is thus used as the protruding portion 11a, the bottom surface 2g continued to the portion 2c3 also serves as the bottom surface 4b of the lead 4. Consequently, in the present embodiment, as shown in FIG. 33, the bottom surface 2g is formed with the conductor film 8.

The plurality of protruding portions 11a of the present embodiment are the same as the protruding portions 11 described in the foregoing first embodiment. Therefore, the forms of implementation described in <Preferred Forms of Implementation> of the foregoing first embodiment can be applied thereto. For example, the number of the protruding portions 11a (number of the terminals 4) along the side surface LS1 is not limited to that in the form of implementation shown in FIG. 31. For example, it is possible to provide a structure in which each of the sides is provided with one protruding portion 11a, though not shown. However, since the stress produced in the tab 2B1 is concentrated on the protruding portion 11a, in terms of inhibiting the stress from being concentrated on the specified protruding portion 11a and distributing the stress, it is preferable to provide the plurality of protruding portions 11a along the side surface LS1, as shown in FIG. 31. In other words, it is preferable to alternately arrange the plurality of portions 2c2 and the plurality of portions 2c3 along the side surface LS1. By thus providing the plurality of protruding portions 11a, it is possible to reduce the stress transmitted to each of the protruding portions 11a.

Figure 35:
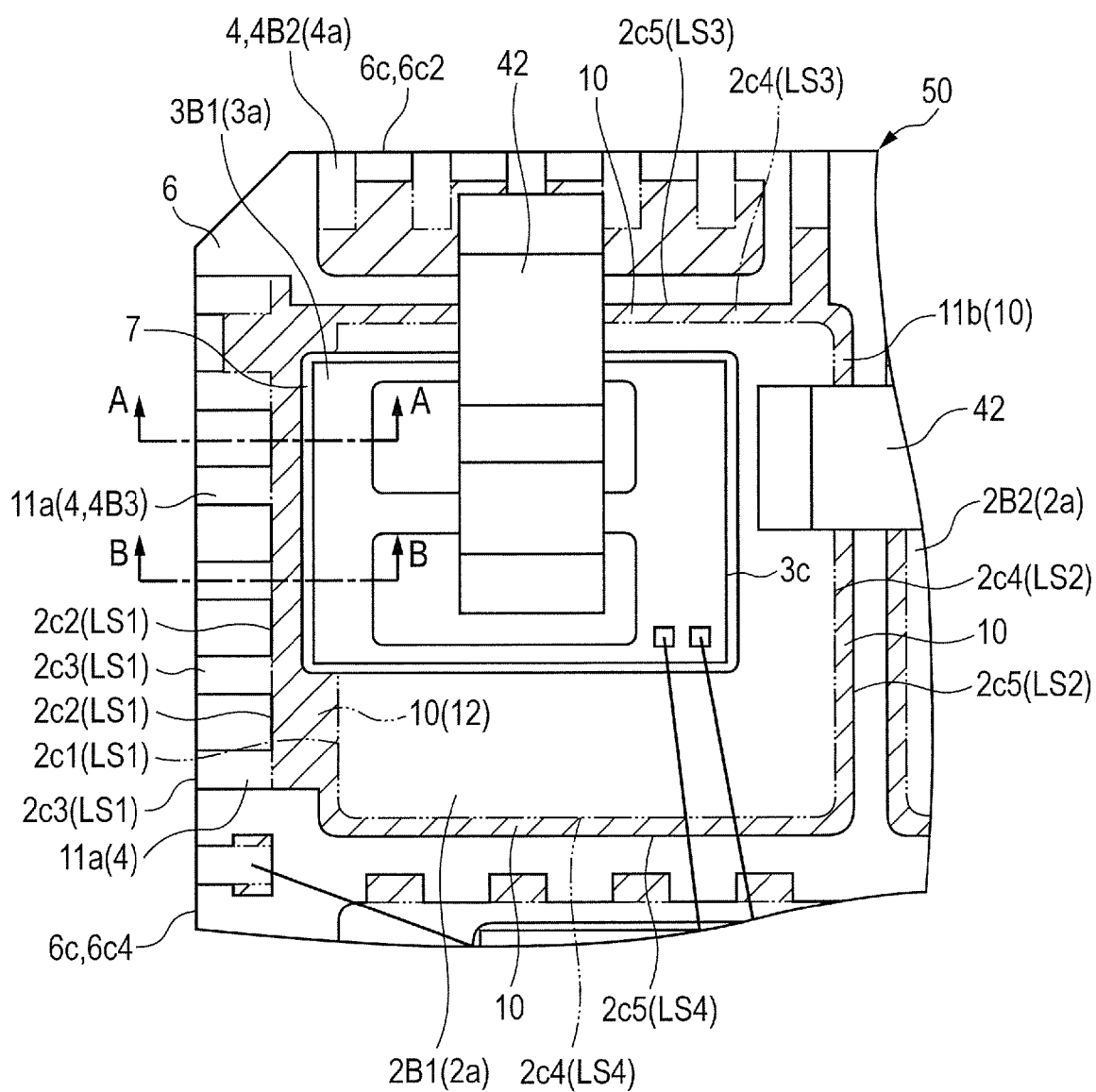
FIG. 35 shows a modification of the semiconductor device of FIG. 31, which is an enlarged plan view showing, under magnification, the periphery of a chip mounting portion having a low-side semiconductor chip mounted thereover.
Figure 36:
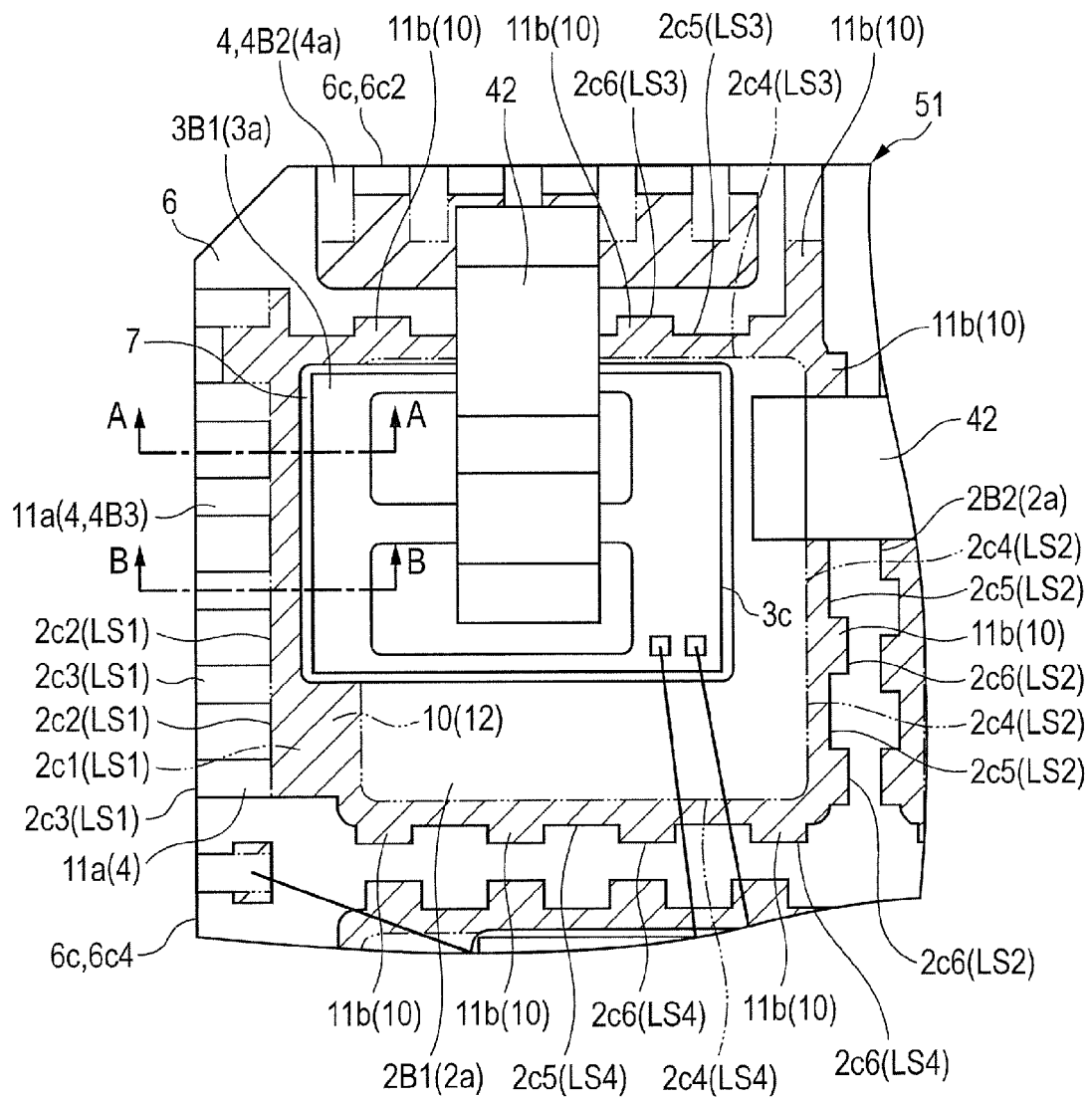
FIG. 36 shows another modification of the semiconductor device shown in FIG. 31, which is an enlarged plan view showing, under magnification, the periphery of a chip mounting portion having a low-side semiconductor chip mounted thereover.

A description will be given next to the other side surfaces LS2 to LS4 of the tab 2B1. FIGS. 35 and 36 show modifications of the semiconductor device of FIG. 31, which are enlarged plan views each showing, under magnification, the periphery of a chip mounting portion over which a low-side semiconductor chip is mounted. As shown in FIGS. 31, 35, and 36, along each of the side surfaces LS2 to LS4 of the tab 2B1 other than the side surface LS1 thereof, the outer edge of the semiconductor chip 3B1 is located inwardly of the inner end portion (portion (side surface) 2c1) of the thinner region 10. In other words, along the side surfaces LS2 to LS4 of the tab 2B1 other than the side surface LS1 thereof, the semiconductor chip 3B1 does not overlap the thinner region 10.

As described in the foregoing first embodiment, when the semiconductor chip 3B1 having a quadrilateral plan view shape is mounted such that only one of the four sides thereof is located at a position overlapping the thinner region 10, if anti-crack measures are implemented on the overlapping side of the semiconductor chip 3B1, the occurrence of a crack can be inhibited. Accordingly, as in a semiconductor device 50 shown in FIG. 35, a configuration may be such that each of the side surfaces LS2 to LS4 among the four side surfaces LS1 to LS4 of the tab 2B1 which do not overlap the semiconductor chip 3B1 are not provided with the protruding portions 11, and the portions (side surfaces) 2c3 as the outer edge of the thinner region 10 are linearly extended. In the tab 2B of the semiconductor device 50 shown in FIG. 35, each of the side surfaces LS2 to LS 4 is formed with the thinner region 10. In other words, each of the side surfaces LS2 to LS4 has a portion (side surface) 2c4 continued to the bottom surface 2b (see FIGS. 28 and 29) of the tab 2B1, and a portion (side surface) 2c5 located outwardly of the portion 2c4 and continued to the top surface 2a of the tab 2B1 to face the same direction as the portion 2c4. By thus providing each of the side surfaces LS1 to LS4 of the tab 2B1 with the thinner region 10, it is possible to prevent or inhibit the tab 2B1 from falling out of (coming off) the sealing body 6.

However, since the tab 2B1 is formed integrally, the stress produced in the side surface LS1 may be transmitted to the other side surfaces LS2 to LS4. According to the study conducted by the present inventors, it has been found that, in the following case, there is the possibility that a crack may occur particularly along the side surfaces LS2 to LS4 and, as in the projecting portions 11 described in the foregoing first embodiment, it is preferable to form portions for releasing the stress.

When the plurality of chip mounting portions are disposed to be arranged two-dimensionally as in the present embodiment, some of the side surfaces thereof are disposed to oppose another of the chip mounting portions. For example, in the tab 2B1 shown in FIG. 31, the side surface LS2 opposes the tab 2B2, while the side surface LS4 opposes the tab 2B3. Here, the tabs 2B1, 2B2, and 2B3 are disposed proximate to each other to reduce the size of the package and improve the electrical properties of the semiconductor device. This is because, by disposing the tabs 2B1, 2B2, and 2B3 close to each other, the two-dimensional size of the package is reduced and the lengths of the metal plate and the wires extending between the tabs 2B1 to 2B3 are reduced so that wiring resistance is reduced and the electrical properties of the semiconductor device are improved. However, when the tabs 2B1 to 2B3 are disposed in proximity, along the side surfaces LS2 and LS4 opposing the other tabs (tabs 2B2 and 2B3), the amount of the sealing body 6 disposed between the chip mounting portions is relatively reduced to result in lower strength, and therefore a crack is likely to occur. It has been found that, along the side crossing either of the center lines of the package in planar view, a crack is particularly likely to occur.

A description will be given using FIG. 34. In FIG. 34, two center lines (phantom lines) CL1 and CL2 orthogonal to each other in planar view can be drawn. In FIG. 34, the center line CL1 is drawn along the direction in which the tabs 2B1 and 2B2 are arranged, and the center line CL2 is drawn in a direction orthogonal to the center line CL1. Here, the side surfaces LS1 and LS2 of the tab 2B1 cross the center line CL1. On the other hand, the side surfaces LS3 and LS4 of the tab 2B1 cross the center line CL2. That is, in the case of the example shown in FIG. 34, the side surfaces LS2 and LS4 oppose the other tabs 2B2 and 2B3 and cross the center lines CL1 and CL2, respectively, so that a crack is likely to occur therealong. As a result, it has been found that the side surfaces LS2 and LS4 are preferably formed with portions for releasing a stress such as the protruding portions 11 described in the foregoing first embodiment.

According to the structure for inhibiting the crack described above in the example of the semiconductor device 41 shown in FIG. 31, along the side surface LS2, a plurality of the foregoing portions (side surfaces) 2c4 and a plurality of the portions (side surfaces) 2c5 are alternately arranged along the extending direction of the side surface LS2. Also, along the side surface LS4, the foregoing plurality of portions (side surfaces) 2c4 and the plurality of portions (side surfaces) 2c5 are alternately arranged along the extending direction of the side surface LS4. From another viewpoint, along each of the side surfaces LS2 and LS4, a plurality of protruding portions 11b are arranged in the extending direction of the side surface LS2 or LS4. Thus, even a side along which the semiconductor chip 3B1 does not overlap the thinner region 10 in planar view (side along which the outer edge of the semiconductor chip 3B1 is located inwardly of the portion 2c1 in planar view) can reliably inhibit the occurrence of a crack by being provided with the protruding portions 11b in accordance with the amount of the sealing body 6 and the placement of the sides. However, as described in the foregoing first embodiment using FIG. 14, in terms of reliably inhibiting the occurrence of a crack, it is preferable to provide each of the side surfaces LS1 to LS4 with the protruding portions 11b if the space where the protruding portions 11b are placed can be ensured, as shown in FIG. 31.

In terms of forming the side surfaces LS2 and LS4 with portions for releasing a stress such as the protruding portions 11 described in the foregoing first embodiment, a configuration such as that of a semiconductor device 51 shown in FIG. 36 can also be considered. In the semiconductor device 51 shown in FIG. 36, the thinner region 10 is continuously disposed so as to surround the entire periphery of the tab 2B1 and, outside the thinner region 10, a plurality of protruding portions 11b are further disposed. In other words, in the semiconductor device 51, the side surface LS2 of the tab 2B1 has the portion (side surface) 2c4 continued to the bottom surface 2b (see FIG. 28) of the tab 2B1, the portion (side surface) 2c5 located outwardly of the portion 2c4 (closer to the tab 2B2) and continued to the top surface 2a of the tab 2B1, and a portion (side surface) 2c6 located outwardly of the portion 2c5 (closer to the tab 2B2) and continued to the top surface 2a of the tab 2B1 to face the same direction as each of the portions 2c4 and 2c5. Also, the side surface LS4 of the tab 2B1 has the portion (side surface) 2c4 continued to the bottom surface 2b (see FIG. 28) of the tab 2B1, the portion (side surface) 2c5 located outwardly of the portion 2c4 (closer to the tab 2B3) and continued to the top surface 2a of the tab 2B1, and the portion (side surface) 2c6 located outwardly of the portion 2c5 (closer to the tab 2B3) and continued to the top surface 2a of the tab 2B1 to face the same direction as each of the portions 2c4 and 2c5. Even when the thinner region 10 is disposed continuously along the peripheral direction of the tab 2B1 as in the semiconductor device 51 shown in FIG. 36, if the protruding portions 11b are further provided outside the thinner region 10, the occurrence of a crack can be more reliably inhibited.

However, in terms of disposing the individual tabs 2B1 to 2B3 in proximity and reducing the two-dimensional size of the semiconductor device (in terms of reducing the mounting region), a configuration is preferred in which the thinner region 10 is disposed intermittently along each of the side surfaces LS2, LS3, and LS4 as in the semiconductor device 41 shown in FIG. 31. In the semiconductor device 41 shown in FIG. 31, the portion (side surface) 2c4 disposed between the adjacent portions (side surfaces) 2c5 in planar view does not form the thinner region 10. In other words, the portion (side surface) 2c4 disposed between the adjacent portions (side surfaces) 2c5 in planar view is continued to the top surface 2a and the bottom surface 2b (see FIGS. 28 and 29) of the tab 2B1, and the height thereof is the same as the distance from the top surface 2a to the bottom surface 2b. In other words, along the side surfaces LS2 to LS4 other than the side surface LS1 of the tab 2B1, only the protruding portions 11b serve as the thinner region 10. By providing such a configuration, it is possible to reduce the area occupied by the thinner region 10. As a result, the individual tabs 2B1 to 2B3 can be disposed in proximity, and therefore the two-dimensional size of the semiconductor device 41 can be reduced. In addition, by reducing the area occupied by the thinner region 10, the area of the bottom surface 2b (see FIGS. 28 and 29) of the tab 2B1 exposed from the sealing body 6 can be increased. As a result, it is possible to improve the heat release efficiency of the semiconductor device 41.

As for the side surfaces LS2 and LS4 of the tab 2B1, they are disposed to oppose the other chip mounting portions (tabs 2B2 and 2B3). Also, the side surface LS3 thereof is disposed to oppose the lead (plate lead) 4B2 in which the plurality of leads 4 are formed integrally along the side surface LS3. Therefore, when the side surfaces LS2, LS3, and LS4 are not integrated with the leads 4 unlike the side surface LS1, in the same manner as in the semiconductor device 1 described in the foregoing first embodiment, the protruding portions 11b are preferably sealed in the sealing body 6. That is, as shown in FIG. 28, the height of the portion (side surface) 2c5 of the side surface LS2 of the tab 2B1 is shorter than the distance from the top surface 2a of the tab 2B1 to the bottom surface 2b thereof. Also, as shown in FIG. 29, the height of the portion (side surface) 2c5 of each of the side surfaces LS3 and LS4 of the tab 2B1 is shorter than the distance from the top surface 2a of the tab 2B1 to the bottom surface 2b thereof.

Heretofore, of the plurality of tabs 2B1 to 2B3 shown in FIG. 30, the tab 2B1 having the largest area and likely to undergo a crack has been described in detail as a representative example. However, the present invention is also applicable to the other tabs 2B2 and 2B3 based on the technical idea described with regard to the tab 2B1. For example, in the tab 2B2 shown in FIG. 30, along the side thereof along the side 6c2 of the sealing body 6, the semiconductor chip 3B overlaps the thinner region 10 in planar view. Therefore, as shown in FIG. 34, by using the plurality of leads 4 formed integrally with the tab 2B2 as the protruding portions 11a, it is possible to inhibit the occurrence of a crack in the tab 2B. Of the plurality of side surfaces of the tab 2B2 shown in FIG. 34, the side surface LS5 opposing the side surface LS2 of the tab 2B1 is disposed to oppose the other chip mounting portion (tab 2B1), and the side surface LS5 crosses the center line CL1. Therefore, by providing the side surface LS5 opposing the side surface LS2 of the tab 2B1 with the portions (side surfaces) 2c4 and 2c5 (protruding portions) 11b, it is possible to inhibit the occurrence of a crack.

As shown in FIG. 30, the semiconductor chip 3B3 does not overlap the thinner region 10 in planar view but, in the semiconductor device 41 in which the plurality of chip mounting portions independent of each other are disposed to be arranged two-dimensionally, stresses having occurred in the individual chip mounting portions (tabs 2B1, 2B2, and 2B3) may affect each other. In particular, as shown in FIG. 34, the tab 2B3 is disposed to oppose the tabs 2B1 and 2B2, and includes the side surface LS6 crossing the center line CL2. Therefore, particularly for the side surface LS6 disposed to oppose the tabs 2B1 and 2B, it is possible to inhibit the occurrence of a crack therealong by providing the side surface LS6 with the portions (side surfaces) 2c4 and 2c5. If the two-dimensional size allows, it is preferable to provide each of the side surfaces of the tab 2B3 with the portions (side surfaces) 2c4 and 2c5. However, as described above, the frequency of the occurrence of a crack is higher in the tabs 2B1 and 2B2. Accordingly, if it is difficult to provide each of the chip mounting portions with the portions (side surfaces) 2c4 and 2c5 (protruding portions lib) due to two-dimensional size limitations, it is preferable to give higher priorities to the tabs 2B1 and 2B2 in which the frequency of the occurrence of a crack is higher.

<Method of Manufacturing Semiconductor Device>

Figure 37:
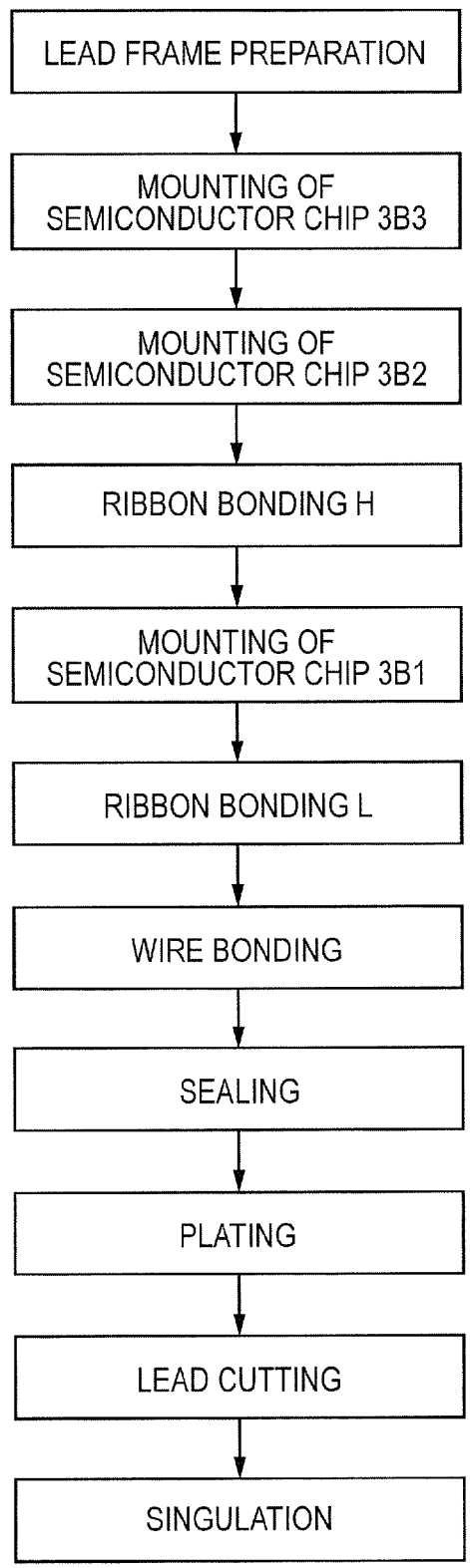
FIG. 37 is an illustrative view showing the flow of assembly of the semiconductor device as the other embodiment of the present invention.

Next, a description will be given to the manufacturing steps of the semiconductor device 41 described using FIGS. 25 to 34 along the process step flow shown in FIG. 37. Note that, in the present embodiment, a description will be given mainly to the difference with the method of manufacturing the semiconductor device described in the foregoing first embodiment. FIG. 37 is an illustrative view showing the flow of assembly of the semiconductor device of the present embodiment.

The manufacturing steps of the semiconductor device shown in FIG. 37 are different from the manufacturing steps of the semiconductor device of the foregoing first embodiment shown in FIG. 18 in that the step of mounting the semiconductor chip and the step of bonding the metal plate as the metallic ribbon material are successively and repeatedly performed. Therefore, a description of the lead frame preparing step, the wire bonding step, and the steps subsequent thereto which are shown in FIG. 37 is omitted since the technology described in the foregoing first embodiment can be applied extensively thereto.

Figure 38:
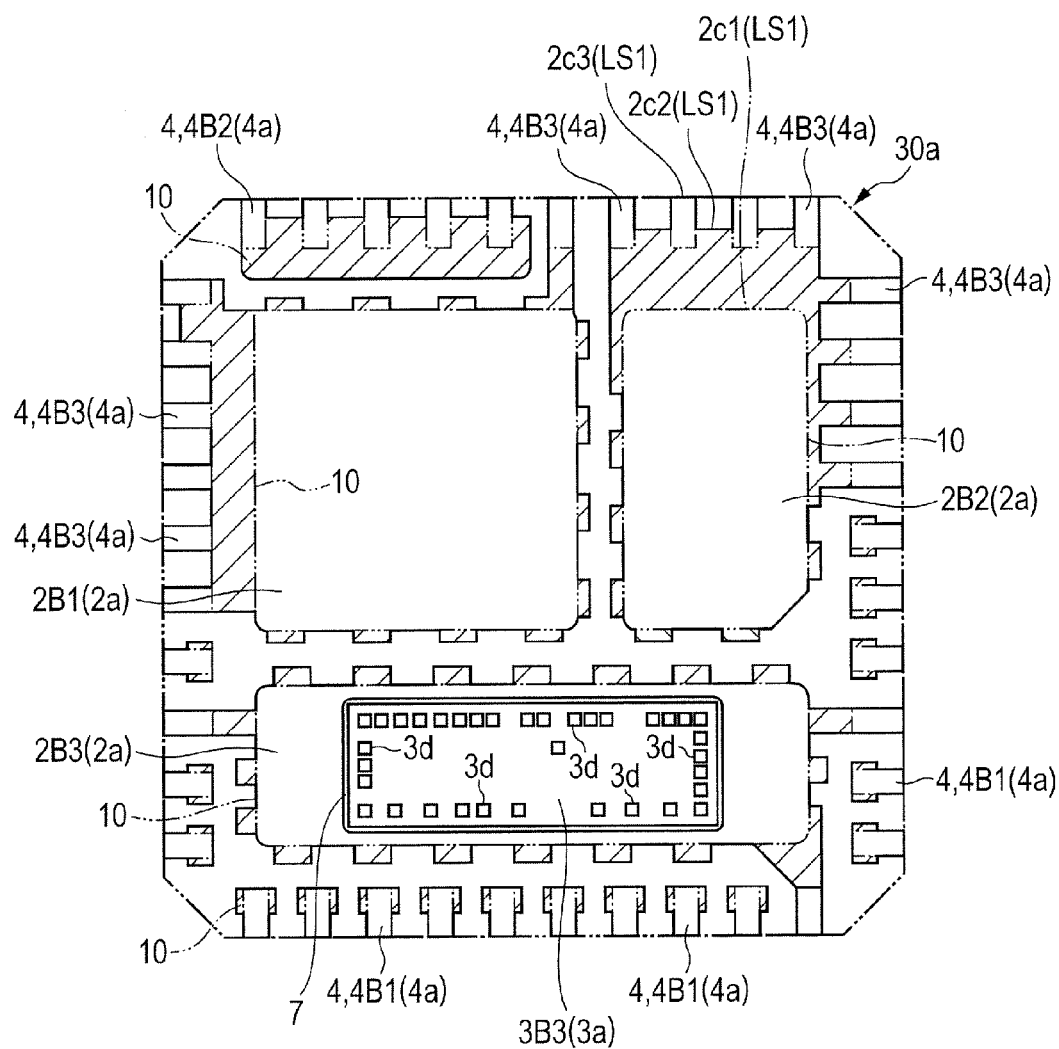
FIG. 38 is a plan view showing a state where semiconductor chip formed with driver circuits is mounted over the chip mounting portion of a lead frame as the other embodiment of the present invention.

First, in the step of mounting the semiconductor chip 3B3 shown in FIG. 37, as shown in FIG. 38, the semiconductor chip 3B3 formed with the two driver circuits and the control circuit is mounted over the top surface 2a of the tab (chip mounting portion) 2B3 provided in each of the product formation regions 30a of the lead frame. FIG. 38 is a plan view showing a state where the semiconductor chip formed with the driver circuits is mounted over the chip mounting portion of the lead frame in the present embodiment. In the present step, the semiconductor chip can be mounted by the same operation as in the semiconductor chip mounting step described in the foregoing first embodiment. However, in the present embodiment, the semiconductor chip 3B3 is preferably disposed over the middle portion of the tab 2B3 so as not to overlap the thinner region 10 of the tab 2B3. Note that, in FIG. 37, it is shown that the present step is performed subsequently to the lead frame preparing step. However, the order in which the present step is performed is not particularly limited as long as the present step is subsequent to the lead frame preparing step and previous to the wire bonding step.

Figure 39:
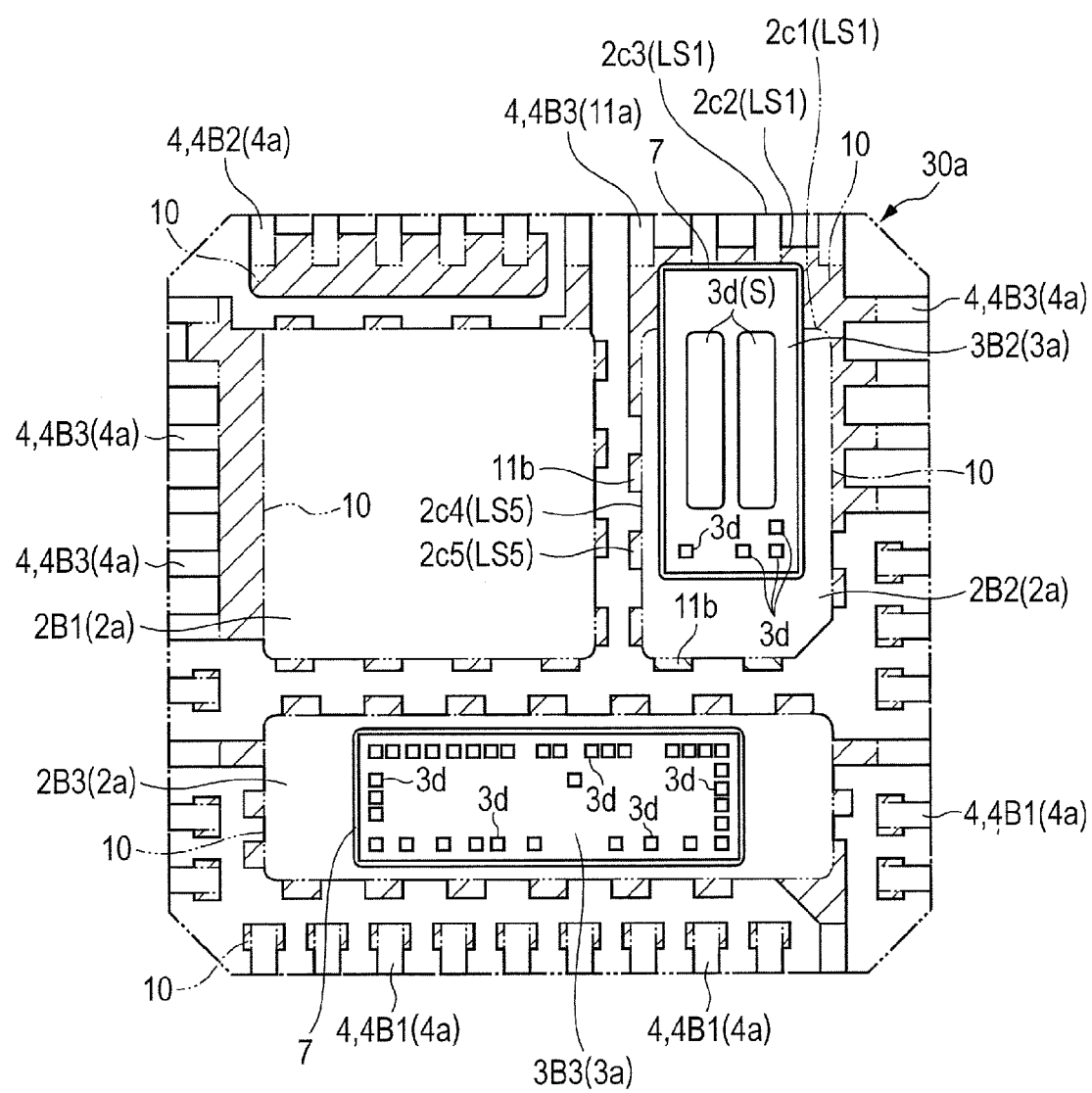
FIG. 39 is a plan view showing a state where a high-side semiconductor chip is mounted over the chip mounting portion of the lead frame as the other embodiment of the present invention.

Next, in the step of mounting the semiconductor chip 3B2 shown in FIG. 37, as shown in FIG. 39, the semiconductor chip 3B2 as the high-side switching element is mounted over the top surface 2a of the tab (chip mounting portion) 2B2 provided in each of the product formation regions 30a of the lead frame. FIG. 39 is a plan view showing a state where the high-side semiconductor chip is mounted over the chip mounting portion of the lead frame in the present embodiment. In the present step, by the same operation as in the semiconductor chip mounting step described in the foregoing first embodiment, the semiconductor chip 3B2 is mounted over the tab 2B2 via the conductive adhesive material 7, and electrically coupled thereto. However, to ensure regions (clamped regions) to be press-held by a pressing jig in the top surface of the tab 2B2 in the ribbon bonding step subsequent to the present step, the semiconductor chip 3B3 is disposed such that the center position thereof is displaced from the center position of the tab 2B2. Specifically, to ensure the clamped regions on both sides of the shorter sides of the semiconductor chip 3B3 having a rectangular two-dimensional shape, the semiconductor chip 3B3 is mounted such that one of the shorter sides thereof is closer to the leads 4. As a result, the shorter side (side surface) of the semiconductor chip 3B2 closer to the leads 4 is located over the thinner region 10, i.e., between the portions 2c1 and 2c2 of the side surface LS1. Also, the outer edge of the adhesive material 7 is located between the semiconductor chip 3B2 and the portions 2c2.

Figure 40:
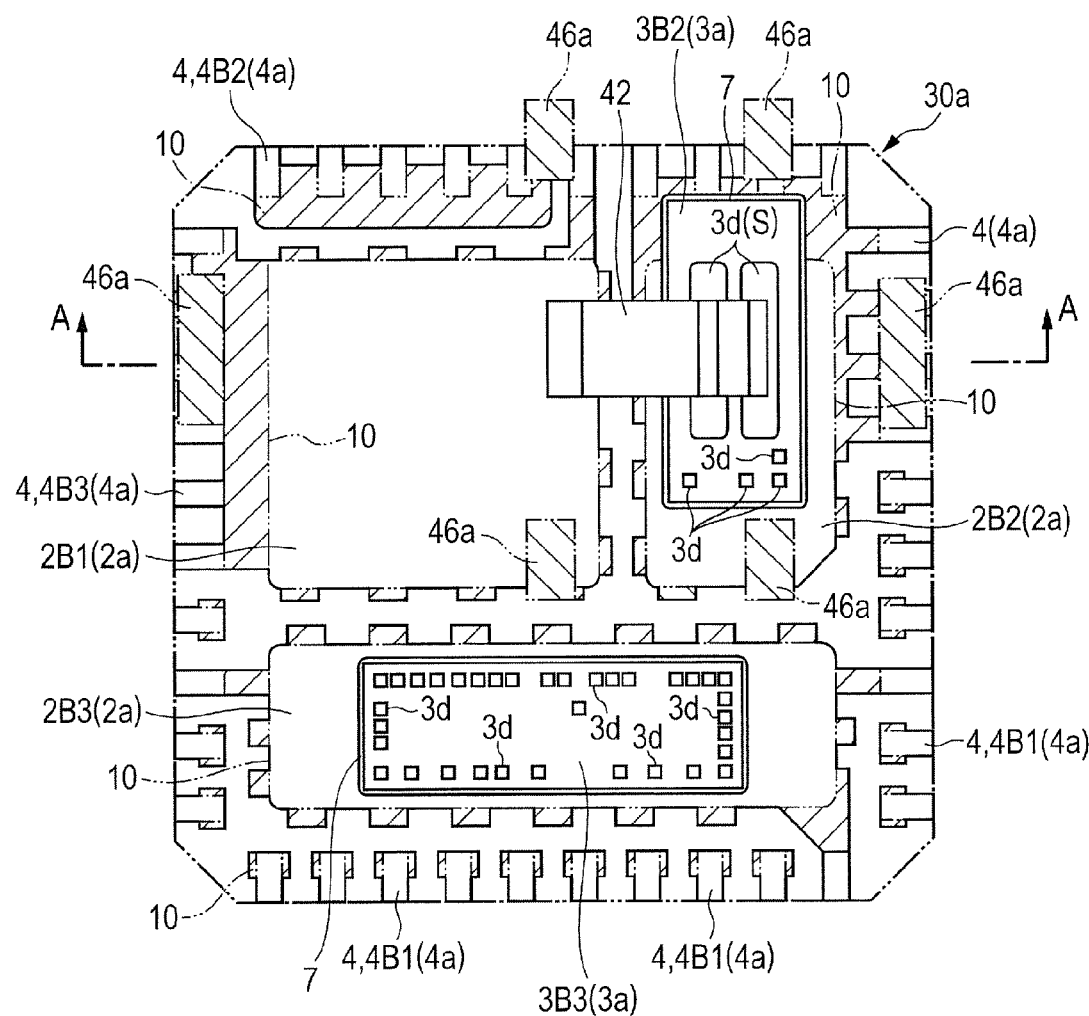
FIG. 40 is a plan view showing a state where the high-side semiconductor chip and the low-side chip mounting portion, each shown in FIG. 39, are electrically coupled to each other via a metal plate.
Figure 41:
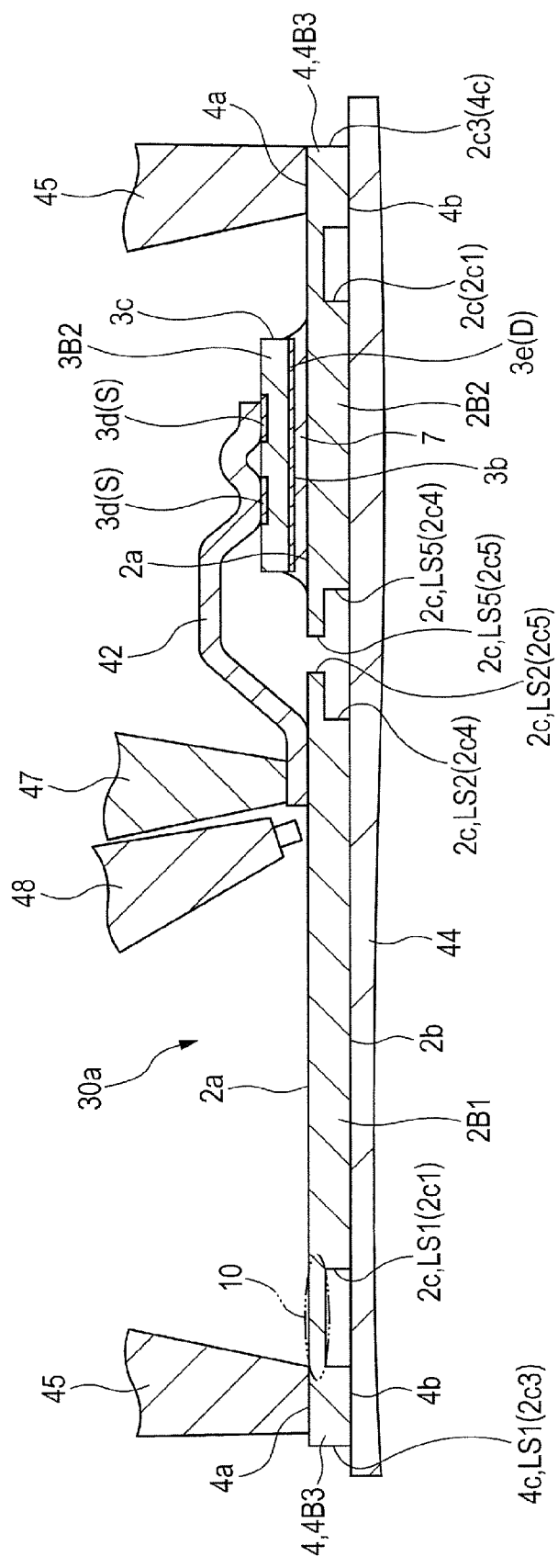
FIG. 41 is a cross-sectional view showing a part of each of a bonding jig and a pressing jig in a cross section along the line A-A of FIG. 40.

Next, in the step of ribbon bonding H shown in FIG. 37, as shown in FIGS. 40 and 41, the source electrodes S of the high-side semiconductor chip 3B2 are electrically coupled to the top surface 2a of the tab 2B1 via the metal plate 42. FIG. 40 is a plan view showing a state where the high-side semiconductor chip and the low-side chip mounting portion, each shown in FIG. 39, are electrically coupled to each other via the metal plate. FIG. 41 is a cross-sectional view showing a part of a bonding jig and a pressing jig in the cross section along the line A-A of FIG. 40. In the present step, as shown in FIG. 41, in a state where the top surface side of the lead frame placed over a stage 44 is press-held by a pressing jig (clamper) 45, an ultrasonic wave is applied to a bonding jig (wedge tool or bonding tool) 47 to thereby bond the metal plate 42 to the source pads S and to the tab 2B1 in this order. Specifically, by supplying a metallic ribbon material from a ribbon guide 48 into the space between the bonding jig and bonded portions (source pads S) and applying the ultrasonic wave to the bonding jig 47, the metallic ribbon material is bonded to the source pads S. Subsequently, the metallic ribbon material is shaped so as to pass over the side surface LS2 of the tab 2B1, while being sequentially supplied from the ribbon guide 48, and bonded to the top surface 2a (second bond-side bonded portion) of the tab 2B1. Then, the metallic ribbon material is cut with a ribbon cutter not shown to form the metal plate 42.

Here, to efficiently transmit the ultrasonic wave to the bonded portion, it is necessary to reduce the influence of vibration around the periphery of the bonded portion. Accordingly, it is preferable to press-hold a plurality of clamped regions 46a including the top surfaces 2a of the tab 2B2 and the tab 2B1 so as to surround the periphery of the region where the metal plate 42 is disposed. In the example shown in FIG. 40, around the periphery of the region where the metal plate 42 is disposed, six clamped regions are provided. However, if the region where the semiconductor chip 3B1 (see FIG. 30) is mounted in the subsequent step of mounting the semiconductor chip 3B1 is pressed, planarity may be impaired. Therefore, it is preferable to avoid the region where the semiconductor chip 3B1 is mounted. As a result, as shown in FIG. 40, the region of the tab 2B1 closer to the tab 2B2 serves as the region where the metal plate 42 is disposed, and serves as the clamped regions 46a in the present step. Accordingly, as shown in FIG. 31, the semiconductor chip 3B1 mounted in the subsequent step is disposed closer to the side surface LS1. In the present step, the lead frame is sandwiched between the stage 44 and the pressing jig 45 to inhibit vibration so that each of the plurality of clamped regions 46a needs to include a region other than the thinner region 10. Preferably, the height of each of the clamped regions 46a measured from the bottom surface 2b is the same as the distance from the bottom surface 2b of the tab 2B2 to the top surface 2a thereof. Even when each of the clamped regions 46a includes the thinner region 10, the area thereof is preferably minimized. Accordingly, over the clamped regions 46a, the semiconductor chip 3B2 cannot be mounted, and consequently a part of the semiconductor chip 3B2 overlaps the thinner region 10 of the tab 2B2.

Figure 42:
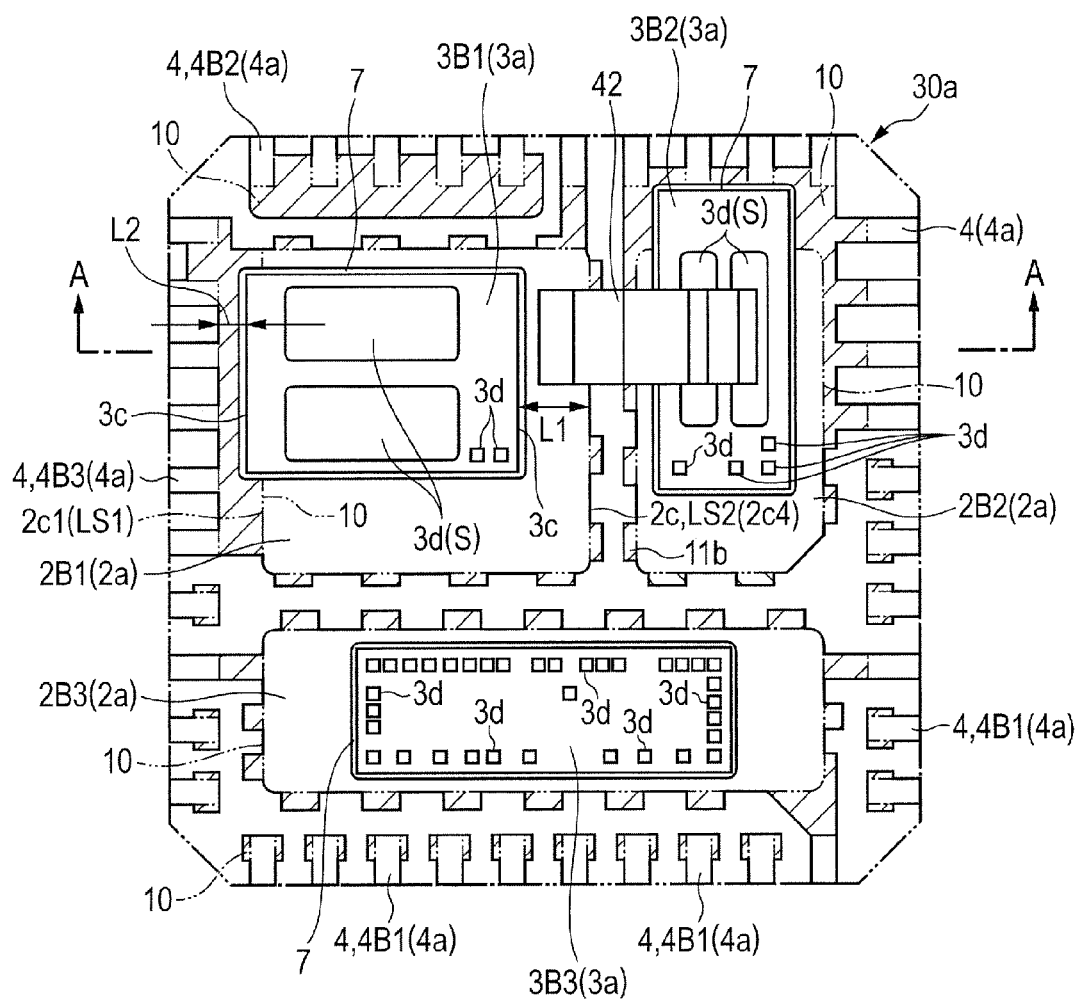
FIG. 42 is a plan view showing a state where a low-side semiconductor chip is mounted over the chip mounting portion of the lead frame as the other embodiment of the present invention.
Figure 43:
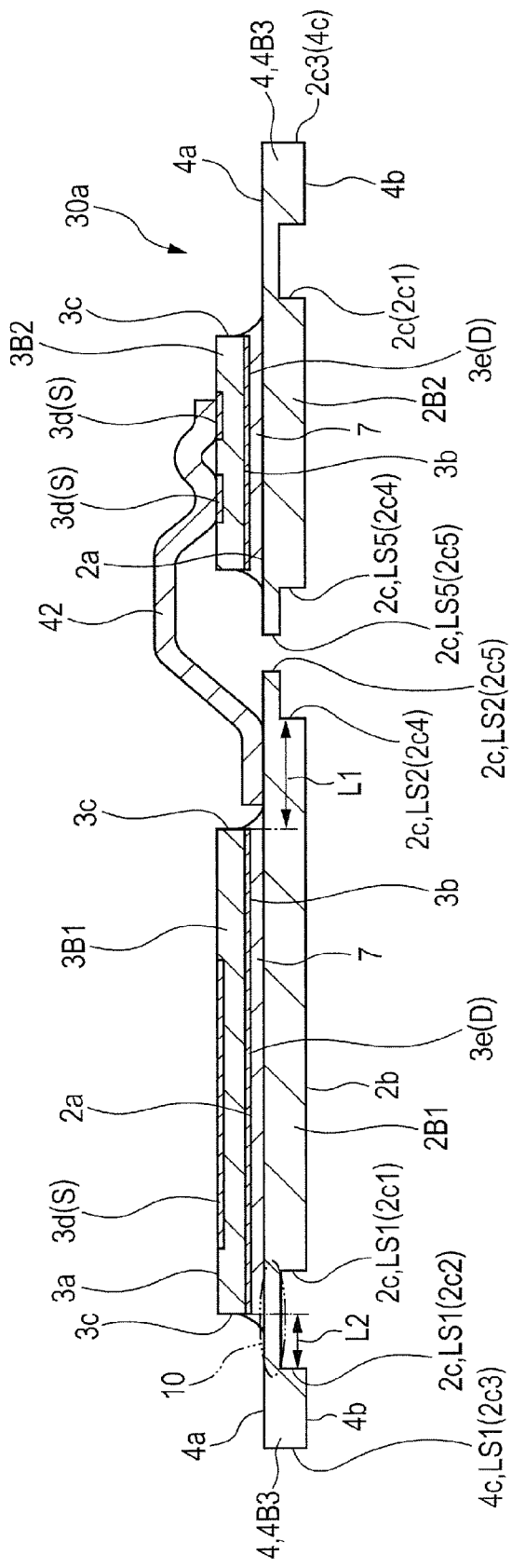
FIG. 43 is a cross-sectional view along the line A-A of FIG. 42.

Next, in the step of mounting the semiconductor chip 3B1 shown in FIG. 37, as shown in FIGS. 42 and 43, the semiconductor chip 3B1 as the low-side switching element is mounted over the top surface 2a of the tab (chip mounting portion) 2B1 provided in each of the product formation regions 30a of the lead frame. FIG. 42 is a plan view showing a state where the low-side semiconductor chip is mounted over the chip mounting portion of the lead frame of the present embodiment. FIG. 43 is a cross-sectional view along the line A-A of FIG. 42. In the present step, by the same operation as in the semiconductor chip mounting step described in the foregoing first embodiment, the semiconductor chip 3B1 is mounted over the tab 2B1 via the conductive adhesive material 7 as shown in FIG. 43, and electrically coupled thereto. Since the present step is performed in the state where the metal plate 42 has already been formed, the semiconductor chip 3B1 is mounted to be closer to the side surface LS1 of the tab 2B1. Accordingly, in planar view, a distance L1 from the side surface 3c of the semiconductor chip 3B1 to the portion 2c4 of the side surface LS2 is longer than a distance L2 from the side surface 3c of the semiconductor chip 3B1 to the portion 2c2 of the side surface LS1. Also, in the present step, the semiconductor chip 3B1 is mounted over the tab 2B1 such that parts of the semiconductor chip 3B1 and the adhesive material 7 overlap the thinner region 10. That is, the semiconductor chip 3B1 is mounted such that the outer edge (side surface 3c on the side surface LS1 side) of the semiconductor chip 3B1 is located between the portions 2c1 and 2c2. The outer edge of the adhesive material 7 wet-spreads so as to be located between the outer edge of the semiconductor chip and the portions 2c2.

Figure 44:
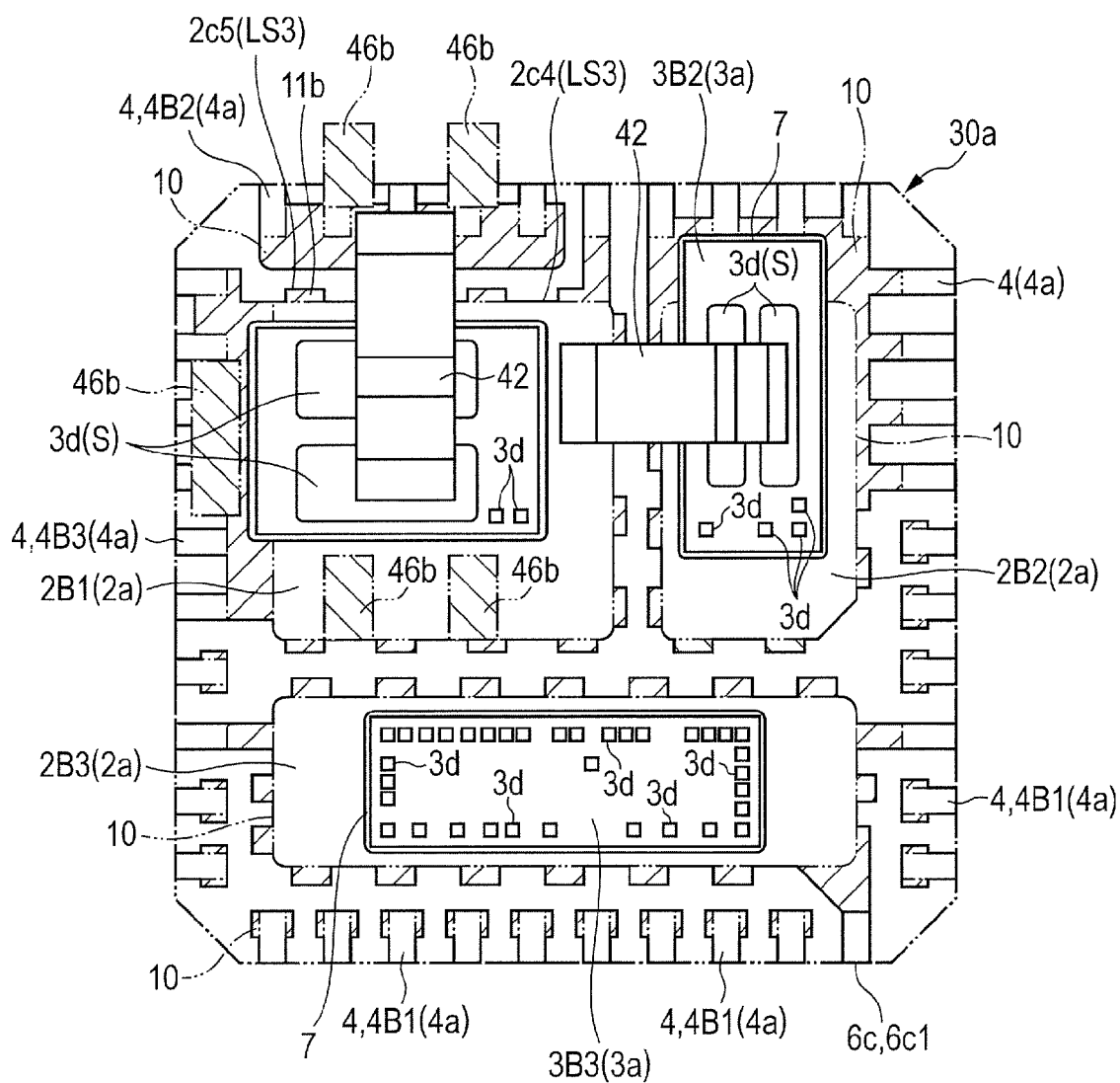
FIG. 44 is a plan view showing a state where the low-side semiconductor chip and the lead, each shown in FIG. 42, are electrically coupled to each other via a metal plate.

Next, in the step of ribbon bonding L shown in FIG. 37, as shown in FIG. 44; the source electrodes S of the low-side semiconductor chip 3B1 are electrically coupled to the top surface 4a of the lead 4B2 via the metal plate 42. FIG. 44 is a plan view showing a state where the low-side semiconductor chip and the lead, each shown in FIG. 42, are electrically coupled to each other via the metal plate. In the present step, the metal plate 42 is formed using the same jig as used in the step of lead bonding H described above. Therefore, the present step will be described with reference to FIG. 41 without showing a cross-sectional view illustrating the present step. In the present step, as shown in FIG. 41, an ultrasonic wave is applied to the bonding jig (wedge tool or bonding tool) 47 in a state where the top surface side of the lead frame placed over the stage 44 is press-held by the pressing jig (clamper) 45 to thereby bond the metal plate 42 to the source pads S of the semiconductor chip 3B1 and to the lead 4B2 in this order, as shown in FIG. 44. Specifically, by supplying a metallic ribbon material from the ribbon guide 48 into the space between the bonding jig and bonded portions (source pads S) and applying the ultrasonic wave to the bonding jig 47, the metallic ribbon material is bonded to the source pads S. Subsequently, the metallic ribbon material is shaped so as to pass over the side surface LS3 (see FIG. 44) of the tab 2B1, while being sequentially supplied from the ribbon guide 48, and bonded to the top surface 4a (second bond-side bonded portion) of the lead 4B2. Then, the metallic ribbon material is cut with the ribbon cutter not shown to form the metal plate 42 shown in FIG. 44. As shown in FIG. 44, in the present step, it is preferable to press the plurality of clamped regions 46a including the top surface 2a of the tab 2B1 so as to surround the periphery of the region where the metal plate 42 is disposed. Therefore, in the example shown in FIG. 44, around the periphery of the region where the metal plate 42 is disposed, five clamped regions 46b are provided.

Subsequently, the wire bonding step, the sealing step, the plating step, the lead cutting step, and the singulation step each shown in FIG. 37 can be performed in the same manner as in the foregoing first embodiment so that a repeated description thereof is omitted.

While the invention achieved by the present inventors has been specifically described heretofore based on the embodiments thereof, the present invention is not limited to the foregoing embodiments. It will be appreciated that various changes and modifications can be made in the invention within the scope not departing from the gist thereof.

For example, in the foregoing second embodiment, the description has been given to the example in which, as each of the metal plates 42, the metallic ribbon material comprised of aluminum is used and bonded, while being shaped. However, as briefly described also in the foregoing second embodiment, it is possible to prepare the metal plates 42 shaped in advance, and bond each of the metal plates 42 via a conductive adhesive material such as a solder material or a so-called silver paste. In the manufacturing steps in this case, after temporarily fixed via the conductive adhesive material, the metal plates 42 can be simultaneously bonded by a heating treatment (reflow treatment). When the bonding is performed by the heating treatment, the bonding can be performed without pressing the top surfaces of the tabs 2B1 and 2B2, unlike in the method which performs the bonding using the ultrasonic wave. Therefore, restrictions on the layouts of the semiconductor chips over the chip mounting portions can be reduced.

Also, for example, in the foregoing second embodiment, the description has been given using, as an example of the semiconductor device including the plurality of chip mounting portions independent of each other in one package, the power semiconductor device incorporated in a power conversion device such as a DC-DC converter to function as the switching device. However, the technology described in the foregoing second embodiment is also applicable to another semiconductor device. Also, in the foregoing second embodiment, the example has been described in which the semiconductor chip 3B3 is formed with the two driver circuits and the control circuit. However, as a modification, there may be a case where a semiconductor device formed with a control circuit is prepared separately, and the semiconductor chip 3B3 is formed only with a driver circuit.

Also, in the foregoing embodiment, as an embodiment of the semiconductor device including one semiconductor chip, the example has been described in which the semiconductor chip is electrically coupled to the plurality of leads via the plurality of wires. However, in a semiconductor device including one semiconductor chip, a semiconductor chip can be electrically coupled to leads via a metal plate, as described in the second embodiment.

The present invention is widely applicable to tab-exposed-type semiconductor devices.

What is claimed is:

1. A semiconductor device, comprising:
    a first semiconductor chip having a first top surface over which a plurality of first pads are formed, and a first back surface opposite the first top surface;
    a second semiconductor chip having a second top surface over which a plurality of second pads are formed, and a second back surface opposite the second top surface;
    a first chip mounting portion having a first upper surface over which the first semiconductor chip is mounted via a first adhesive material, a first lower surface opposite the first upper surface, and a plurality of side surfaces located between the first upper and lower surfaces in a thickness direction of the first chip mounting portion;
    a second chip mounting portion having a second upper surface over which the second semiconductor chip is mounted via a second adhesive material, a second lower surface opposite the second upper surface, and a plurality of side surfaces located between the second upper and lower surfaces in a thickness direction of the second chip mounting portion;
    a plurality of leads arranged around the first and second chip mounting portions in plan view;
    a plurality of conductive materials electrically connecting to the leads and the first and second pads of the first and the second semiconductor chips respectively; and
    a resin sealing body having a first sealing body side, a second sealing body side opposite the first sealing body side, a third sealing body side, and a fourth sealing body side opposite the third sealing body side, the first and second sealing body sides extending along a first direction, the third and fourth sealing body sides extending along a second direction perpendicular to the first direction, and the resin sealing body sealing the first and second semiconductor chips, a part of each of the first and second chip mounting portions, and a part of each of the leads such that the first and second lower surfaces of the first and second chip mounting portions are exposed from the resin sealing body,
    wherein the first and second chip mounting portions are located side by side between the first and second sealing body sides, and the second chip mounting portion is located between the first chip mounting portion and second sealing body side in plan view,
    wherein the first chip mounting portion has a first side surface and the second chip mounting portion has a second side surface which faces the first side surface, and a portion of the resin sealing body is disposed between the first and second side surfaces,
    wherein the first side surface has a first portion continued to the first lower surface of the first chip mounting portion and a second portion located outwardly of the first portion and continued to the first upper surface of the first chip mounting portion, each of the first and second portions facing in the same direction,
    wherein the second side surface has a third portion continued to the second lower surface of the second chip mounting portion and a fourth portion located outwardly of the third portion and continued to the second upper surface of the second chip mounting portion, each of the third and fourth portions facing in the same direction, and
    wherein, in plan view, the first upper surface of the first chip mounting portion overlaps with a first virtual line which connects a center point of the third sealing body side and a center point of the fourth sealing body side in the first direction.

2. The semiconductor device according to claim 1,
    wherein, in plan view, the first upper surface of the first chip mounting portion overlaps with a second virtual line which connects a center point of the first sealing body side and a center point of the second sealing body side in the second direction.

3. The semiconductor device according to claim 1,
    wherein, in plan view, a virtual intersecting point of the first virtual line and a second virtual line which connects a center point of the first sealing body side and a center point of the second sealing body side in the second direction is located over the first upper surface of the first chip mounting portion.

4. The semiconductor device according to claim 3,
    wherein, in plan view, the second upper surface of the second chip mounting portion overlaps with the second virtual line.

5. The semiconductor device according to claim 1,
    wherein a thickness of the second portion of the first chip mounting portion is less than a thickness from the first upper surface to the first lower surface, and
    wherein a thickness of the fourth portion of the second chip mounting portion is less than a thickness from the second upper surface to the second lower surface.

6. The semiconductor device according to claim 1,
    wherein, the first side surface has a plurality of the first and second portions alternately arranged along the first side surface, and
    wherein, the second side surface has a plurality of the third and fourth portions alternately arranged along the second side surface.

7. The semiconductor device according to claim 6,
    wherein a height of each of the first portions is the same as a distance from the first upper surface to the first lower surface of the first chip mounting portion, and
    wherein a height of each of the third portions is the same as a distance from the second upper surface to the second lower surface of the second chip mounting portion.

8. The semiconductor device according to claim 1,
    wherein the first semiconductor chip includes a power MOSFET,
    wherein the first pads of the first semiconductor chip include a source electrode pad electrically connected to a source electrode of the power MOSFET,
    wherein the conductive materials include a metal ribbon, and
    wherein the metal ribbon is electrically connected to the source electrode pad.

9. The semiconductor device according to claim 8,
wherein a drain electrode of the power MOSFET is formed on the first back surface of the first semiconductor chip,
wherein the first adhesive material is a conductive adhesive material, and
wherein the first back surface of the first semiconductor chip is electrically connected to the first lower surface of the first chip mounting portion via the first adhesive material.

* * * * *